(12) United States Patent
Tamida et al.

(10) Patent No.: US 11,079,444 B2
(45) Date of Patent: Aug. 3, 2021

(54) INSULATION DETECTOR AND ELECTRIC APPARATUS

(71) Applicant: Mitsubishi Electric Corporation, Tokyo (JP)

(72) Inventors: Taichiro Tamida, Tokyo (JP); Masayuki Uematsu, Tokyo (JP); Akira Tanabe, Tokyo (JP); Yoshitomo Hayashi, Tokyo (JP); Yoji Tsutsumishita, Tokyo (JP); Kosuke Tsujikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 231 days.

(21) Appl. No.: 16/056,600

(22) Filed: Aug. 7, 2018

(65) Prior Publication Data

US 2018/0340971 A1 Nov. 29, 2018

Related U.S. Application Data

(62) Division of application No. 14/902,434, filed as application No. PCT/JP2014/078635 on Oct. 28, 2014, now Pat. No. 10,416,224.

(30) Foreign Application Priority Data

Nov. 22, 2013 (WO) .................. PCT/JP2013/081546

(51) Int. Cl.
*G01R 31/52* (2020.01)
*G01R 27/02* (2006.01)
(Continued)

(52) U.S. Cl.
CPC ........... *G01R 31/52* (2020.01); *G01R 27/025* (2013.01); *G01R 31/12* (2013.01); *G01R 31/34* (2013.01); *G01R 27/18* (2013.01); *G01R 31/343* (2013.01)

(58) Field of Classification Search
CPC ...... G01R 31/025; G01R 31/02; G01R 31/12; G01R 31/1245; G01R 31/14; G01R 31/34;
(Continued)

(56) References Cited

U.S. PATENT DOCUMENTS 4,422,034 A * 12/1983 Matsuno .............. G01R 27/025
324/541
4,562,390 A 12/1985 Tobise
(Continued)

FOREIGN PATENT DOCUMENTS

CN 103069286 A 4/2013
DE 602006000132 T2 7/2008
(Continued)

OTHER PUBLICATIONS

Communication dated Aug. 30, 2018 from the Intellectual Property India Patent Office in counterpart Application No. 3548/MUMNP/2015.
(Continued)

*Primary Examiner* — Son T Le
*Assistant Examiner* — Dustin R Dickinson
(74) *Attorney, Agent, or Firm* — Sughrue Mion, PLLC; Richard C. Turner

(57) ABSTRACT

An insulation detector for highly accurately detecting or measuring, with a simple configuration, insulation resistance of a load or an apparatus to a ground or a housing and connected to an electric apparatus including one or both of an intra-apparatus capacitor and a battery, the insulation detector including an intra-insulation detector capacitor, a voltage detecting unit that detects a voltage of the intra-insulation detector capacitor, and a current-path forming switch for connecting the ground or the housing, the intra-apparatus capacitor, and the intra-insulation detector capaci-
(Continued)

tor in series and forming a current path including insulation resistance of the electric apparatus. The insulation detector measures the insulation resistance by measuring a time constant of a change in the voltage of the intra-insulation detector capacitor. A capacitance value of the intra-insulation detector capacitor is a value negligible in the measurement of the insulation resistance compared with a capacitance value of the intra-apparatus capacitor.

10 Claims, 46 Drawing Sheets

(51) Int. Cl.
*G01R 31/34* (2020.01)
*G01R 31/12* (2020.01)
*G01R 27/18* (2006.01)

(58) Field of Classification Search
CPC ...... G01R 31/346; G01R 31/50; G01R 31/52; G01R 27/18; G01R 27/025; B60L 3/0069
See application file for complete search history.

(56) References Cited

U.S. PATENT DOCUMENTS

| | | | |
|---|---|---|---|
| 5,818,236 A | 10/1998 | Sone et al. | |
| 7,064,516 B2 | 6/2006 | Yamada et al. | |
| 7,253,639 B2 | 8/2007 | Horikoshi et al. | |
| 7,560,935 B2 | 7/2009 | Morimoto | |
| 7,898,264 B2 | 3/2011 | Horikoshi et al. | |
| 8,022,658 B2 | 9/2011 | Ide | |
| 8,674,704 B2 | 3/2014 | Kawamura | |
| 2004/0012381 A1* | 1/2004 | Hachisuka | H02H 1/0007 324/117 R |
| 2004/0257029 A1 | 12/2004 | Sakamoto et al. | |
| 2005/0259370 A1 | 11/2005 | Kubo | |
| 2010/0246081 A1 | 9/2010 | Yano et al. | |
| 2011/0084705 A1 | 4/2011 | Kawamura | |
| 2012/0153966 A1 | 6/2012 | Kawamura | |
| 2013/0043880 A1 | 2/2013 | Bettenwort et al. | |
| 2013/0147491 A1 | 6/2013 | Kawamura | |
| 2015/0091582 A1* | 4/2015 | Wei | G01R 31/52 324/509 |

FOREIGN PATENT DOCUMENTS

| | | |
|---|---|---|
| DE | 102009060200 A1 | 7/2010 |
| JP | 60078359 A | 5/1985 |
| JP | 61108001 U | 7/1986 |
| JP | 08226950 A | 9/1996 |
| JP | 10239356 A | 9/1998 |
| JP | 2005016958 A | 1/2005 |
| JP | 2005110400 A | 4/2005 |
| JP | 2006226993 A | 8/2006 |
| JP | 2007198995 A | 8/2007 |
| JP | 4098069 B2 | 6/2008 |
| JP | 2009204600 A | 9/2009 |
| JP | 2010156661 A | 7/2010 |
| JP | 2010239822 A | 10/2010 |

OTHER PUBLICATIONS

An Office Action dated Oct. 15, 2018, which issued during the prosecution of U.S. Appl. No. 14/902,434.
Communication dated Aug. 9, 2016 from the Japanese Patent Office in counterpart Application No. 2015-549049.
Communication dated Feb. 28, 2017, from the Japanese Patent Office in counterpart application No. 2015-549049.
Communication dated Jun. 8, 2016 from the Taiwanese Intellectual Property Office in counterpart Application No. 103137572.
Communication dated Mar. 21, 2017, issued by the Korean Intellectual Property Office in corresponding Korean Application No. 10-2015-7037263.
International Search Report of PCT/JP2014/078635 dated Feb. 3, 2015.
Communication dated Apr. 27, 2017 from the State Intellectual Property Office of the P.R.C. in counterpart Application No. 201480038418.X.
Communication dated Sep. 28, 2020 from the German Patent and Trademark Office in Application No. 11 2014 002 853.3.

* cited by examiner

INSULATION DETECTOR AND ELECTRIC APPARATUS

CROSS REFERENCE TO RELATED APPLICATIONS

This is a Divisional Application of application Ser. No. 14/902,434 which is a National Stage of International Application No. PCT/JP2014/078635 filed Oct. 28, 2014, claiming priority based on International Patent Application No. PCT/JP2013/081546 filed Nov. 22, 2013, the contents of all of which are incorporated herein by reference in their entirety.

FIELD

The present invention relates to an insulation detector that detects that insulation of a load, for example, a motor is deteriorated or ground-faulted and an electric apparatus including the insulation detector.

BACKGROUND

Because an insulation material of an electric apparatus is usually deteriorated with time, it is desirable to monitor the deterioration and take measures. A leakage of electricity due to a dielectric breakdown should be prevented by an earth leakage breaker. It would be preferable if it is possible to monitor deterioration in insulation, foresee a dielectric breakdown, and prevent the dielectric breakdown. The earth leakage breaker can detect a leak current from an apparatus to the ground. However, because a change in insulation resistance due to the deterioration of the insulation material is little, it is difficult to measure the change. For example, in a machine tool used in a production site of a factory, a plurality of motors, such as a spindle motor, a servo motor and the like are used. Insulation materials between housings and coils of the motors are deteriorated with time. In such a machine tool, usually, when a large leak current flows because of deterioration in insulation of motors, an earth leakage breaker connected to a system power supply operates and the entire apparatus stops. In this case, because the apparatus suddenly stops, the influence on the production is large, it is difficult to specify a place of cause of a leakage of electricity, and it takes time to restore the apparatus. Therefore, there is a need for a mechanism for accurately detecting deterioration in insulation resistance to the ground or the housing of the apparatus or the load, for example, the motor or a mechanism capable of periodically detecting insulation resistance, foreseeing the deterioration, and performing preventive maintenance of the apparatus.

Patent Literature 1 discloses a technology for feeding an electric current to a load with a voltage stored in a smoothing capacitor but, rather than detecting the electric current, monitoring a change in the voltage of the smoothing capacitor and calculating insulation resistance from a time constant of the change. In the technology disclosed in Patent Literature 1, a measurement target is not a feeble current but is the voltage change of the capacitor in which noise less easily occurs. Therefore, it is considered possible to perform highly accurate measurement robust against noise.

Patent Literature 2 has an object of "obtaining a motor driving apparatus that can inexpensively foresee insulation deterioration of a motor" and discloses a motor driving apparatus in which "a closed circuit of a housing, a motor coil, resistance R1, resistance R2, a relay contact K1, diodes D4, D5, and D6, an alternating-current power supply 1, and a ground G1 of a motor 10, which is connected to a ground G2, is formed by turning on the relay contact K1 when a motor driving amplifier 8 does not operate. Consequently, a voltage to the ground of the alternating-current power supply 1 is applied to the closed circuit. When the insulation resistance of the motor 10 is high, an electric current flowing to the closed circuit is small and a potential difference due to the resistance R1 is small. When insulation of the motor is deteriorated, a leak current increases and a potential difference of the resistance R1 exceeds a reference voltage determined by a Zener diode. Then, an output signal is output from a comparator 32, a signal is output from a photo-coupler 35, and a decrease of an insulation resistance is displayed on a display of a control device 11. It is possible to easily and inexpensively foresee insulation deterioration of the motor and prevent a sudden operation stop by a leakage of electricity or the like". In the technique disclosed in Patent Literature 1, the insulation resistance of a motor of a machine tool is measured from the side of a driving apparatus.

CITATION LIST

Patent Literature

Patent Literature 1: Japanese Patent Application Laid-Open No. S60-78359
Patent Literature 2: Japanese Patent Application Laid-Open No. 2005-16958

SUMMARY

Technical Problem

However, according to the conventional technology described in the above-mentioned Patent Literature 1, the smoothing capacitor is provided to stabilize a voltage. The capacitance value of the smoothing capacitor is generally an extremely large value. On the other hand, a resistance value of the insulation resistance, which is the measurement target, is also an extremely large value. Then, the time constant $\tau = R \times C$ of the voltage change becomes an extremely long time. Therefore, it is possible to measure a small resistance value such as a ground fault. However, there is a problem in that an extremely long time is required when a resistance value is large like the insulation resistance.

Usually, discharge resistance is often provided in parallel to the smoothing capacitor to discharge electricity when the electric apparatus stops. However, in this method, because the resistance value is far larger than discharge resistance, there is a problem in that the resistance value of the insulation resistance cannot be measured.

From the viewpoint of preventive maintenance, it is necessary to detect even a slight change in an insulation resistance value of a degree for not causing a problem in the operation of the electric apparatus itself. It is necessary to be capable of measuring even high insulation resistance of, for example, 100 megaohms.

According to the conventional technology described in the above-mentioned Patent Literature 2, in a state in which an inverter and the motor are stopped, an N bus after rectification and a winging wire of the motor, which is an inverter output, are connected via resistance. The voltage of the N bus is divided by a resistor for measurement and the insulation resistance of the motor. Therefore, the insulation resistance of the motor can be measured by measuring a voltage applied to the resistance. However, there is a problem in that the measurement cannot be performed depending on a grounding method of a power-receiving alternating-current power supply.

The present invention has been devised in view of the above and it is an object of the present invention to obtain an insulation detector that can highly accurately detect or measure, with a simple configuration, insulation resistance of a load or an apparatus to the ground or a housing.

Solution to Problem

In order to solve the aforementioned problems, an insulation detector connected to an electric apparatus including an intra-apparatus capacitor according to one aspect of the present invention is so constructed as to include: an intra-insulation detector capacitor; a voltage detecting unit that detects a voltage of the intra-insulation detector capacitor; and a current-path forming switch for connecting a ground or a housing, the intra-apparatus capacitor, and the intra-insulation detector capacitor in series and forming a current path including insulation resistance of the electric apparatus, wherein the insulation detector measures the insulation resistance by measuring, with the voltage detecting unit, a time constant of a change in the voltage of the intra-insulation detector capacitor, and a capacitance value of the intra-insulation detector capacitor is a value negligible in the measurement of the insulation resistance compared with a capacitance value of the intra-apparatus capacitor.

Alternatively, an insulation detector according to another aspect of the present invention, which is connected between one of a P bus and an N bus of an electric apparatus, which includes a rectifier circuit that is disposed between an alternating-current power supply and a load and converts an alternating-current voltage from the alternating-current power supply into a direct-current voltage and an inverter that is connected to a post stage of the rectifier circuit and drives the load, and an output line connecting the inverter and the load, is so constructed as to include: a resistor, a capacitor connected in parallel to the resistor, and a voltage detector that detects a voltage across both ends of the resistor or a part of a divided voltage to measure a voltage value across both ends of the insulation detector, and the insulation detector detects insulation resistance between the load and a ground or a housing from the voltage value measured by the voltage detector.

Advantageous Effects of Invention

According to the present invention, there is an effect that it is possible to highly accurately detect or measure, with a simple configuration, insulation resistance of a load or an apparatus to the ground or a housing.

DESCRIPTION OF EMBODIMENTS

Exemplary embodiments of the present invention are explained in detail below with reference to the drawings. Note that the present invention is not limited by the embodiments.

First Embodiment

Figure 1:
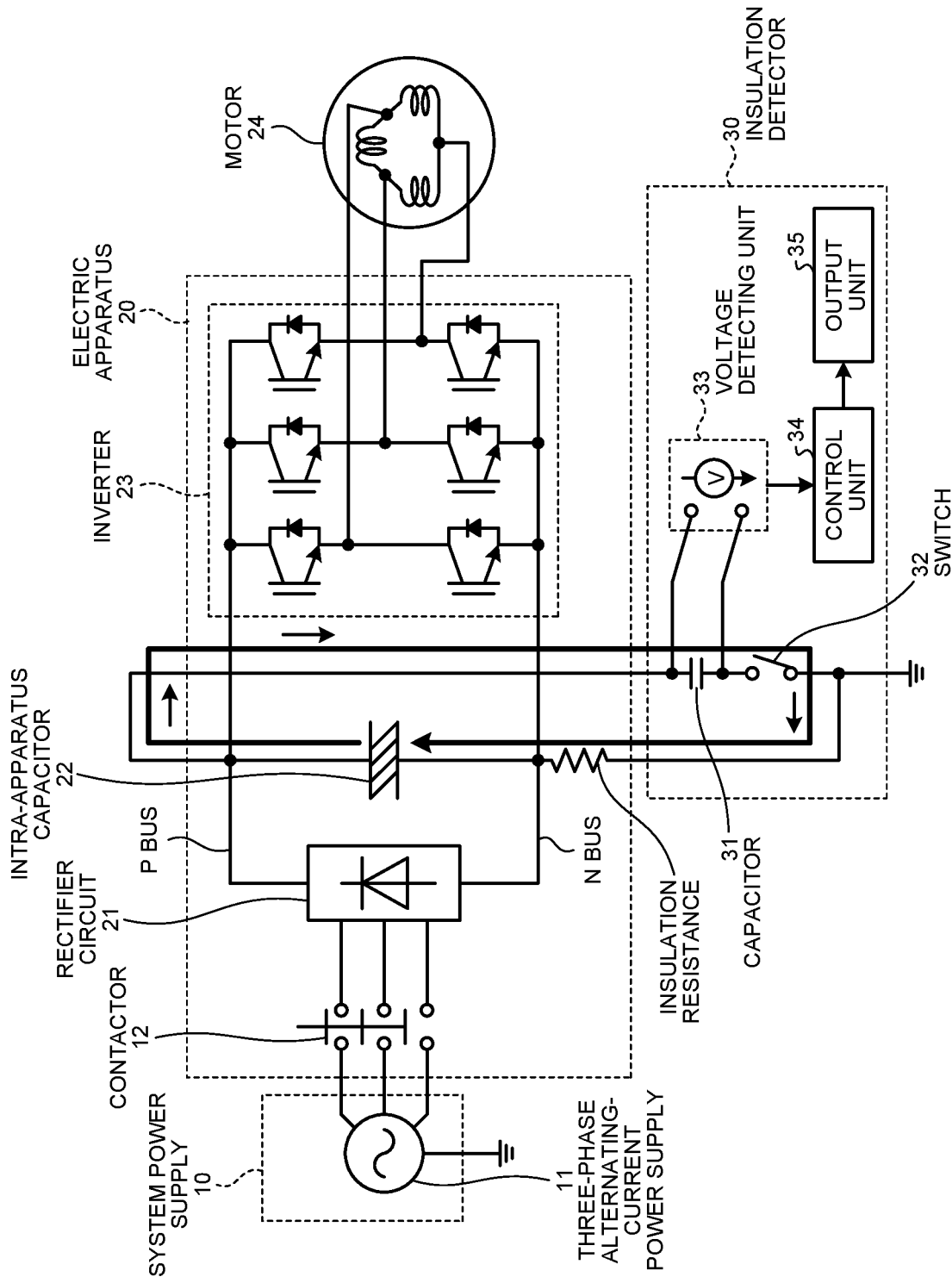
FIG. 1 is a diagram showing an example of the configuration of an insulation detector and an electric apparatus equipped with the insulation detector according to a first embodiment.

FIG. 1 is a diagram showing an example of the configuration of a first embodiment of an insulation detector and an electric apparatus equipped with the insulation detector according to the present invention. Note that, in FIG. 1, the insulation detector is equipped in the electric apparatus. However, the present invention is not limited to this. The insulation detector can be included in the electric apparatus. In FIG. 1, electric power is supplied from a system power supply 10 to an electric apparatus 20. In the electric apparatus 20, a driving circuit drives a motor 24. The configuration shown in FIG. 1 is particularly suitable when voltage measurement is performed together with measurement of the voltage of an intra-apparatus capacitor.

The system power supply 10 includes a three-phase alternating-current power supply 11. A contactor 12 is disposed between the three-phase alternating-current power supply 11 and the electric apparatus 20.

The electric apparatus 20 includes a rectifier circuit 21, an intra-apparatus capacitor 22, and an inverter 23. The electric apparatus 20 receives a three-phase alternating current from the three-phase alternating-current power supply 11 via the contactor 12 of the system power supply 10 and converts, with the rectifier circuit 21 and the intra-apparatus capacitor 22, the received three-phase alternating current into a direct current. The direct-current voltage is converted into an alternating current voltage by the inverter 23. The motor 24 is driven by the converted alternating-current voltage. Note that a bus on a minus potential side of the direct-current voltage is referred to as N bus and a bus on a plus potential side is referred to as P bus.

An insulation detector 30 includes a capacitor 31, a switch 32, which is a current path formation switch, a voltage detecting unit 33, a control unit 34, and an output unit 35. The insulation detector 30 measures insulation resistance between the N bus of the electric apparatus 20 and the ground or a housing. A small-capacity capacitor is used for the capacitor 31 in the insulation detector 30. Note that, in the following explanation, when a capacitor is simply referred to as "capacitor" rather than "intra-apparatus capacitor", the capacitor is a small-capacity capacitor like the capacitor 31.

Note that the voltage detecting unit 33 detects a value of the capacitor 31. The detected value is sent to the control unit 34.

For the capacitor 31, a capacitor having a capacitance value smaller than the capacitance value of the intra-apparatus capacitor 22, for example, 10% or less of the capacitance value of the intra-apparatus capacitor 22 is used. One end of the capacitor 31 is connected to the P bus. The other end is connected to the ground or the housing via the switch 32. The capacitance value of the capacitor 31 only has to be as small as negligible in measurement of insulation resistance compared with the capacitance value of the intra-apparatus capacitor 22.

In a normal state in which measurement is not performed, the switch 32 is open. When the measurement is performed, first, the electric apparatus 20 is stopped. The normal state includes the time in when the electric apparatus 20 is driving a load.

Subsequently, a portion where potential is fixed is disconnected to destabilize the potential of the electric apparatus 20, that is, the potentials of the P bus and the N bus. Specifically, the contactor 12 is opened. Then, a voltage corresponding to the intra-apparatus capacitor 22 is accumulated in the intra-apparatus capacitor 22. The switch 32 is closed in this state. Then, a current path including the intra-apparatus capacitor 22, the capacitor 31, the switch 32, the ground, and insulation resistance is formed. An electric current flows into the current path.

When the capacitance of the intra-apparatus capacitor 22 is represented as $C_0$ and the capacitance of the capacitor 31 is represented as $C_m$, series combined capacitance $C_m'$ is represented by the following Formula (1).

$$C_m' = \frac{C_0 C_m}{C_0 + C_m} \tag{1}$$

In general, the capacitance $C_0$ of the intra-apparatus capacitor 22 is set to approximately 1 to 10 millifarads depending on the size of the electric apparatus 20. On the other hand, when the capacitance $C_m$ of the capacitor 31 is set to 1/1000 or less of the capacitance $C_0$ of the intra-apparatus capacitor 22, the series combined capacitance $C_m'$ of the capacitance $C_m$ of the capacitor 31 and the capacitance $C_0$ of the intra-apparatus capacitor 22 is a value close to $C_m$. First, if charges are accumulated at a voltage $V_0$ in the intra-apparatus capacitor 22, at the start of measurement of insulation resistance, that is, when a long time elapses after the switch 32 is closed and the current path is formed, the voltage of the intra-apparatus capacitor 22 and the voltage of the capacitor 31 are equal. The voltage $V_1$ is represented by the following Formula (2).

$$V_1 = \frac{C_0}{C_0 + C_m} V_0 \tag{2}$$

Figure 2:
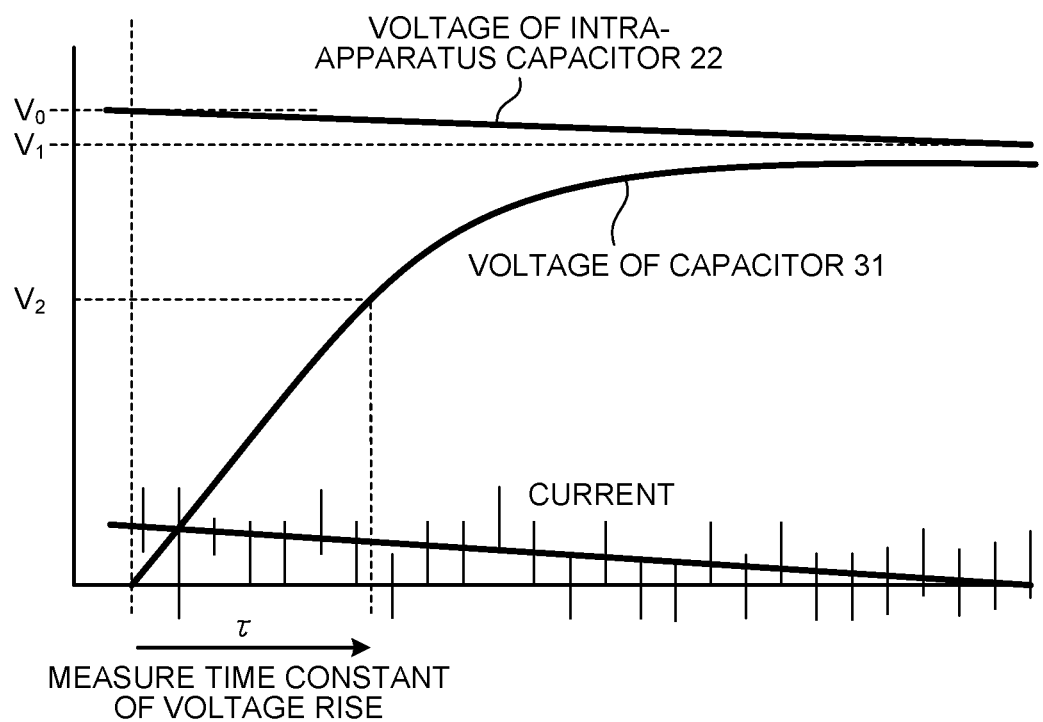
FIG. 2 is a diagram showing changes in the voltages of a capacitor and an intra-apparatus capacitor in the electric apparatus according to the first embodiment.

Because the capacitance $C_0$ of the intra-apparatus capacitor 22 is large, the voltage $V_1$ is a value close to the voltage $V_0$. That is, changes in the voltages of the capacitor 31 and the intra-apparatus capacitor 22 after the start of measurement are as shown in FIG. 2. Because the capacitance $C_0$ of the intra-apparatus capacitor 22 is large, the voltage of the intra-apparatus capacitor 22 hardly changes. The voltage $V_1$ is a value close to the voltage $V_0$. On the other hand, the voltage of the capacitor 31 rises to the voltage $V_1$. A change in a voltage $V_{Cm}$ of the capacitor 31 is represented by the following Formula (3).

$$V_{Cm} = V_1\left(1 - \exp\left(-\frac{t}{\tau}\right)\right) \tag{3}$$

In the formula, $\tau$ represents a time constant of the voltage change. In this case, $\tau$ is a product of the combined capacitance $C_m'$ and insulation resistance $R_x$ and represented by the following Formula (4).

$$\tau = C_m' \times R_x \tag{4}$$

A voltage waveform of the capacitor 31 rises at the time constant $\tau$ as shown in FIG. 2. When a voltage at $t=\tau$ is represented as $V_2$, the voltage $V_2$ is represented by the following Formula (5).

$$V_2 = V_1\left(1 - \frac{1}{e}\right) \cong V_1 \times 0.632K \tag{5}$$

In the formula, e represents a base of a natural logarithm. That is, when time at which the voltage has reached the voltage $V_2$ is measured, the time becomes equal to $\tau = R \times C$. A change in the voltage is represented by the above Formula (3). Therefore, a voltage value equivalent to the voltage $V_2$ only has to be selected as appropriate. For example, when a voltage $V_3$ is selected and the time at which the voltage has reached the voltage $V_3$ is measured, time $\tau'$ from a start time of the measurement, representing the time at this point, is represented by the following Formula (6).

$$\tau' = \tau \times \ln\left(\frac{V_1}{V_1 - V_3}\right) \tag{6}$$

The resistance $R_x$ of the insulation resistance can be calculated from the time constant and the capacitance $C_m$ of the capacitor 31 measured in this way.

Usually, discharge resistance is provided in parallel to the intra-apparatus capacitor 22. Therefore, when time elapses, the voltage of the intra-apparatus capacitor 22 drops. Therefore, a measurement time represented by $\tau$ of the insulation resistance in the present invention needs to be a time shorter than this and in which the voltage of the intra-apparatus capacitor 22 does not drop. For example, to set the insulation resistance to ten times or more of the discharge resistance provided in parallel to the intra-apparatus capacitor 22, the capacitance of the capacitor 31 needs to be set to 10% or less of the capacitance of the intra-apparatus capacitor 22. Preferably, the insulation resistance is set to 1000 times or more of the discharge resistance of the intra-apparatus capacitor 22. The capacitance of the capacitor 31 is set to 0.1% or less of the capacitance of the intra-apparatus capacitor 22.

From such conditions, the capacitance $C_m$ of the capacitor 31 is set smaller than the capacitance $C_0$. A value of the time constant $\tau$ is set to a realistic measurement time, for example, several seconds or less from the above Formula (4) with respect to the value $R_x$ of the insulation resistance desired to be measured. The measurement time is set to time shorter than a discharge time constant of the intra-apparatus capacitor 22.

The control unit 34 measures the insulation resistance as explained above and compares the insulation resistance with an initial value or a set allowance to perform abnormality determination. When it is determined as a result of the determination by the control unit 34 that the insulation resistance is abnormal, the control unit 34 sends an abnormality signal to the output unit 35. An administrator of the electric apparatus can determine whether the insulation resistance is abnormal by visually recognizing an output result of the output unit 35.

However, the present invention is not limited to this. The control unit 34 and the output unit 35 are shown in the figure for convenience of explanation. The control unit 34 and the output unit 35 do not always have to be provided.

Second Embodiment

Figure 3:
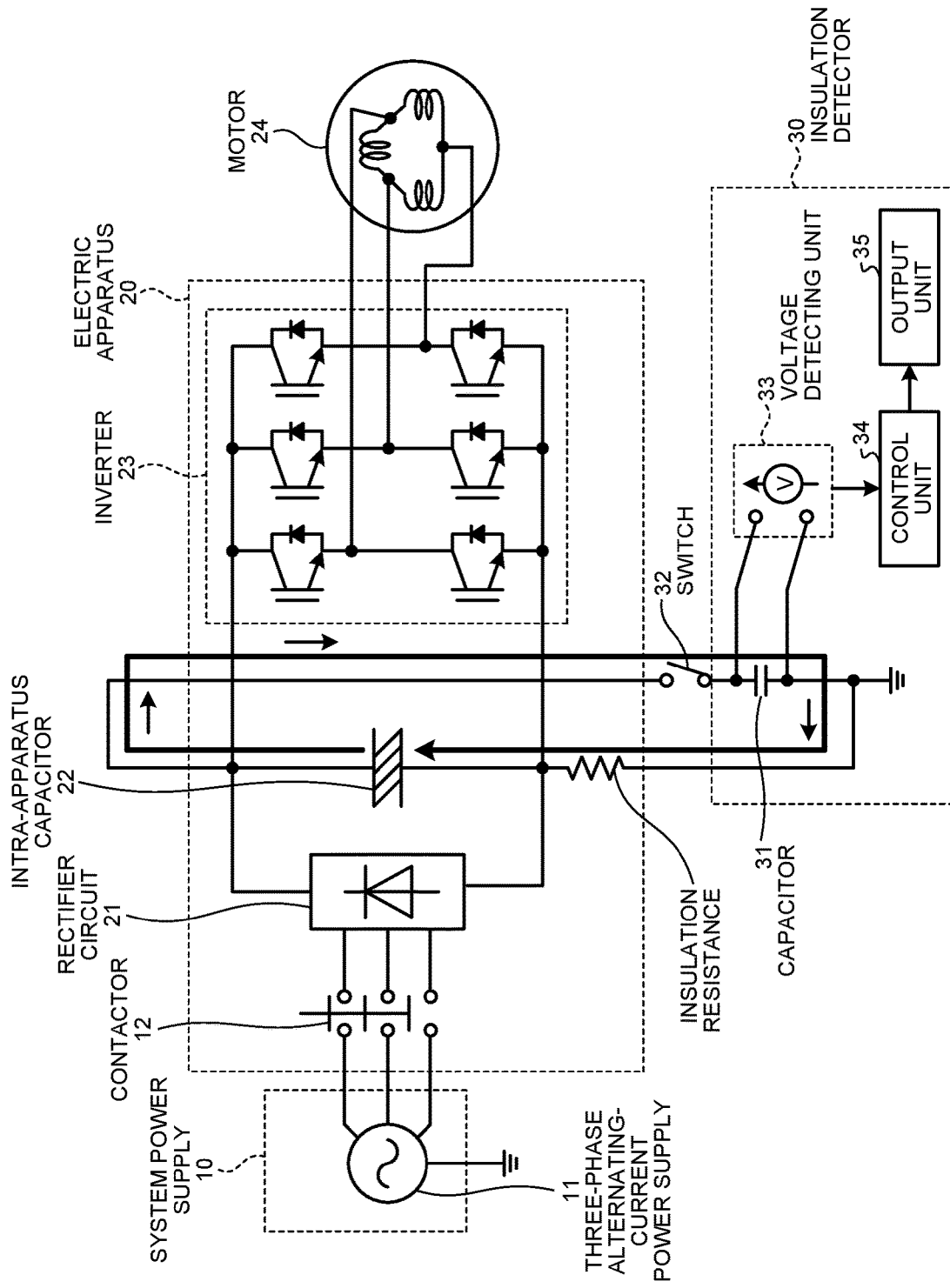
FIG. 3 is a diagram showing an example of the configuration of an insulation detector and an electric apparatus equipped with the insulation detector according to a second embodiment.

FIG. 3 is a diagram showing an example of the configuration of a second embodiment of an insulation detector and an electric apparatus equipped with the insulation detector according to the present invention. In the insulation detector 30 shown in FIG. 3, the position of the capacitor 31 and the position of the switch 32 of the insulation detector 30 shown in FIG. 1 are interchanged. All of the other components are the same as the components of the insulation detector 30 shown in FIG. 1.

In FIG. 1, one end of the capacitor 31 is connected to the P bus, the other end of the capacitor 31 is connected to one end of the switch 32, and the other end of the switch 32 is connected to the ground or the housing. However, in FIG. 3, one end of the switch 32 is connected to the P bus, the other end of the switch 32 is connected to one end of the capacitor 31, and the other end of the capacitor 31 is connected to the ground or the housing. In this way, in the configuration shown in FIG. 3, it is possible to measure insulation resistance as in the configuration shown in FIG. 1.

Third Embodiment

Figure 4:
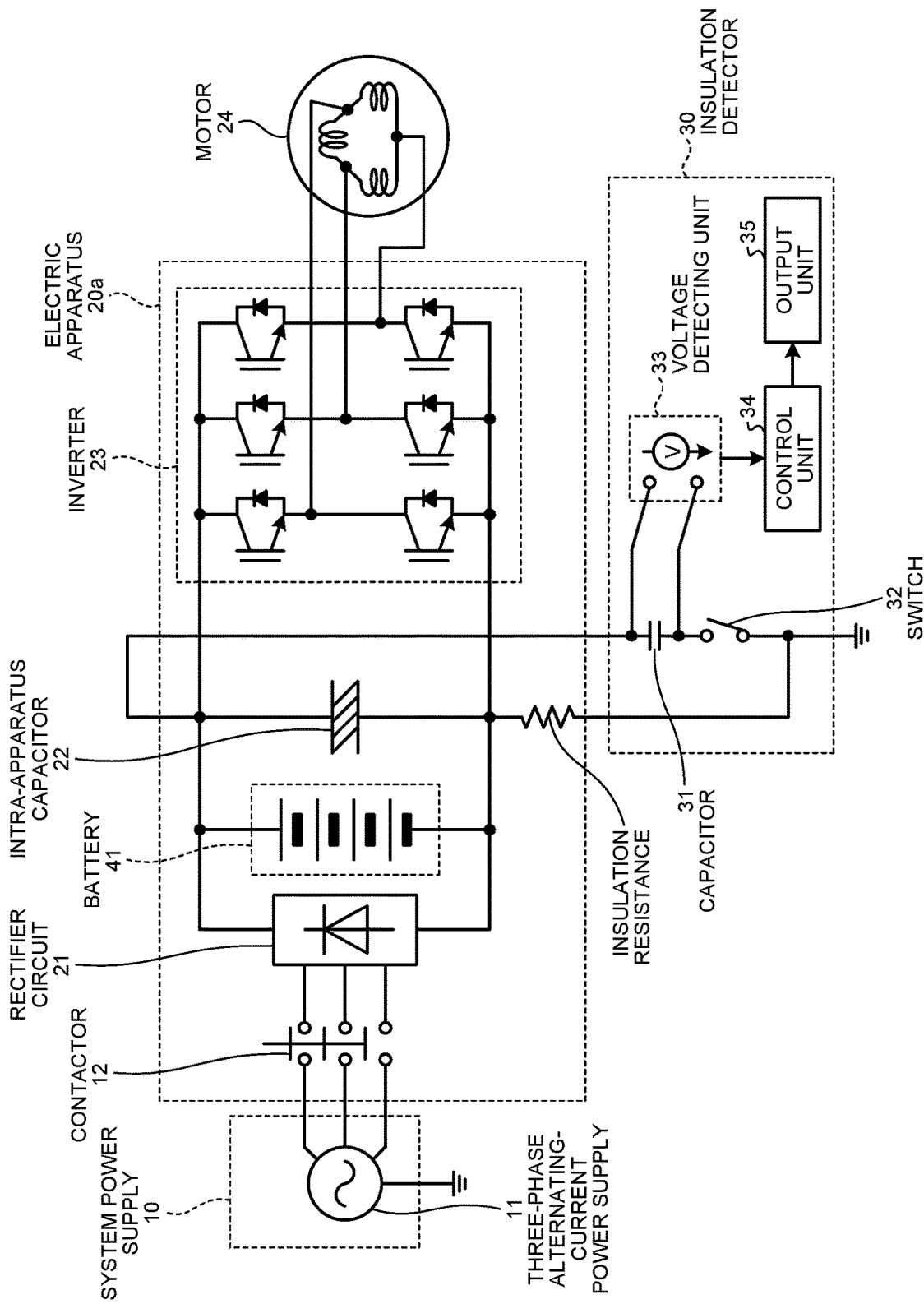
FIG. 4 is a diagram showing an example of the configuration of an insulation detector and an electric apparatus equipped with the insulation detector according to a third embodiment.

FIG. 4 is a diagram showing an example of the configuration of a third embodiment of an insulation detector and an electric apparatus equipped with the insulation detector according to the present invention. An electric apparatus 20a shown in FIG. 4 includes a battery 41 connected in parallel to the intra-apparatus capacitor 22. That is, the electric apparatus 20a includes the battery, which is a secondary battery, in the configuration of the electric apparatus 20a. As the electric apparatus 20a, an electric automobile can be illustrated.

In this way, in the configuration shown in FIG. 4, it is possible to measure insulation resistance as in the configuration shown in FIG. 1. However, in the configuration shown in FIG. 4, the voltage between the P bus and the N bus is maintained constant irrespective of presence or absence of the intra-apparatus capacitor 22. Therefore, $V_1=V_0$ in the above Formula (2) and $C_m'=C_m$ in Formula (1).

Fourth Embodiment

Figure 5:
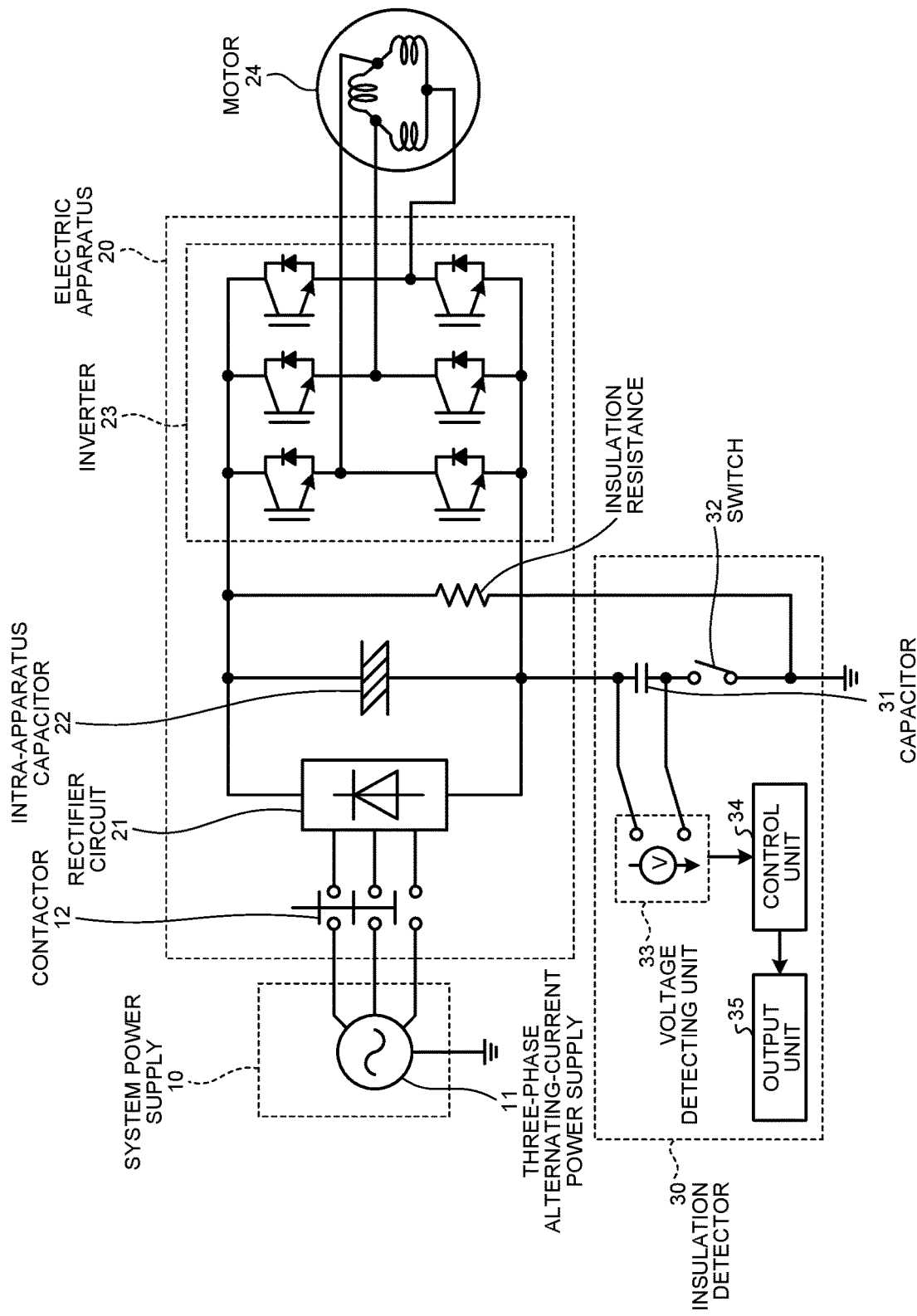
FIG. 5 is a diagram showing an example of the configuration of an insulation detector and an electric apparatus equipped with the insulation detector according to a fourth embodiment.

FIG. 5 is a diagram showing an example of the configuration of a fourth embodiment of an insulation detector and an electric apparatus equipped with the insulation detector according to the present invention. In the insulation detector 30 shown in FIG. 5, a connecting position of the capacitor 31 is changed to the N bus side in the insulation detector 30 shown in FIG. 1. All of the other components are the same as the components of the insulation detector 30 shown in FIG. 1.

In FIG. 1, one end of the capacitor 31 is connected to the P bus, the other end of the capacitor 31 is connected to one end of the switch 32, and the other end of the switch 32 is connected to the ground or the housing. However, in FIG. 5, one end of the capacitor 31 is connected to the N bus, the other end of the capacitor 31 is connected to one end of the switch 32, and the other end of the switch 32 is connected to the ground or the housing. In FIG. 1, the insulation resistance between the N bus and the ground or the housing is measured. When the configuration shown in FIG. 5 is adopted in this way, it is possible to measure the insulation resistance between the P bus and the ground or the housing.

Fifth Embodiment

Figure 6:
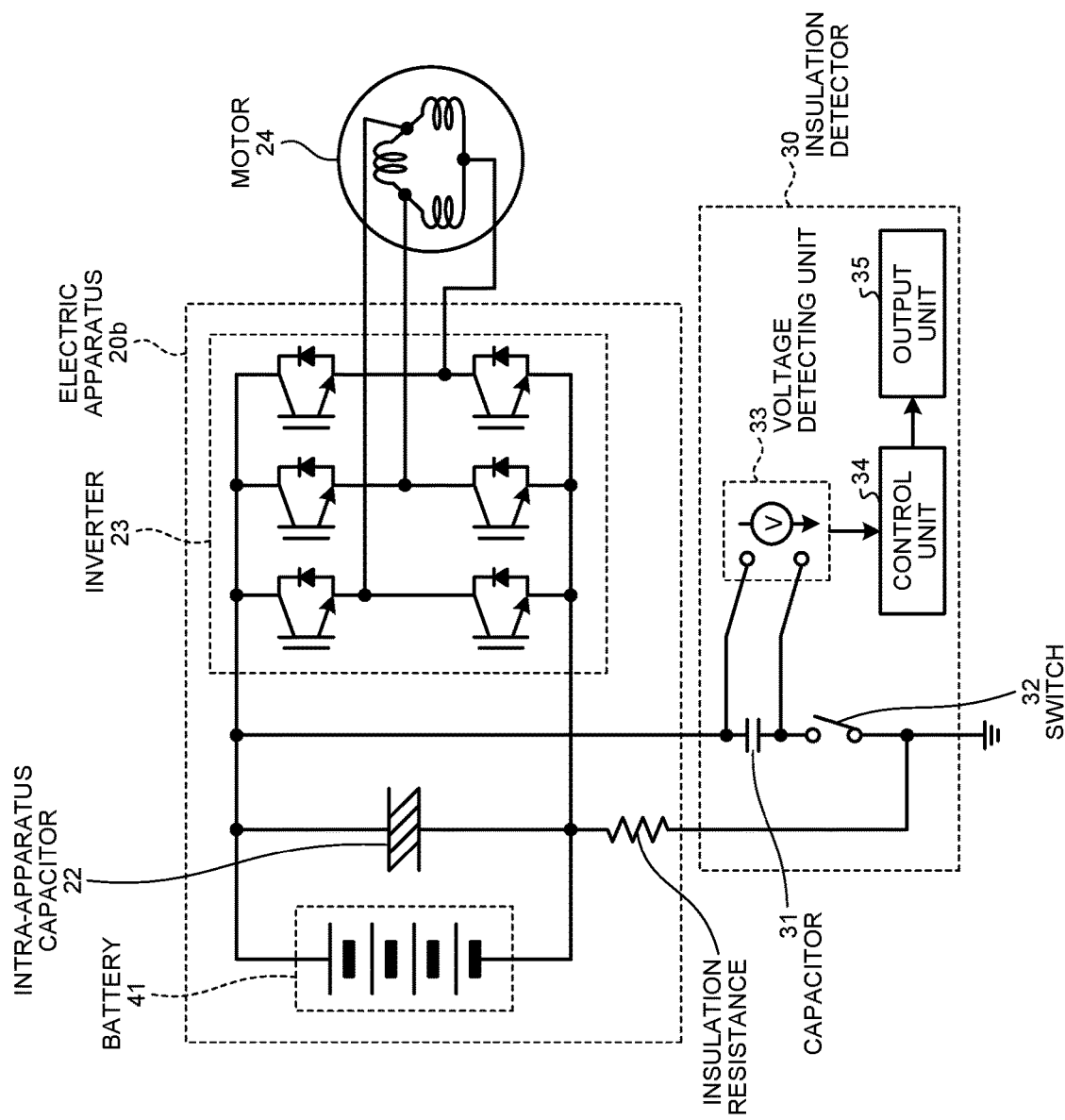
FIG. 6 is a diagram showing an example of the configuration of an insulation detector and an electric apparatus equipped with the insulation detector according to a fifth embodiment.

FIG. 6 is a diagram showing an example of the configuration of a fifth embodiment of an insulation detector and an electric apparatus equipped with the insulation detector according to the present invention. An electric apparatus 20b shown in FIG. 6 does not include the rectifier circuit 21, is not connected to the system power supply 10, and includes the battery 41 connected in parallel to the intra-apparatus capacitor 22. The motor 24 is driven by electric power of the battery 41. That is, the electric apparatus 20b includes the battery, which is a secondary battery, in the configuration of the electric apparatus 20b. For the electric apparatus 20b, an electric automobile can be illustrated.

In the configuration shown in FIG. 6, a power supply that determines the potential to the ground like the system power supply 10 shown in FIG. 1 is not connected. Therefore, it is possible to detect insulation resistance while keeping this state. Note that, although not shown in the figure, in FIG. 6, as in FIG. 5, the insulation resistance between the P bus and the ground or the housing can be measured.

Figure 7:
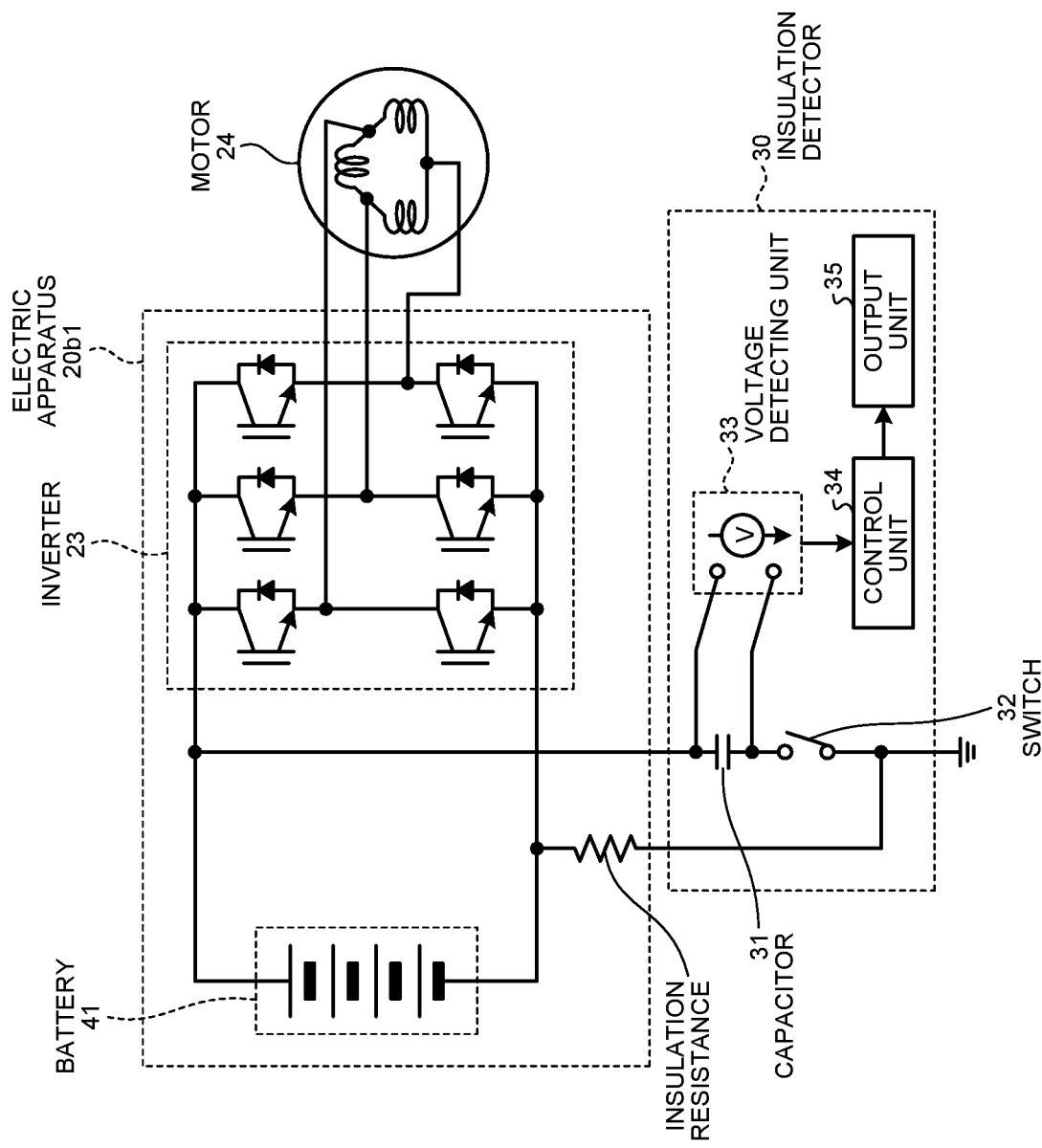
FIG. 7 is a diagram showing an example of the configuration of the insulation detector and the electric apparatus equipped with the insulation detector according to the fifth embodiment.

Note that the configuration shown in FIG. 6 includes the battery 41 connected in parallel to the intra-apparatus capacitor 22. However, the present invention is not limited to this. A configuration in which a battery is provided instead of the intra-apparatus capacitor 22 is also included in the present invention. FIG. 7 is a diagram showing an example of the configuration of the fifth embodiment of the insulation detector and an electric apparatus equipped with the insulation detector according to the present invention. An electric apparatus 20b1 shown in FIG. 7 does not include a rectifier circuit and is not connected to a system power supply. The electric apparatus 20b1 has a configuration in which the intra-apparatus capacitor 22 has been removed from the electric apparatus 20b shown in FIG. 6. In the configuration shown in FIG. 7, the battery 41 operates in the same manner as an intra-apparatus capacitor. In general, the capacity of the battery 41 is considerably large. In the configuration shown in FIG. 7, even if the capacitance value of the capacitor 31 is large, the voltage of the battery 41 is fixed and can be measured.

Sixth Embodiment

Figure 8:
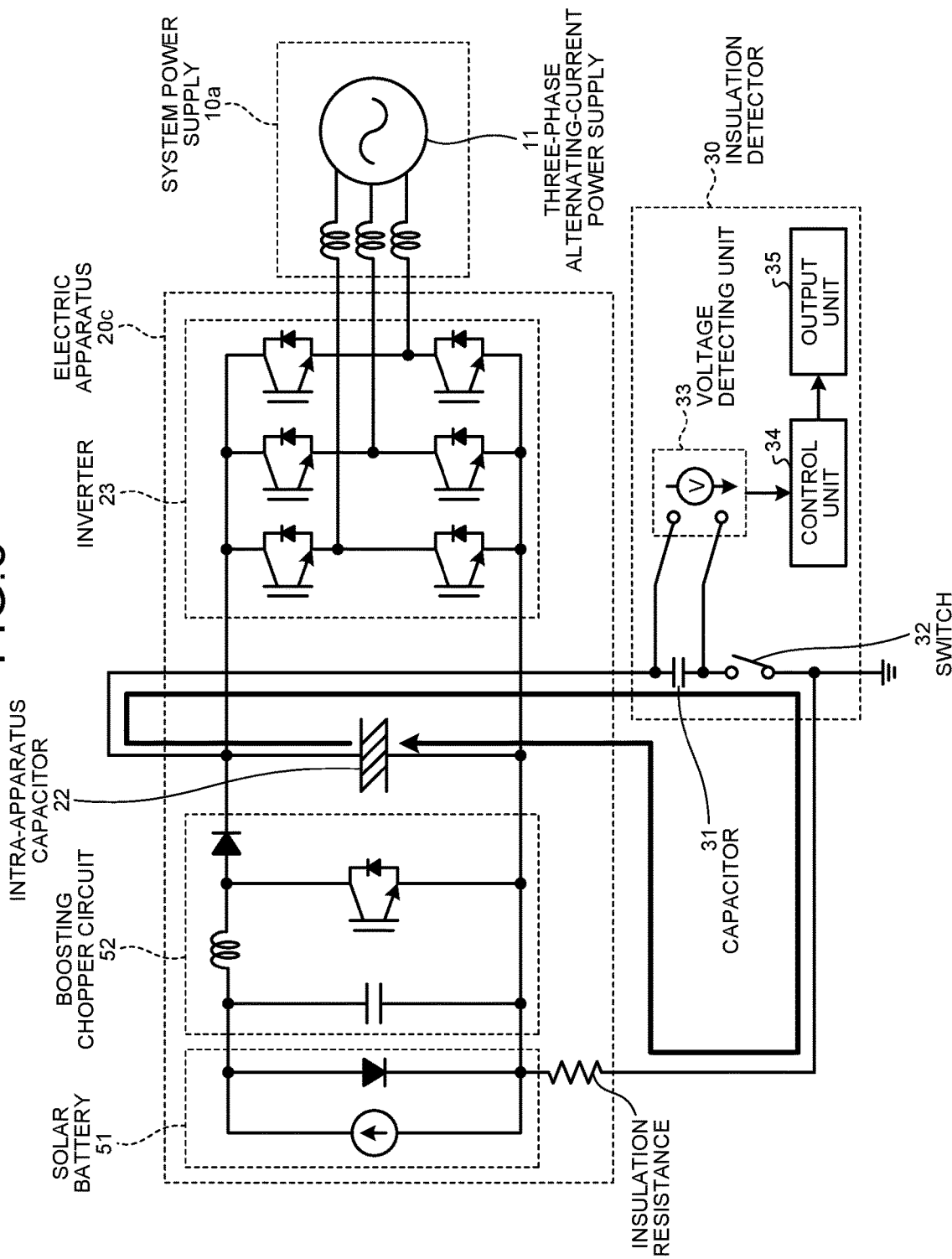
FIG. 8 is a diagram showing an example of the configuration of an insulation detector and an electric apparatus equipped with the insulation detector according to a sixth embodiment.

FIG. 8 is a diagram showing an example of the configuration of a sixth embodiment of an insulation detector and an electric apparatus equipped with the insulation detector according to the present invention. An electric apparatus 20c shown in FIG. 8 does not include the rectifier circuit 21 and includes a solar battery 51 and a boosting chopper circuit 52. Electric power of the solar battery 51 is output to a system power supply 10a. That is, the electric apparatus 20c includes the solar battery 51, which is a secondary battery, in the configuration of the electric apparatus 20c. For the electric apparatus 20c, a power conditioner can be illustrated.

Because an output of the solar battery 51 fluctuates, the output is converted into a constant voltage by the boosting chopper circuit 52, thereafter converted into an alternating current by the inverter 23, and supplied to the system power supply 10a. Note that a target to which the electric power is supplied is not limited to the system power supply 10a and can be other electric apparatuses, for example, other alternating-current electric apparatuses in a home.

In the configuration shown in FIG. 8, the portion of the solar battery 51 is not disconnected from a driving circuit portion of the electric apparatus 20c. A current path indicated by an arrow is formed. Consequently, it is possible to measure the insulation resistance of the driving circuit simultaneously with the insulation resistance of the solar battery 51.

To measure the insulation resistance in this way, as in the first to fifth embodiments, the current path is disconnected from the ground. This can be realized by disconnecting the current path from the system power supply 10a using the inverter 23. That is, if the inverter 23 is a full-bridge type as shown in FIG. 8, all inverter elements only have to be opened.

In this way, when the inverter 23 is the full-bridge type, by disconnecting the current path from the system power supply 10a using the inverter 23, as in FIG. 6, it is possible to detect the insulation resistance while keeping this state.

Note that in the case of a configuration in which the inverter 23 is not disconnected from the system power supply 10a, for example, a half-bridge type, as in FIG. 1, for example, a contactor only has to be provided between the system power supply 10a and the inverter 23 to change the configuration to an insulation-possible configuration.

Seventh Embodiment

Figure 9:
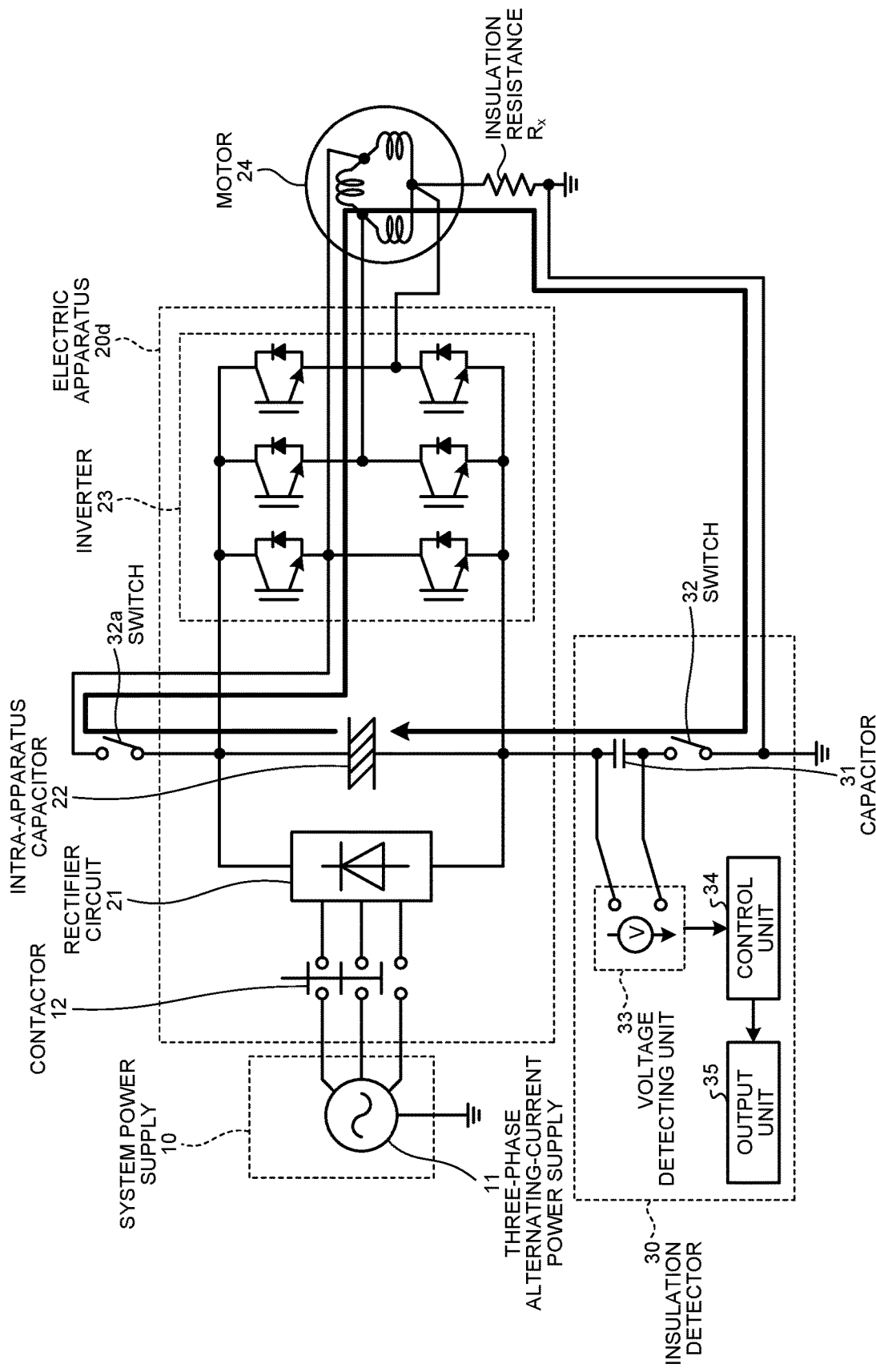
FIG. 9 is a diagram showing an example of the configuration of an insulation detector and an electric apparatus equipped with the insulation detector according to a seventh embodiment.

FIG. 9 is a diagram showing an example of the configuration of a seventh embodiment of an insulation detector and an electric apparatus equipped with the insulation detector according to the present invention.

In FIGS. 1 to 7, the insulation resistance between the P bus or the N bus and the ground or the housing is measured. However, in FIG. 9, the insulation resistance of a load, that is, the insulation resistance between the motor 24 and the ground or the housing is measured.

In measuring the insulation resistance between the motor 24 and the ground or the housing, first, the contactor 12 is opened to disconnect an electric apparatus 20d from the system power supply 10.

Between the P bus of the electric apparatus 20d and one of two inverter elements connected in series in the inverter 23, a switch 32a, which is a load-side path guide switch, is provided. The switch 32a is connected to the ground or the housing and one end of the switch 32 through the motor 24. The other end of the switch 32 is connected to one end of the capacitor 31. The other end of the capacitor 31 is connected to the N bus.

When the electric apparatus 20d is stopped, all the elements of the inverter 23 are off. Therefore, the switches 32 and 32a are closed to form a path of an electric current as indicated by an arrow. When the current path is formed in this way, an electric current flows through the insulation resistance of the motor 24. However, as in FIG. 5, because the electric current also flows to the insulation resistance between the P bus and the ground or the housing, actually, the electric current flows to these two resistances connected in parallel. Therefore, if insulation of the housing is high, a measured value of the insulation resistance is the insulation resistance of the motor 24.

Eighth Embodiment

Figure 10:
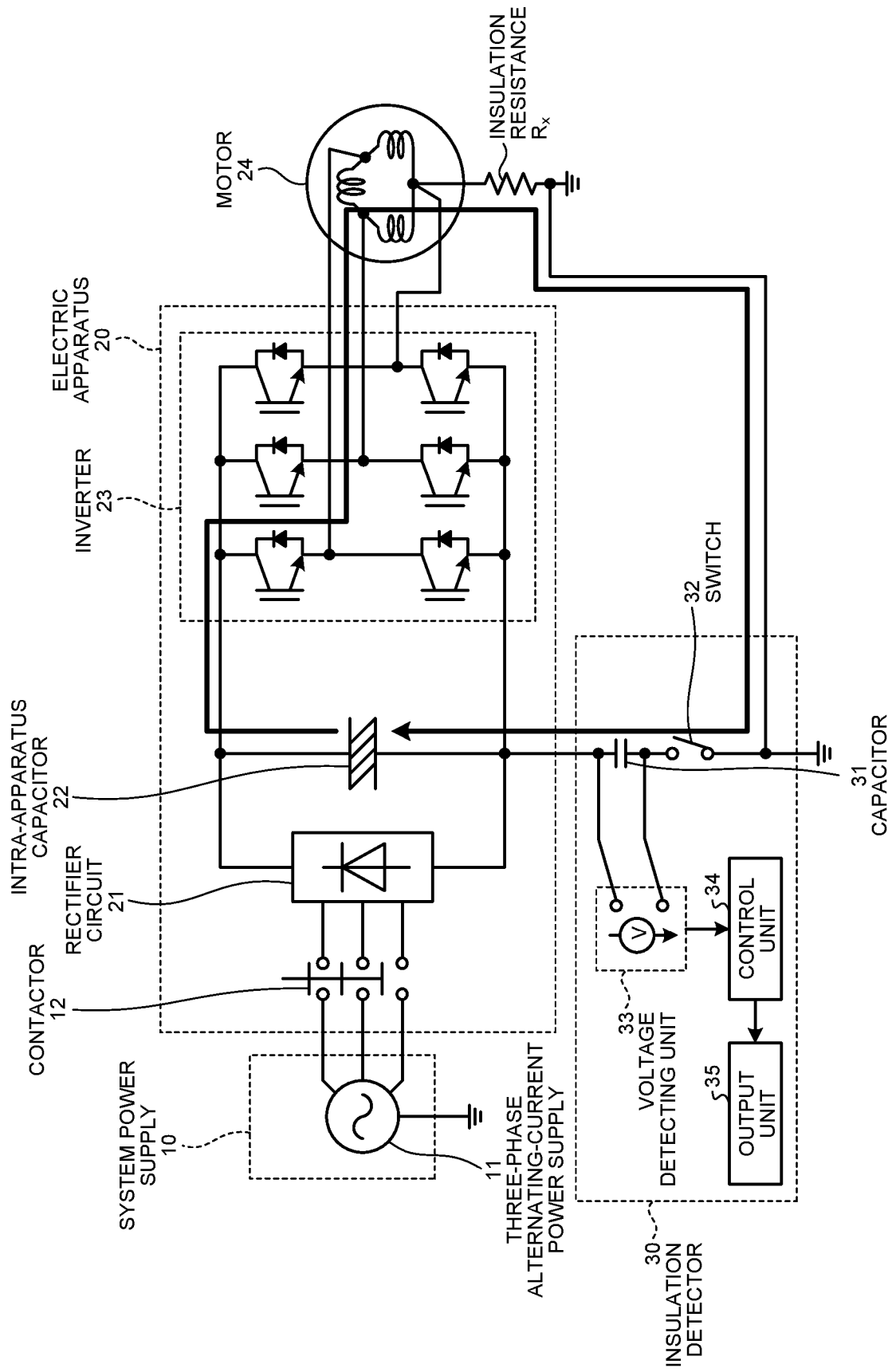
FIG. 10 is a diagram showing an example of the configuration of an insulation detector and an electric apparatus equipped with the insulation detector according to an eighth embodiment.

FIG. 10 is a diagram showing an example of the configuration of an eighth embodiment of an insulation detector and an electric apparatus equipped with the insulation detector according to the present invention. In the configuration shown in FIG. 10, the switch 32a shown in FIG. 9 is substituted by one of the inverter elements of the inverter 23. By adopting the configuration shown in FIG. 10, the switch 32a is made unnecessary. Therefore, it is possible to obtain a configuration simpler than the configuration shown in FIG. 9.

Ninth Embodiment

Figure 11:
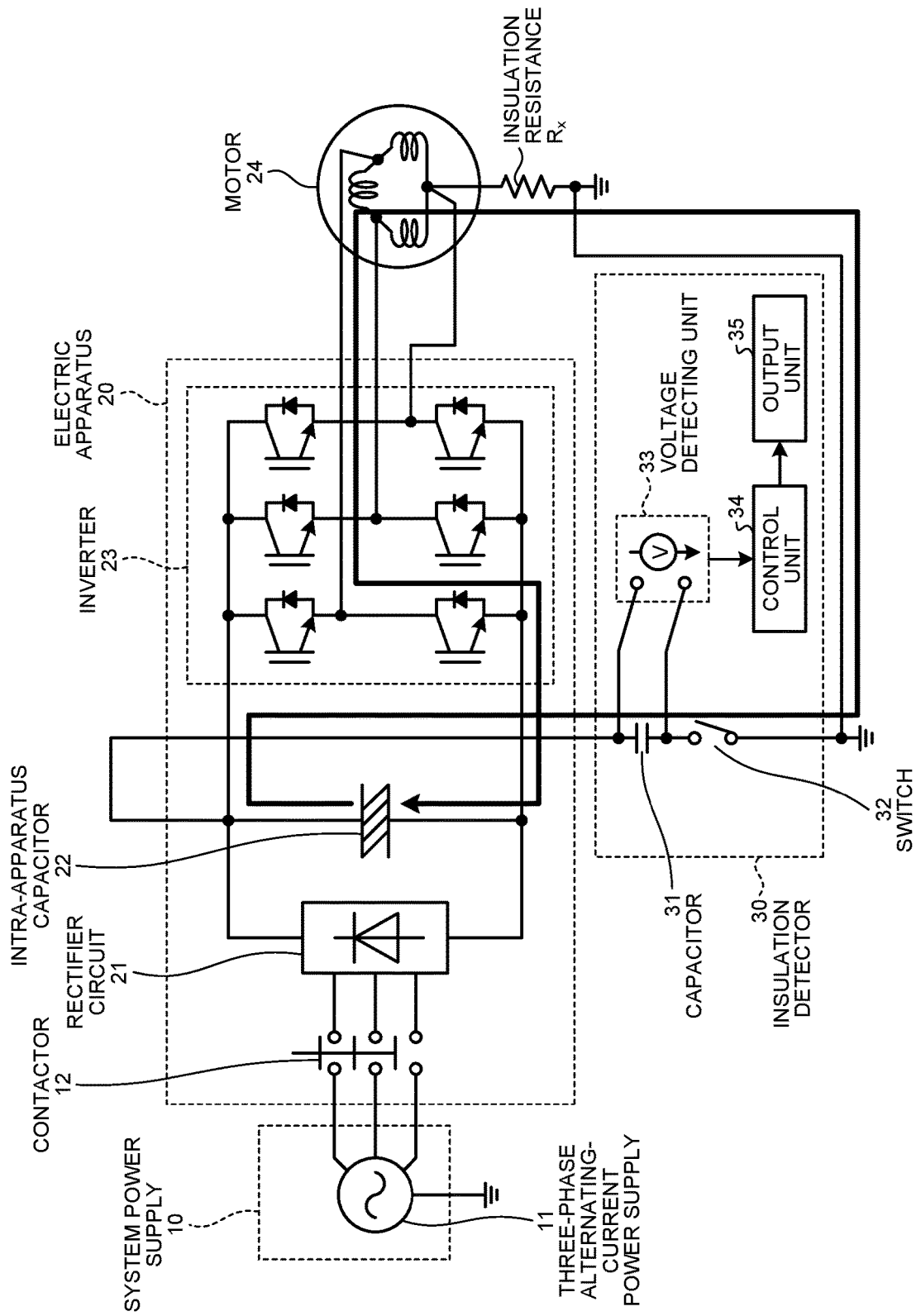
FIG. 11 is a diagram showing an example of the configuration of an insulation detector and an electric apparatus equipped with the insulation detector according to a ninth embodiment.

FIG. 11 is a diagram showing an example of the configuration of a ninth embodiment of an insulation detector and an electric apparatus equipped with the insulation detector according to the present invention. In the insulation detector 30 shown in FIG. 10, one end of the capacitor 31 is connected to the N bus of the electric apparatus 20, the other end of the capacitor 31 is connected to one end of the switch 32, and the other end of the switch 32 is connected to the ground or the housing. However, in the insulation detector 30 shown in FIG. 11, one end of the capacitor 31 is connected to the P bus of the electric apparatus 20, the other end of the capacitor 31 is connected to one end of the switch 32, and the other end of the switch 32 is connected to the ground or the housing. In the configuration shown in FIG. 11, as in the configuration shown in FIG. 10, one of the inverter elements of the inverter 23 is used as a substitute of the switch 32a. Note that, as indicated by an arrow, in the configuration shown in FIG. 11, a direction in which an electric current flows is opposite to the direction in the configuration shown in FIG. 10.

When the insulation resistance of the motor 24 has or is assumed to have a diode characteristic, which of the configurations shown in FIG. 10 and FIG. 11 is adopted needs to be selected taking into account the direction of the electric current.

Tenth Embodiment

Figure 12:
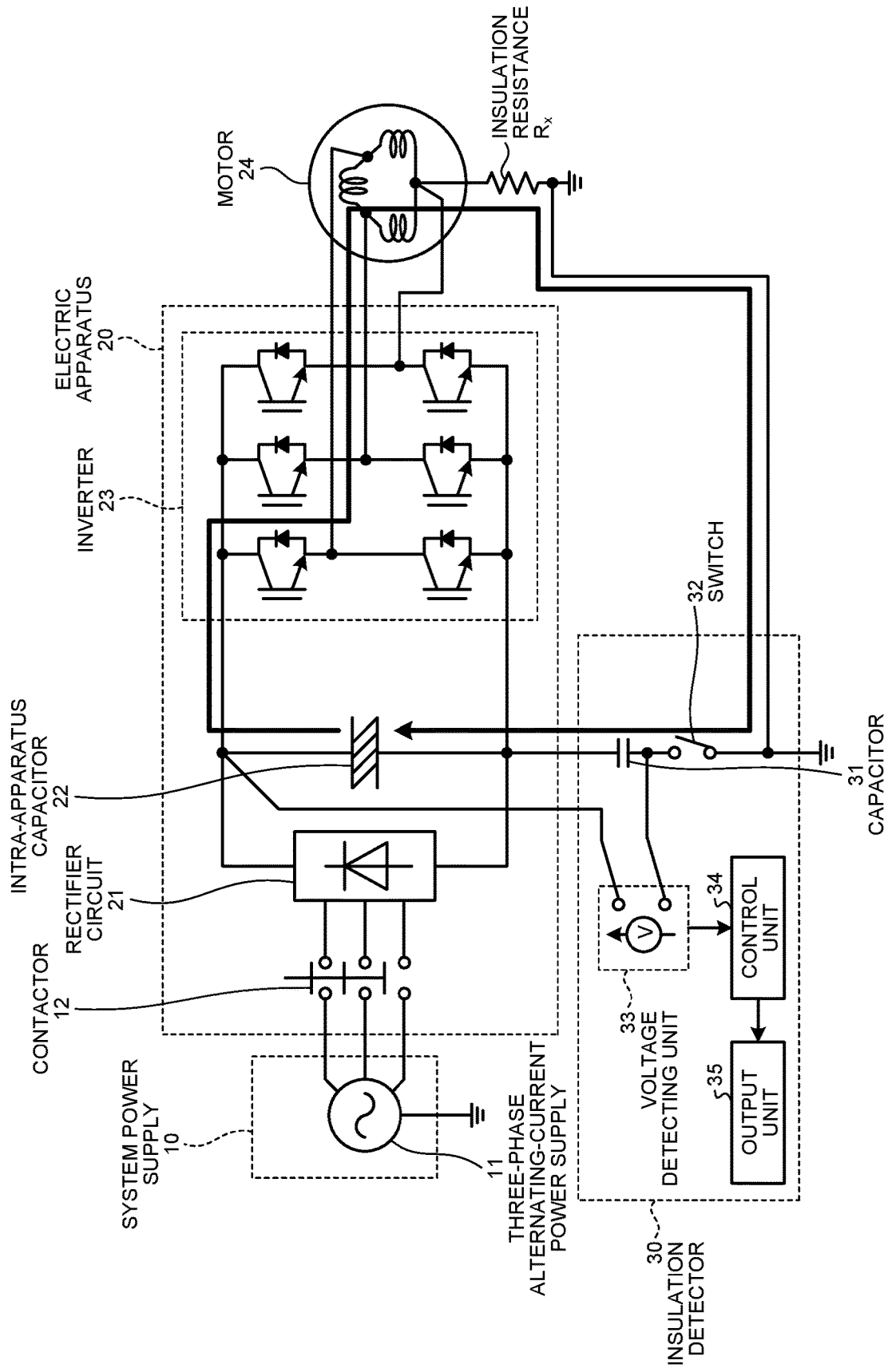
FIG. 12 is a diagram showing an example of the configuration of an insulation detector and an electric apparatus equipped with the insulation detector according to a tenth embodiment.

FIG. 12 is a diagram showing an example of the configuration of a tenth embodiment of an insulation detector and an electric apparatus equipped with the insulation detector according to the present invention. In the configuration shown in FIG. 10, the voltage detecting unit 33 detects only the voltage of the capacitor 31. The configuration shown in FIG. 12 is different in that the voltage detecting unit 33 detects the voltages of the intra-apparatus capacitor 22 and the capacitor 31 connected in series. In the configuration shown in FIG. 12, a measured voltage is a difference between the voltages of the intra-apparatus capacitor 22 and the capacitor 31.

Figure 13:
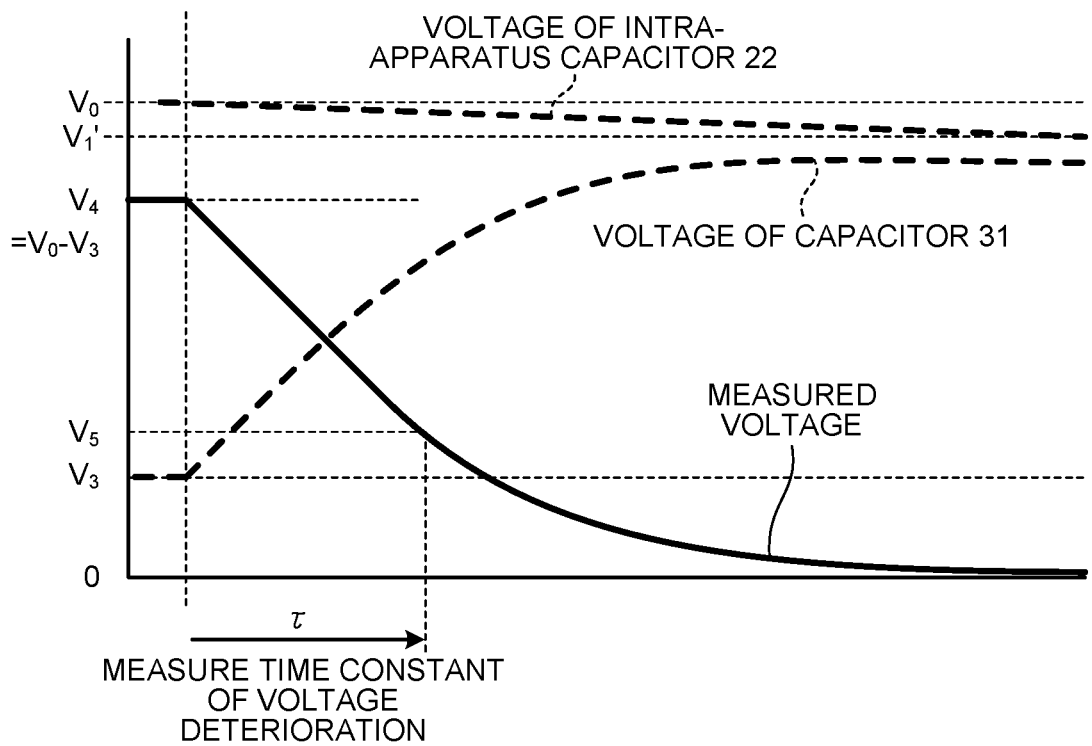
FIG. 13 is a diagram showing changes in the voltages of a capacitor and a smoothing capacitor and a measured voltage in the electric apparatus according to the tenth embodiment.

First, electric charges accumulated in the intra-apparatus capacitor 22 move to the capacitor 31. Therefore, the voltage difference between the intra-apparatus capacitor 22 and the capacitor 31 approaches zero. That is, the measured voltage is represented by an attenuation curve starting from an initial value, which is the difference between the voltages of the intra-apparatus capacitor 22 and the capacitor 31, and finally approaching zero. An asymptotic value of the measured voltage is zero and does not depend on the initial value of the voltage of the intra-apparatus capacitor 22. Even if electric charges remain in the capacitor 31, the electric charges do not affect the measurement. Changes in the voltages of the capacitor 31 and the intra-apparatus capacitor 22 and the measured voltage after the start of the measurement are as shown in FIG. 13.

Samely as in FIG. 2, an initial voltage of the intra-apparatus capacitor 22 is represented as the voltage $V_0$ and an initial voltage of the capacitor 31 is represented as the voltage $V_3$. Then, a voltage $V_1'$ to which the voltage of the intra-apparatus capacitor 22 and the voltage of the capacitor 31 gradually approach is represented by the following Formula (7).

$$V_1' = V_3 + \frac{C_0}{C_0 + C_m}(V_0 - V_3) \qquad (7)$$

An initial value of the measured voltage of the voltage detecting unit 33 is $V_4 = V_0 - V_3$. When time elapses, because the voltage of the intra-apparatus capacitor 22 and the voltage of the capacitor 31 are equal, the measured voltage becomes zero.

Figure 14:
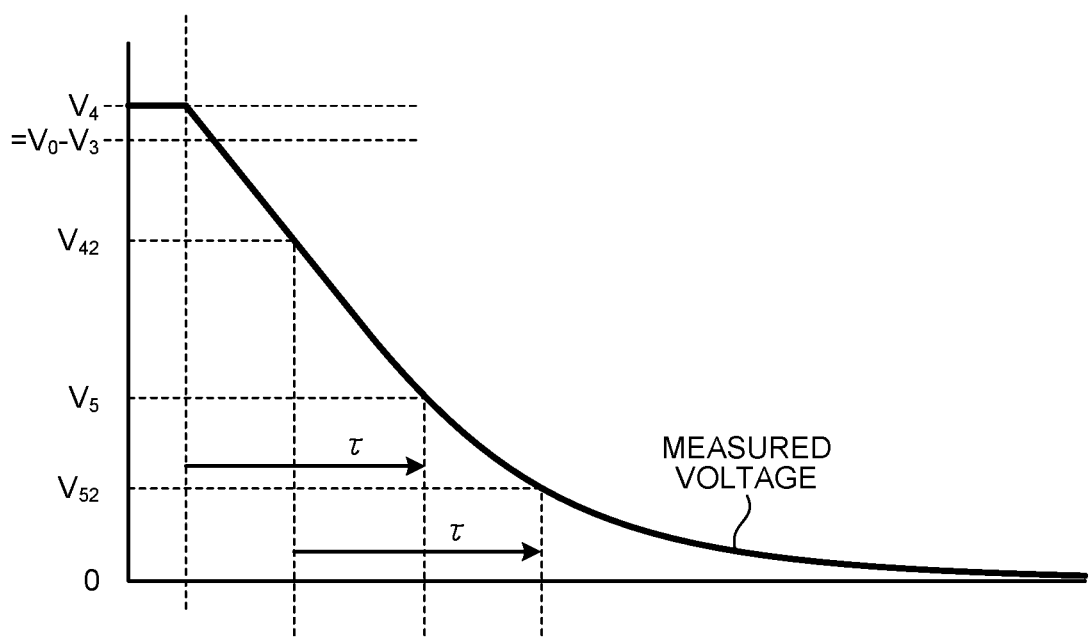
FIG. 14 is a diagram showing a change in a measured voltage according to the tenth embodiment.

A time constant of attenuation in FIG. 13 is the same as the time constant in FIG. 2 and is the same as the above Formula (4). In FIG. 13, because an asymptotic value of an attenuation curve is clear, it is possible to measure the time constant without depending on the initial value of the voltage of the intra-apparatus capacitor 22. This means that, as shown in FIG. 14, a measurement start time can be selected as long as the measured voltage is being attenuated. This measured value is represented by the following Formula (8).

$$V(t) = V_4\left(\exp\left(-\frac{t}{\tau}\right)\right) \qquad (8)$$

Time $\tau$ at the time when the measured voltage reaches a voltage $V_5$ is measured as a time constant. When $\tau$ is represented by the above Formula (4), the relation between the voltage $V_4$ and the voltage $V_5$ is represented by the following Formula (9).

$$V_5 = \frac{V_4}{e} \qquad (9)$$

In the formula, e represents a base of a natural logarithm. In the relation of the above Formula (9), a reference of the voltage $V_4$ can be set to a voltage $V_{42}$ after the elapse of a determined time from an attenuation start. That is, when a voltage after the elapse of $\tau$ from the time when the measured voltage reaches the voltage $V_{42}$ is represented as $V_{52}$, the relation between the voltage $V_4$ and the voltage $V_5$ is represented by the following Formula (10).

$$\frac{V_{52}}{V_{42}} = \frac{V_5}{V_4} = \frac{1}{e} \qquad (10)$$

That is, the voltage $V_{42}$ after the elapse of the determined time from the attenuation start of the measured voltage is set as a reference or the time when the measured voltage reaches the voltage $V_{42}$ is set as a reference. It is possible to measure $\tau$ by measuring time until the voltage reaches the voltage $V_{52} = V_{42}/e$.

In this way, it is possible to determine the time when the voltage measurement is started or a voltage at which the voltage measurement is started. Therefore, it is possible to start the measurement avoiding a period when fluctuation in the voltage easily occurs such as a period immediately after the start of discharge.

As indicated by the above Formula (6), it is also possible to measure the time constant $\tau$ by measuring the time until the measured voltage reaches a determined voltage. For example, time in which the measured voltage is attenuated from the voltage $V_0$ to a voltage $V_6$ is represented by the following Formula (11) from the above Formula (8).

$$\tau' = \tau \cdot \ln\frac{V_0}{V_6} \qquad (11)$$

In this way, the time constant $\tau$ can be calculated from $\tau'$ obtained by the measurement and the measured voltage.

Eleventh Embodiment

Figure 15:
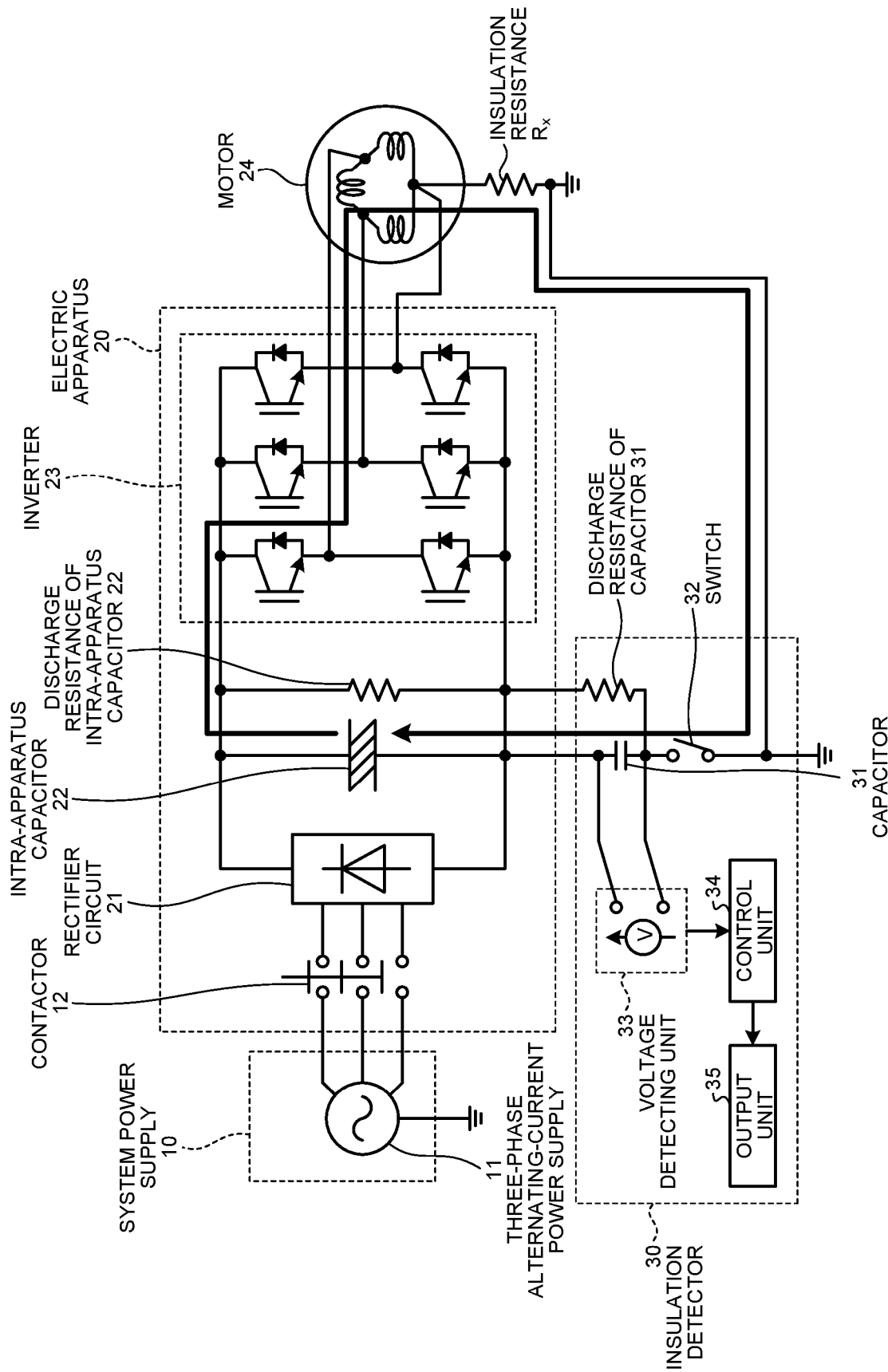
FIG. 15 is a diagram showing an example of the configuration of an insulation detector and an electric apparatus equipped with the insulation detector according to an eleventh embodiment.

FIG. 15 is a diagram showing an example of the configuration of an eleventh embodiment of an insulation detector and an electric apparatus equipped with the insulation detector according to the present invention. In the tenth embodiment, the configuration is explained in which measurement is possible irrespective of the initial voltages of the intra-apparatus capacitor 22 and the capacitor 31. However, in the configuration in the tenth embodiment, when the initial voltage of the intra-apparatus capacitor 22 and the initial voltage of the capacitor 31 are equal, attenuation of the measured voltage does not occur because movement of electric charges does not occur.

When the voltage of the capacitor 31 is higher than the voltage of the intra-apparatus capacitor 22, the measured voltage is a negative value, and a problem occurs in terms of a measurement algorithm. Therefore, it is preferable that the voltage of the capacitor 31 is small and the initial voltage is zero.

In the configuration shown in FIG. 15, discharge resistance of the capacitor 31 is provided. The discharge resistance of the capacitor 31 is connected in parallel to the capacitor 31. To measure fluctuation in the voltage of the capacitor 31, a resistance value of the discharge resistance of the capacitor 31 is set larger than insulation resistance set as a measurement target such that an electric current does not flow to the discharge resistance of the capacitor 31. For example, a discharge time constant of the discharge resistance of the capacitor 31 only has to be set to a value close to a discharge time constant of the discharge resistance of the intra-apparatus capacitor 22.

When the resistance value of the discharge resistance of the intra-apparatus capacitor 22 is represented as $R_{d0}$, the discharge time constant of the intra-apparatus capacitor 22 is $C_0 \times R_{d0}$. When the discharge time constant of the discharge resistance of the capacitor 31 is set equal to the discharge time constant of the discharge resistance of the intra-apparatus capacitor 22, a resistance value $R_{dm}$ of the discharge resistance of the capacitor 31 is represented by the following Formula (12).

$$R_{dm} = \frac{C_0 \times R_{d0}}{C_m} \qquad (12)$$

A measurement time in the present invention is shorter than the discharge time constant of the intra-apparatus capacitor 22. Therefore, when the discharge resistance of the capacitor 31 is selected to satisfy the above Formula (12), the influence of the discharge resistance of the capacitor 31 on the measurement is small.

When such a discharge resistance is provided as the discharge resistance of the capacitor 31, the voltage across both ends of the capacitor 31 can be kept as zero when measurement of insulation resistance is not performed and the switch 32 is open. After the measurement of the insulation resistance is performed, when the switch 32 is opened, the voltage of the capacitor 31 drops at a time constant of a preceding discharge resistor. After a long time elapses, the voltage of the capacitor 31 decreases to zero.

In this state, the voltage detecting unit 33 measures only the voltage of the intra-apparatus capacitor 22. That is, when the measurement of the insulation resistance is not performed, the voltage between the P bus and the N bus, which is the voltage across both the ends of the intra-apparatus capacitor 22, can be measured by the voltage detecting unit 33. In this way, the voltage between the P bus and the N bus important for control of an inverter device can also be obtained. Alternatively, a voltage measuring unit for the P bus and the N bus and a voltage measuring unit for detection of insulation resistance can be concurrently used.

Twelfth Embodiment

Figure 16:
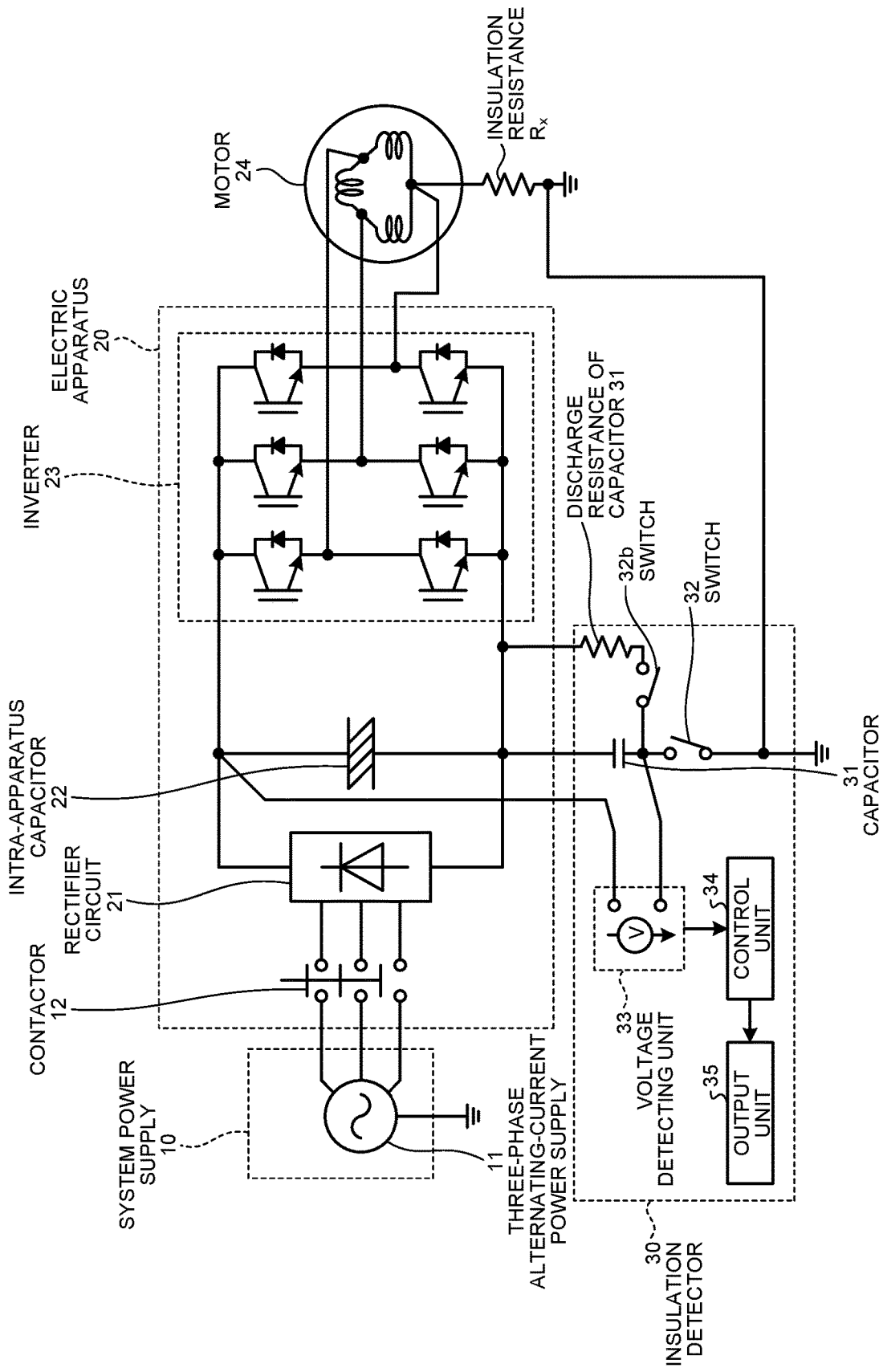
FIG. 16 is a diagram showing an example of the configuration of an insulation detector and an electric apparatus equipped with the insulation detector according to a twelfth embodiment.

FIG. 16 is a diagram showing an example of the configuration of a twelfth embodiment of an insulation detector and an electric apparatus equipped with the insulation detector according to the present invention. In the configuration in the eleventh embodiment, unless the switch 32 is opened after the measurement and a long time elapses, the voltage of the capacitor 31 does not decrease to zero and a problem occurs in terms of a measurement algorithm.

The configuration shown in FIG. 16 is a configuration in which discharge of the capacitor 31 can be quickly performed. In the configuration shown in FIG. 16, not only the switch 32 provided between one end of the capacitor 31 and the ground or the housing but also a switch 32b for short-circuiting both the ends of the capacitor 31 with resistance provided in parallel to the capacitor 31 is provided. Unlike the discharge resistance of the capacitor 31 shown in FIG. 15, a resistance value of the resistance is small. For example, the resistance value is set to 10% or less of the insulation resistance and only has to be in a degree for not damaging the switch 32 when the capacitor 31 is short-circuited. In a measurement sequence, a time constant is measured with a voltage change due to current inflow to the capacitor 31, which is a capacitor for detection, via the insulation resistance. However, it is necessary to turn on a switch of the parallel discharge resistance and reduce the voltage of the capacitor for detection to zero during the measurement. This work is performed in time shorter than the measurement of the time constant. Therefore, for example, when the work is performed in 1/10 time, the resistance value also needs to be set to 1/10 or less. Preferably, the work is performed in 1/100 time and the resistance value is set to 1% or less. A resistance value of the resistance provided in parallel to the capacitor 31 is set to a small value of a degree for enabling discharge to reduce the voltage of the capacitor 31 to zero during the measurement of the time constant.

When the measurement of the insulation resistance is not performed, the switch 32b is closed. During the measurement of the insulation resistance, the switch 32b is opened and the switch 32 is closed to form a current path including the capacitor 31 and measure the insulation resistance.

Thirteenth Embodiment

Figure 17:
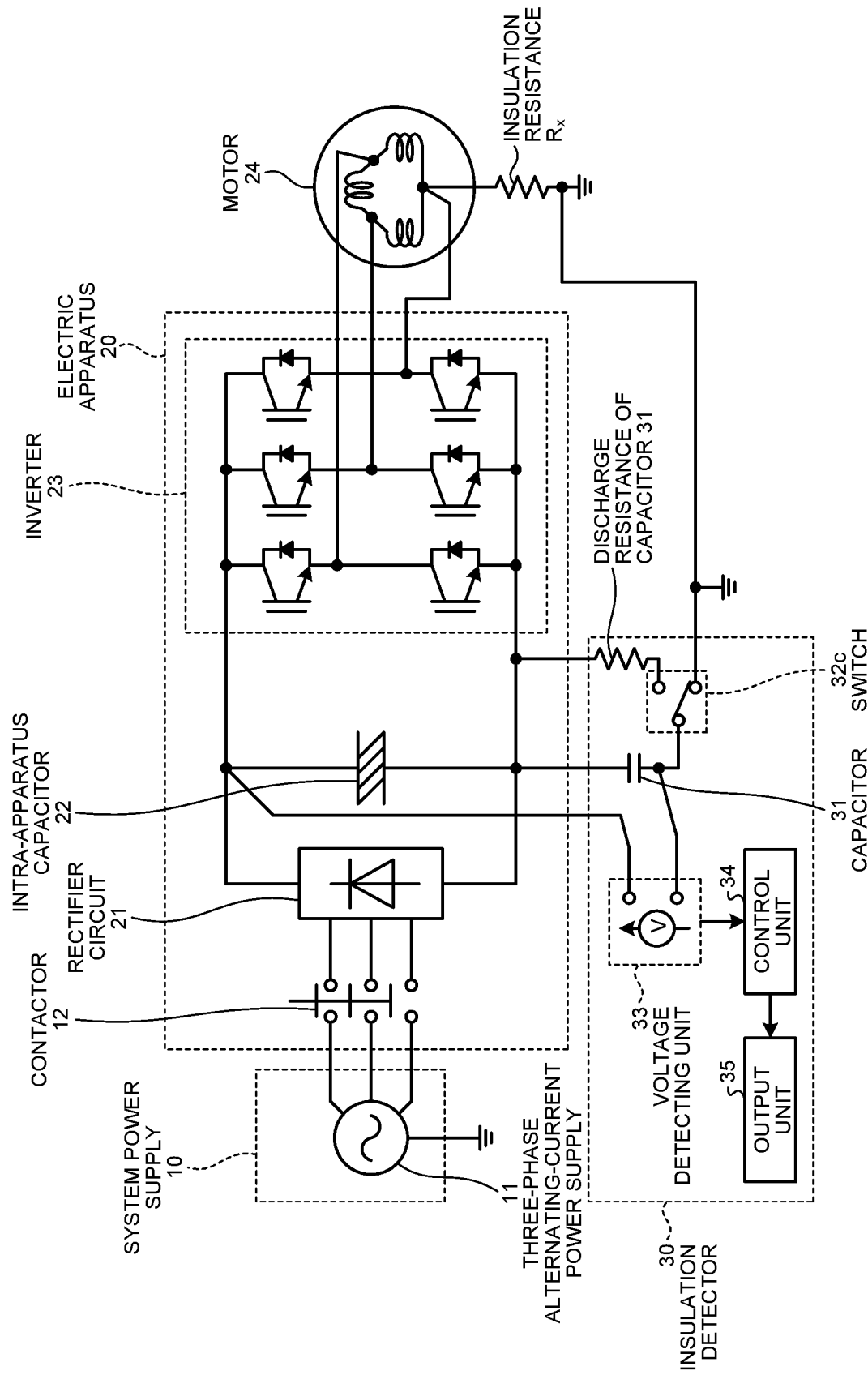
FIG. 17 is a diagram showing an example of the configuration of an insulation detector and an electric apparatus equipped with the insulation detector according to thirteenth embodiment.

FIG. 17 is a diagram showing an example of the configuration of a thirteenth embodiment of an insulation detector and an electric apparatus equipped with the insulation detector according to the present invention. In the configuration shown in FIG. 17, the operation realized by the two switches, i.e., the switch 32 and the switch 32b in FIG. 16 can be realized by a switch 32c.

When insulation resistance is not measured, the switch 32c connects the capacitor 31 and the resistance provided in parallel to the capacitor 31. When the measurement is started, the switch 32c forms a current path including the capacitor 31 and an insulation resistance to measure the insulation resistance. By adopting the configuration shown in FIG. 17, it is made possible to simplify the configuration.

Fourteenth Embodiment

Figure 18:
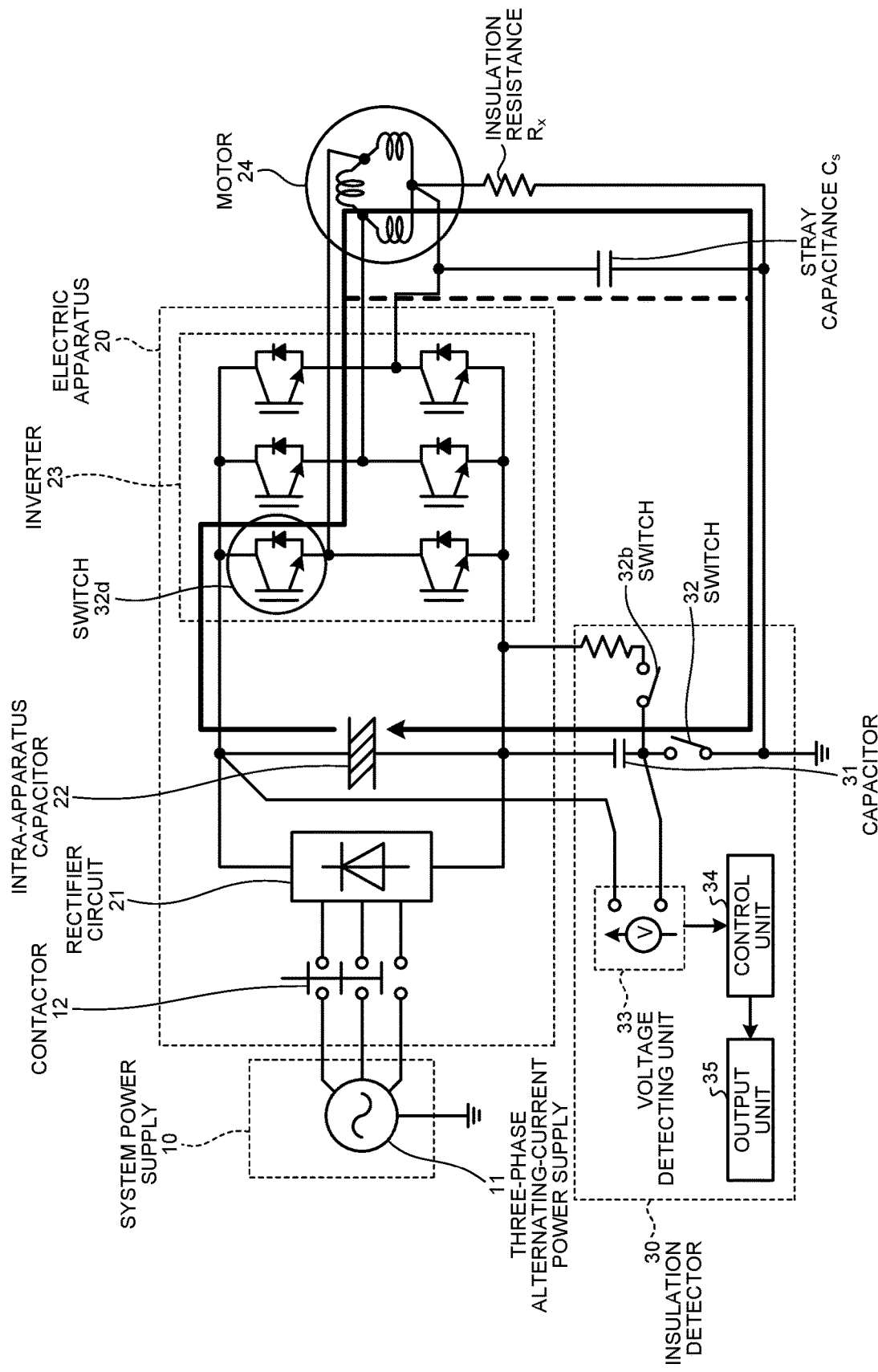
FIG. 18 is a diagram showing an example of the configuration of an insulation detector and an electric apparatus equipped with the insulation detector according to a fourteenth embodiment.

FIG. 18 is a diagram showing an example of the configuration of a fourteenth embodiment of an insulation detector and an electric apparatus equipped with the insulation detector according to the present invention. In the configuration shown in FIG. 18, stray capacitance $C_s$ is added between the motor 24, which is a load, and the ground. The stray capacitance $C_s$ parallel to the insulation resistance of the motor 24, which is most predominant, is illustrated. A switch 32d substituted by the inverter element of the inverter 23 is present.

When the switch 32 and the switch 32d are closed to form a current path in a state in which the switch 32b is opened and the resistor for short-circuiting the capacitor 31 is disconnected, an electric current flows through the stray capacitance $C_s$ before flowing through the insulation resistance $R_x$. In other words, the voltage of the intra-apparatus capacitor 22 is divided by the capacitor 31 and the stray capacitance $C_s$.

If the stray capacitance $C_s$ is not present, when the measurement is started, the entire of the intra-apparatus capacitor 22 is applied to the insulation resistance R. However, when the stray capacitance $C_s$ is present as shown in FIG. 18, the voltage is divided and a part of the voltage is applied to the capacitor 31. An initial voltage $V_{Cm0}$ of the capacitor 31 after the voltage division is represented by the following Formula (13).

$$V_{Cm0} = \frac{C_s}{C_m + C_s} \times V_0 \tag{13}$$

Figure 19:
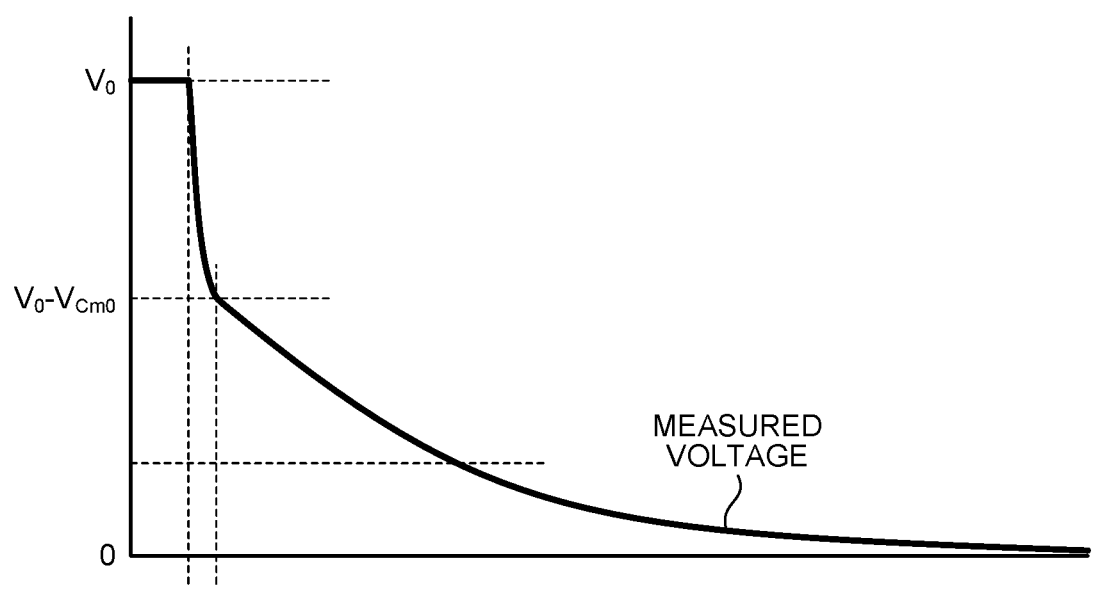
FIG. 19 is a diagram showing a change in a measured voltage in the electric apparatus according to the fourteenth embodiment.

The voltage $V_0$ is an initial voltage of the intra-apparatus capacitor 22. In the above Formula (13), approximation assuming that the capacitance $C_0$ of the intra-apparatus capacitor 22 is larger than combined capacitance of the capacitance $C_m$ of the capacitor 31 and the stray capacitance $C_s$ connected in series is used. This is represented by a measurement waveform as shown in FIG. 19. Because the capacitor 31 is charged to the above Formula (13) first, a voltage difference between the voltage of the intra-apparatus capacitor 22 and that of the capacitor 31, which is a measurement waveform, decreases to $V_0 - V_{Cm0}$ immediately after the measurement start. Thereafter, attenuation of the voltage is caused by an electric current flowing through the insulation resistance R. That is, as shown in FIG. 19, a measured voltage changes in two stages because a sudden drop of the voltage occurs first in the beginning and thereafter the voltage is attenuated at the time constant τ.

If the stray capacitance $C_s$ is generally equal to or larger than the capacitance $C_m$ of the capacitor 31, because $V_{Cm0}$ is large according to the above Formula (13), the drop of the voltage in the beginning becomes extremely large. Then, it is difficult to measure a waveform of a portion of the attenuation by the time constant τ. To avoid this, timings when the switch 32 and the switch 32b are turned on are controlled.

First, before measurement of the insulation resistance $R_x$ is started, the switch 32b is closed and the switches 32 and 32d are opened. When the measurement is started, all of the switches 32b, 32, and 32d are closed. Then, first, the stray capacitance $C_s$ is charged up to a value close to $V_0$ with the voltage of the intra-apparatus capacitor 22. After the stray capacitance $C_s$ is charged up to the voltage $V_0$, when the switch 32b is opened, an electric current flowing through the insulation resistance $R_x$ accumulates electric charges in the capacitor 31. Attenuation of the measured voltage is observed.

In this way, it is possible to set the voltage of the stray capacitance $C_s$ to $V_0$ and set the voltage of the capacitor 31 to 0. Therefore, a waveform attenuated from $V_0$ is obtained as the measured voltage. Note that, when the timings when the switch 32 and the switch 32b are turned on are controlled 9 in this way, it is necessary to separately provide the switch 32 and the switch 32b.

Fifteenth Embodiment

Figure 20:
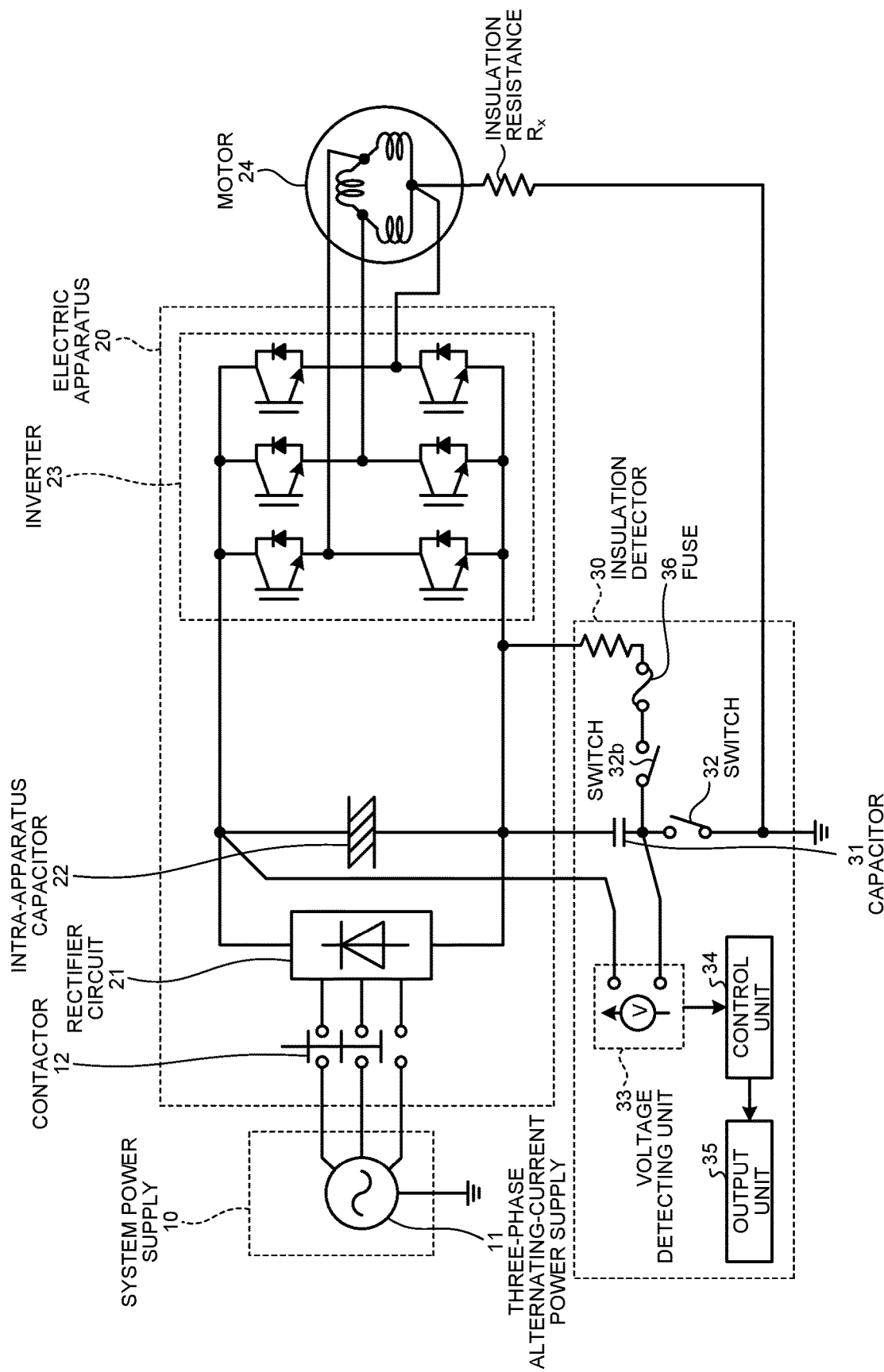
FIG. 20 is a diagram showing an example of the configuration of an insulation detector and an electric apparatus equipped with the insulation detector according to a fifteenth embodiment.

FIG. 20 is a diagram showing an example of the configuration of a fifteenth embodiment of an insulation detector and an electric apparatus equipped with the insulation detector according to the present invention. In the configuration shown in FIG. 20, a fuse 36 is provided between the resistance provided in parallel to the capacitor 31 and the switch 32b in the configuration shown in FIG. 18.

In the configuration shown in FIG. 18, there is time when the switch 32 and the switch 32b simultaneously close. At this point, the N bus is ground-faulted by low resistance provided in parallel to the capacitor 31. Therefore, when the power supply is turned on, the electric apparatus 20 is ground-faulted. If the fuse 36 is provided as shown in FIG. 20, the circuit in the electric apparatus 20 is protected.

Sixteenth Embodiment

Figure 21:
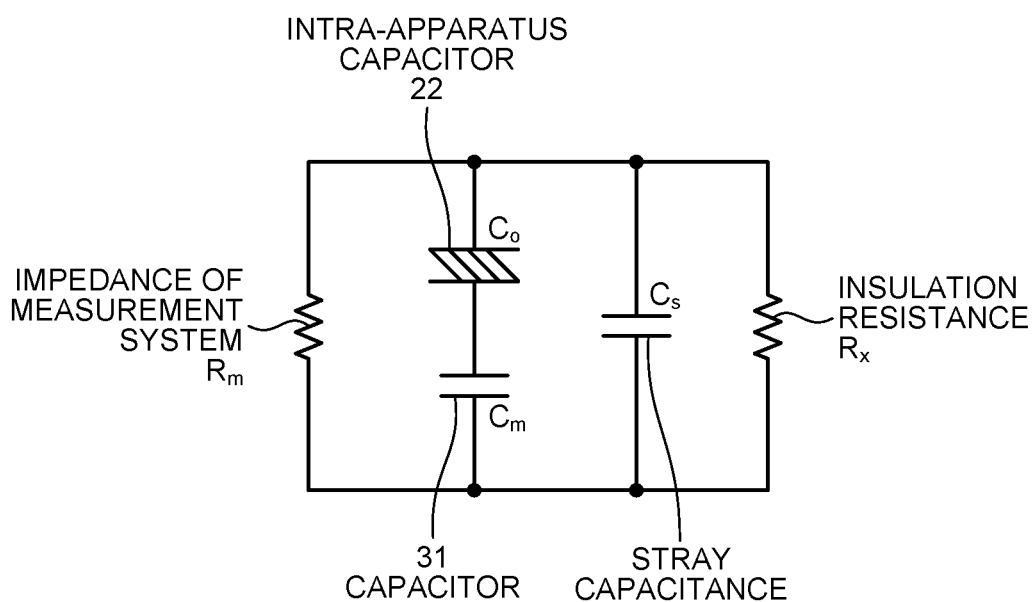
FIG. 21 is a circuit diagram showing insulation resistance measurement according to the fifteenth embodiment with circuit elements for the insulation resistance measurement simply converted into an equivalent circuit.

In this embodiment, the influence of stray capacitance and other stray components on measurement is explained. FIG. 21 is a circuit diagram showing the insulation resistance measurement in the present invention explained above with circuit elements for the insulation resistance measurement simply converted into an equivalent circuit.

In the explanation in the embodiments explained above, it is assumed that the voltage of the intra-apparatus capacitor 22 flows into the capacitor 31 via the insulation resistance $R_x$ and the intra-apparatus capacitor 22 and the capacitor 31 are connected in series. However, as shown in FIG. 21, actually, the circuit includes the stray capacitance $C_s$ shown in FIG. 18 and further includes impedance $R_m$ of a measurement system.

As explained in the fourteenth embodiment, it is assumed that the dominant components of the stray capacitance $C_s$ are present in parallel to the insulation resistance $R_x$ of the motor 24. For example, capacitance between a winding wire of the motor 24 and a housing of the motor 24 is equivalent to the stray capacitance $C_s$. Capacitance between the driving circuit of the electric apparatus 20 including the inverter 23 and the ground or the housing can be represented by the same circuit constant.

The impedance of the measurement system is impedance necessary for voltage measurement. Impedances of a voltmeter and a probe of an oscilloscope are set high for not causing a problem in normal measurement. However, because a resistance value of insulation resistance, which is a measurement target, is also high, the influence of the impedance of the measurement system is large. When the stray capacitance $C_s$ and the impedance $R_m$ of the measurement system are taken into account in this way, a discharge time constant of the circuit shown in FIG. 21 is represented by the following Formula (14).

$$\tau = (C'_m + C_s)\left(\frac{R_x R_m}{R_x + R_m}\right) = \left(\frac{C_0 \cdot C_m}{C_0 + C_m} + C_s\right)\left(\frac{R_x R_m}{R_x + R_m}\right) \tag{14}$$

That is, even if the time constant τ is measured from a voltage change, and the capacitance $C_m$ of the capacitor 31 and the capacitance $C_0$ of the intra-apparatus capacitor 22 are known, in order to learn the insulation resistance $R_x$, the stray capacitance $C_s$ and the impedance $R_m$ of the measurement system have to be clarified. The impedance $R_m$ of the measurement system is a value generally determined when a detection circuit is designed. However, the stray capacitance $C_s$ is a value that can change according to the configuration of an electric apparatus and a state of a cable and, in some case, according to a state of deterioration. Therefore, for accurate measurement of the insulation resistance $R_x$, the stray capacitance $C_s$ needs to be simultaneously measured.

Seventeenth Embodiment

In this embodiment, a measurement method of the stray capacitance $C_s$ is explained. For measurement of the stray capacitance $C_s$, a sudden voltage drop at the time when the waveform shown in FIG. 19 is obtained can be used. According to FIG. 19, a measured voltage decreases from the voltage $V_0$ to $V_0-V_{Cm0}$. Because $V_{Cm0}$ is represented by the above Formula (13), the stray capacitance $C_s$ can be measured. That is, it is possible to measure the stray capacitance $C_s$ at the time of a sudden voltage drop in the beginning in FIG. 19, to measure the time constant τ in an attenuation waveform after that, and to measure the insulation resistance $R_x$ using the above Formula (14) according to the stray capacitance $C_s$ and the time constant τ.

Eighteenth Embodiment

Figure 22:
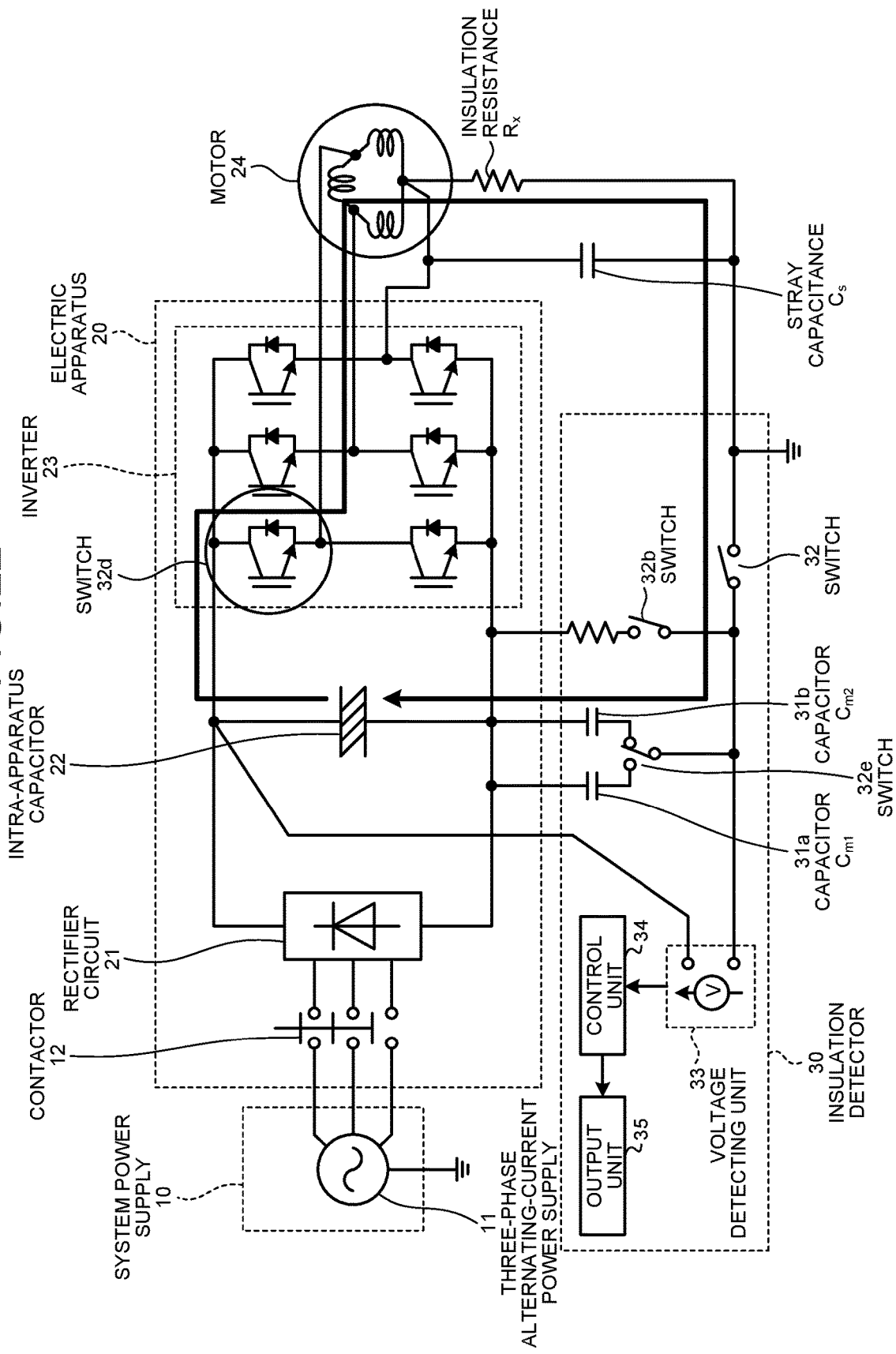
FIG. 22 is a diagram showing an example of the configuration of an insulation detector and an electric apparatus equipped with the insulation detector according to an eighteenth embodiment.

FIG. 22 is a diagram showing an example of the configuration of an eighteenth embodiment of an insulation detector and an electric apparatus equipped with the insulation detector according to the present invention. In the configuration shown in FIG. 22, the insulation detector 30 includes, instead of the capacitor 31, a capacitor 31a and a capacitor 31b connected in parallel. The capacitor 31a and the capacitor 31b can be switched by a switch 32e. The other components are the same as the components shown in FIG. 18.

The capacitance of the capacitor 31a is represented as $C_{m1}$, the capacitance of the capacitor 31b is represented as $C_{m2}$, and combined capacitances of the capacitors 31a and 31b and the intra-apparatus capacitor 22 are respectively represented as $C_{m1}'$ and $C_{m2}'$ according to the above Formula (1). Measurements of the time constants during attenuation of a voltage change are respectively performed using the capacitor 31a and the capacitor 31b. The time constants τ obtained as a result of the measurements are represented as τa and τb. That is, the following Formulas (15) and (16) hold.

$$\tau_a = (C_{ma}' + C_s)\left(\frac{R_x R_m}{R_x + R_m}\right) \quad (15)$$

$$\tau_b = (C_{mb}' + C_s)\left(\frac{R_x + R_m}{R_x + R_m}\right) \quad (16)$$

When the above Formula (16) is subtracted from the above Formula (15), the following Formulas (17) and (18) are obtained.

$$\tau_a - \tau_b = (C_{ma}' - C_{mb}')\left(\frac{R_x R_m}{R_x + R_m}\right) \quad (17)$$

$$R_x = \frac{1}{\frac{(C_{ma}' - C_{mb}')}{(\tau_a - \tau_b)} - \frac{1}{R_m}} \quad (18)$$

That is, by performing the measurement of a time constant twice using the two capacitors, it is made possible to cancel stray capacitance and accurately calculate a value of insulation resistance. As the two capacitors, capacitors having different capacitances can be switched. Capacitors having different capacitances or equal capacitances can be prepared. The capacitances can be changed by changing the number of capacitors connected in parallel.

Two kinds of capacitor capacitances are used here. However, measurement accuracy can be improved by increasing the number of measurements. Three or more times of measurement can be performed using capacitors having three or more kinds of capacitance.

As explained in this embodiment, it is made possible to highly accurately measure a resistance value of the insulation resistance taking into account even the influence of the stray capacitance.

Nineteenth Embodiment

Figure 23:
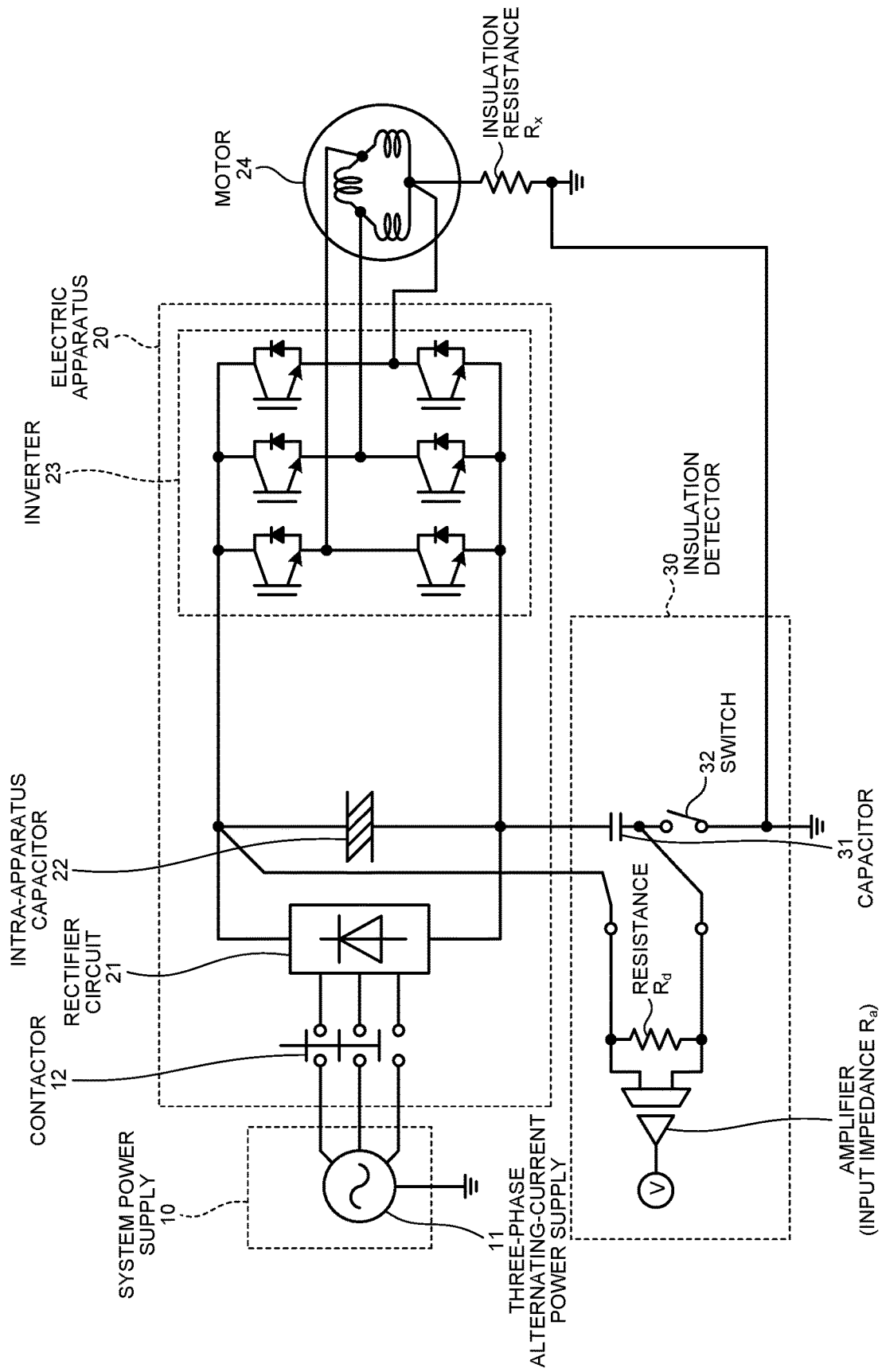
FIG. 23 is a diagram showing a form in which the voltages of an intra-apparatus capacitor and a capacitor connected in series are measured via an amplifier according to a nineteenth embodiment.

In this embodiment, the impedance $R_m$ of the measurement system is explained. FIG. 23 is a diagram showing a form in which the voltages of the intra-apparatus capacitor 22 and the capacitor 31 connected in series is measured via an amplifier in the configuration shown in FIG. 12. The amplifier shown in FIG. 23 is an insulation amplifier. This is for the purpose of converting the voltage of a capacitor having potential different from the potential of a main circuit into the potential of a control system. However, the amplifier is not limited to the insulation amplifier. A normal operational amplifier can be used. An instrumentation amplifier or a differential amplifier for removing noise can also be used. The instrumentation amplifier and the differential amplifier can be combined.

Input impedance of the amplifier shown in FIG. 23 is represented as $R_a$. In this case, for example, the input impedance of the operational amplifier is often high. However, the input impedance of the insulation amplifier is not so high and can change according to, for example, a state of use, temperature, and element variation.

However, as indicated by the above Formula (14), the impedance $R_m$ of the measurement system is desirably higher than the insulation resistance $R_x$, which is the measurement target. If the impedance $R_m$ is extremely low compared with at least the insulation resistance $R_x$, measurement accuracy is extremely low. When the impedance $R_m$ of the measurement system fluctuates, the fluctuation directly affects a measurement result.

Therefore, to allow such fluctuation in the impedance of the measurement system and obtain high measurement accuracy, in FIG. 23, resistance $R_d$ is provided in parallel to an input of the amplifier for measurement. In this case, the impedance $R_m$ of the measurement system is given by the following Formula (19).

$$R_m = \frac{R_a R_d}{R_a + R_d} \quad (19)$$

In the formula, the resistance $R_d$ is set to be smaller than the input impedance $R_a$ of the amplifier and set such that a value of parallel combined resistance of $R_a$ and $R_d$ does not change much even if $R_a$ fluctuates. On the other hand, the impedance $R_m$ of the measurement system should not be set to a too small value compared with the insulation resistance $R_x$ to be measured. Therefore, an amplifier having large input impedance $R_a$ needs to be used. As a first element that receives a voltage, an instrumentation amplifier having large input impedance is desirably used.

Twentieth Embodiment

Figure 24:
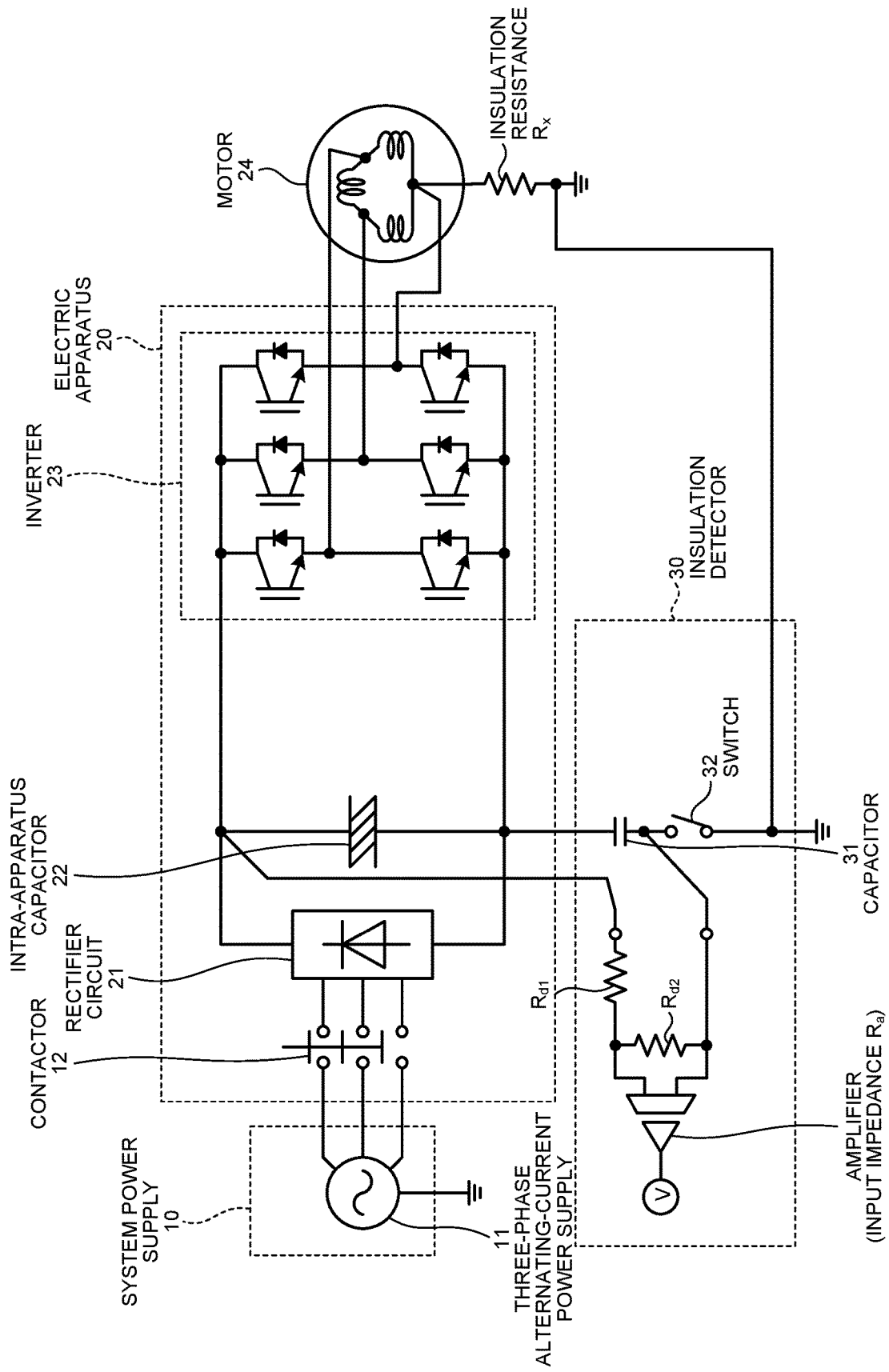
FIG. 24 is a diagram showing a form in which the voltages of an intra-apparatus capacitor and a capacitor connected in series are measured via an amplifier according to a twentieth embodiment.

FIG. 24 shows a modification of FIG. 23. In the configuration explained in the nineteenth embodiment, when a measured voltage is divided, input impedance can be increased.

Because the electric apparatus 20 drives the motor 24, a voltage of approximately several hundred volts is applied between the P and N buses. To receive the voltage with a normal amplifier, the voltage needs to be divided during measurement. In FIG. 24, a voltage of a portion desired to be measured is received by a series of resistance $R_{d1}$ and resistance $R_{d2}$. An amplifier having the input impedance $R_a$ for measurement is connected in parallel to the resistance $R_{d2}$. The impedance $R_m$ of the measurement system at this point is given by the following Formula (20).

$$R_m = R_{d1} + \frac{R_a R_{d2}}{R_a + R_{d2}} \qquad (20)$$

That is, it is made possible to increase the impedance $R_m$ of the measurement system according to a choice of the resistances $R_{d1}$ and $R_{d2}$. However, as in the nineteenth embodiment, assuming that the input impedance $R_a$ fluctuates, $R_{d2}$ is set to a value smaller than $R_a$, for example, 10% or less compared with the impedance $R_m$ of the measurement system. Even if this is taken into account, if a division ratio $(R_{d2}/(R_{d1}+R_{d2}))$ is increased, it is possible to increase the impedance $R_m$ of the measurement system. To suppress fluctuation in a detection value to 5% or less even when the impedance $R_m$ of the measurement system changes to a double because of a temperature change or the like, it is desirable to provide resistance of 10% or less of the impedance of the measurement system in parallel to the measurement system. In this way, the resistance $R_{d2}$ is set smaller than the input impedance $R_a$ enough for making fluctuation in a detection value negligible when the impedance $R_m$ of the measurement system changes according to a temperature change or the like.

Twenty-First Embodiment

Figure 25:
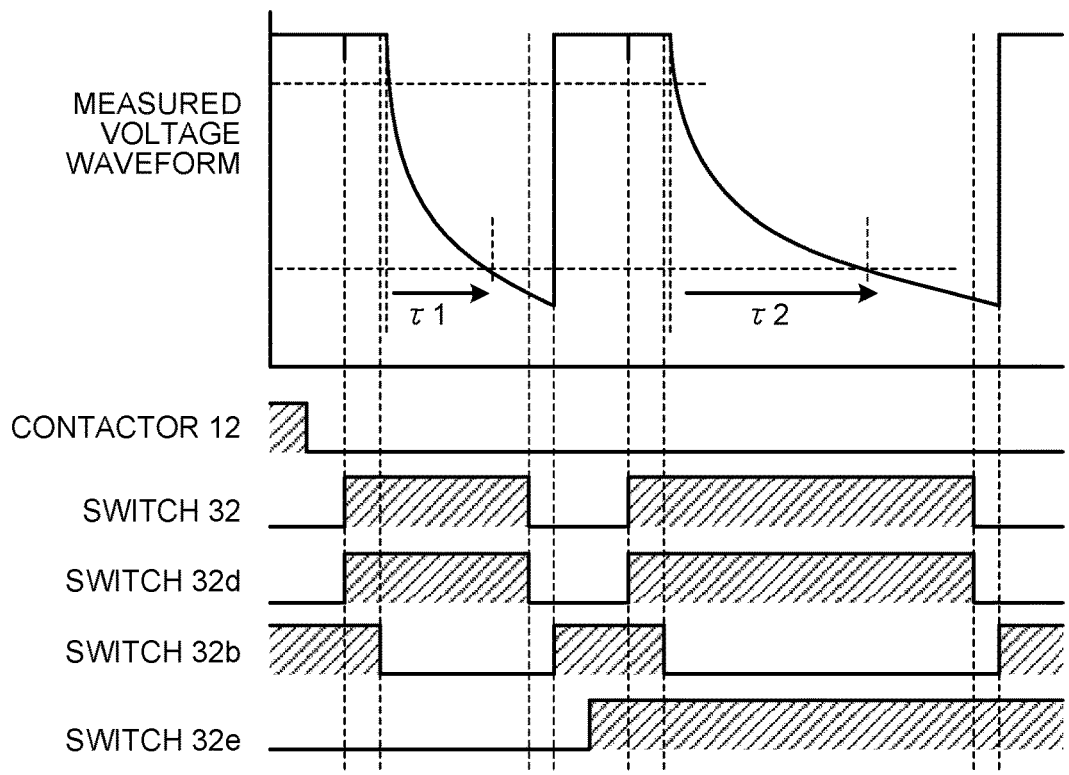
FIG. 25 is a diagram showing a specific sequence during measurement according to a twenty-first embodiment.

In this embodiment, a specific measurement sequence is explained. FIG. 25 is a diagram showing a specific sequence during measurement in preparing two capacitors and performing correction of stray capacitance in the configuration shown in FIG. 22 in the eighteenth embodiment.

In a normal operation state, the contactor 12 is on and the switch 32b is on. When measurement is performed, first, prior to the measurement, the switch 32e is connected to the capacitor 31a side. Subsequently, to disconnect the entire electronic apparatus 20 from the system power supply 10 and set the electric apparatus 20 to indefinite potential, the contactor 12 is turned off. Subsequently, as explained in the fourteenth embodiment, the switch 32 and the switch 32d are closed while the switch 32b is kept closed. Thereafter, when the switch 32b is opened, a measured voltage starts to drop. Thereafter, measurement of a time constant τ1 is performed at timing of an appropriate voltage. After the measurement of the time constant τ1 is completed, the switch 32 and the switch 32d are opened. Consequently, a current path is blocked.

Subsequently, when the switch 32b is closed, the capacitor 31a is short-circuited and the voltage decreases to zero, and the measured voltage returns to the previous voltage. Subsequently, second measurement of a time constant is performed. The switch 32e is switched and connected to the capacitor 31b side to change the capacitance of the capacitor. Thereafter, the switches 32 and 32d are closed and the switch 32b is opened to start measurement of a time constant again and obtain a time constant τ2.

Because a certain degree of an electric current flows in the first measurement, the voltage of the intra-apparatus capacitor 22 slightly decreases from the initial value $V_0$ between the first measurement and the second measurement. However, in general, because the intra-apparatus capacitor 22 has large capacitance, the decrease in the voltage is little. When the method explained in the tenth embodiment is adopted, the influence of the initial value of the voltage on the measurement is small. Therefore, as explained in this embodiment, the second and subsequent measurement can be continuously performed.

Twenty-Second Embodiment

Figure 26:
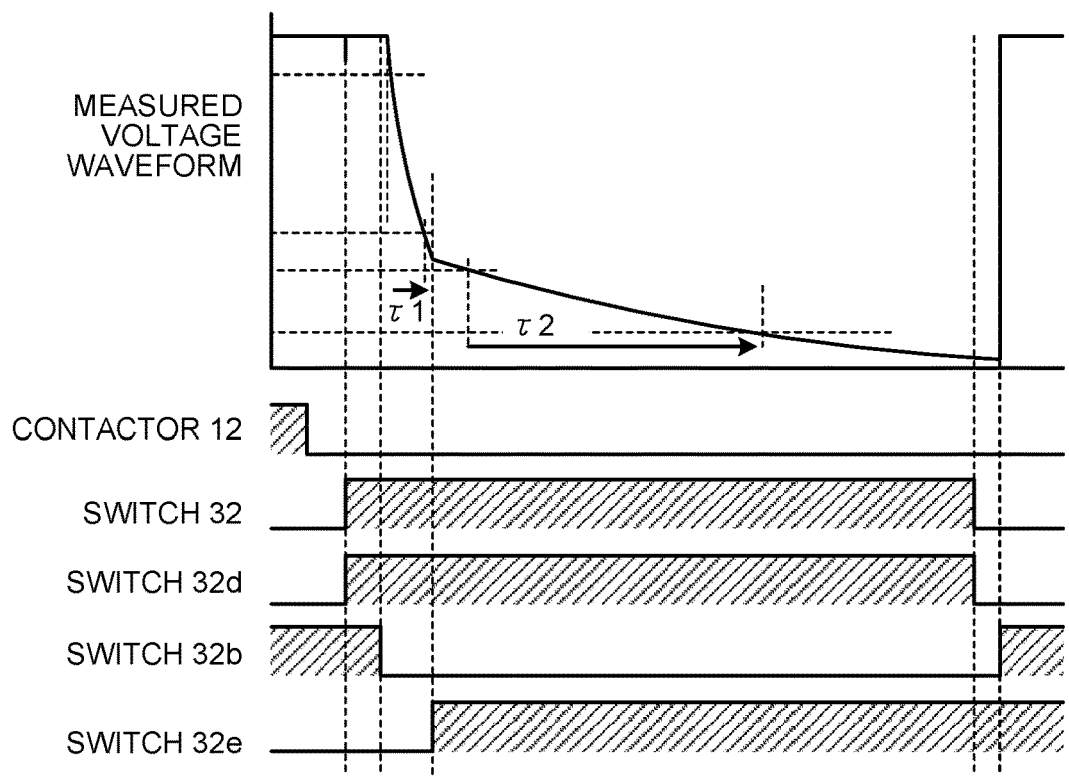
FIG. 26 is a diagram showing a specific sequence during measurement according to a twenty-second embodiment.

FIG. 26 is a diagram showing a method different from the method explained in the twenty-first embodiment, i.e., a specific sequence during measurement in preparing two capacitors and performing correction of stray capacitance in the configuration shown in FIG. 22 in the eighteenth embodiment.

As in the twenty-first embodiment, when measurement is performed, first, prior to the measurement, the switch 32e is connected to the capacitor 31a side, the contactor 12 is turned off, and the switch 32 and the switch 32d are closed. When the switch 32b is opened, a measured voltage starts to drop. Thereafter, measurement of the time constant τ1 is performed at the timing of an appropriate voltage.

After the measurement of the time constant τ1 is completed, the switch 32e is connected to the capacitor 31b side while keeping the state of the switches 32, 32b, and 32d. Then, a voltage at a different time constant starts to be attenuated from a voltage at that point set as an initial value. The time constant is measured to obtain τ2.

According to the measurement in the tenth embodiment, because the measurement of the time constant does not depend on the initial value of the voltage, if a time constant between the voltage V and V/e is measured, the time constant τ=R×C is calculated. The measurement using two stages of attenuation in this way is also possible.

According to this embodiment, it is possible to perform a reduction of a measurement time and simplification of a sequence. On the other hand, because a dynamic range of a voltage is narrowed, it is necessary to take into account measurement accuracy and a method of measurement. In that case, design is facilitated if a more degree of freedom is present concerning the measured voltage at the time constant τ. For example, according to the above Formula (9), time until the voltage $V_4$ decreases to $V_5=V_4/e$ is τ=R×C. However, as indicated by the above Formula (11), it is also made possible to measure τ when the time until the determined voltage is measured. It is sufficient to perform the measurement of the time constant at the determined voltage taking into account measurement accuracy and time required for the measurement and thereafter calculate the time constant τ with an arithmetic operation.

Twenty-Third Embodiment

As insulation resistance, the resistance between the driving circuit itself and the housing of the electric apparatus 20 shown in FIG. 1 and the resistance between the motor 24 and the housing shown in FIG. 9 are conceivable. When a sequence of measurement is utilized, resistance values of the resistances can be respectively calculated.

Figure 27:
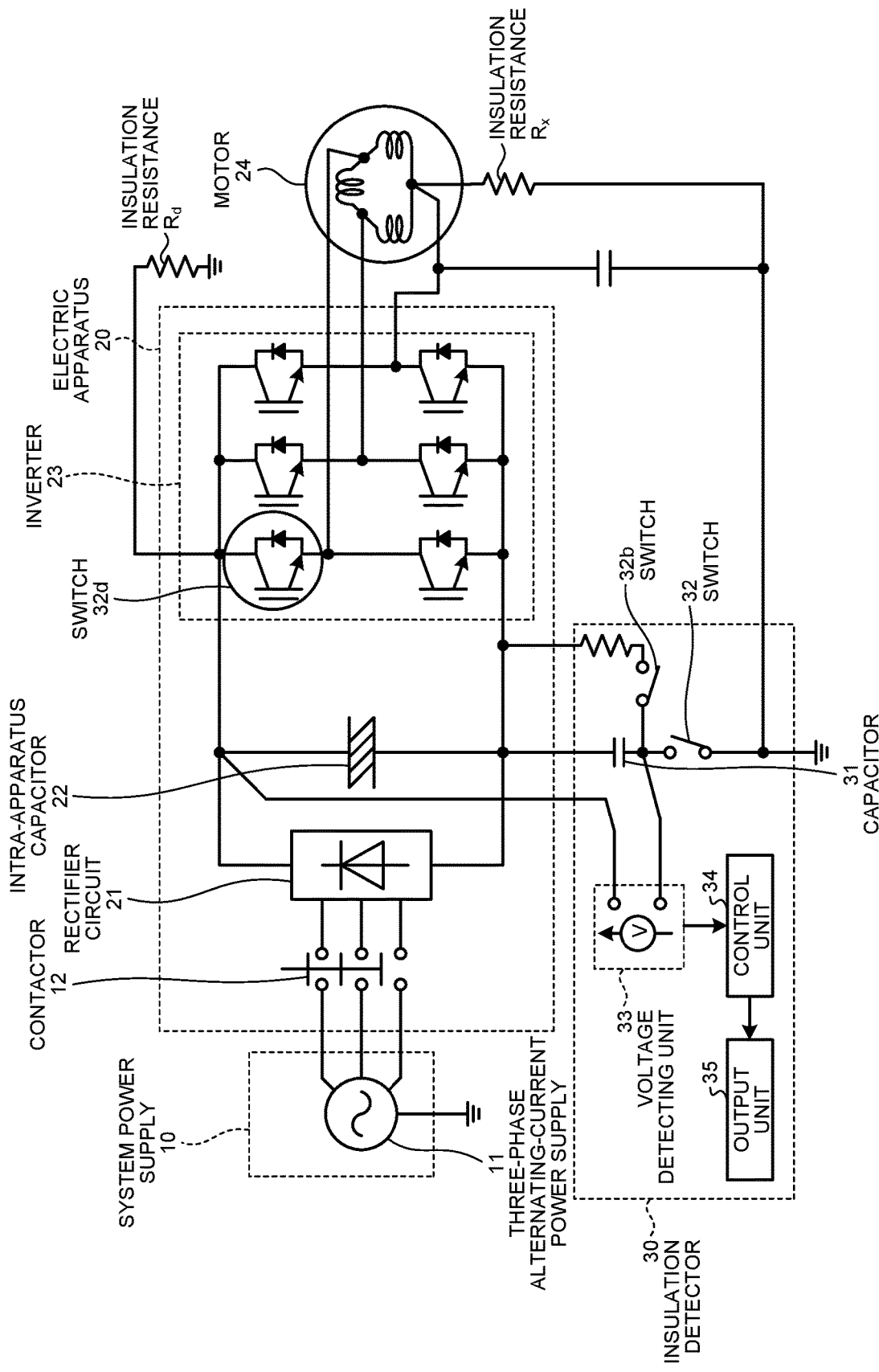
FIG. 27 is a diagram showing an example of the configuration of an insulation detector and an electric apparatus equipped with the insulation detector according to a twenty-third embodiment.
Figure 28:
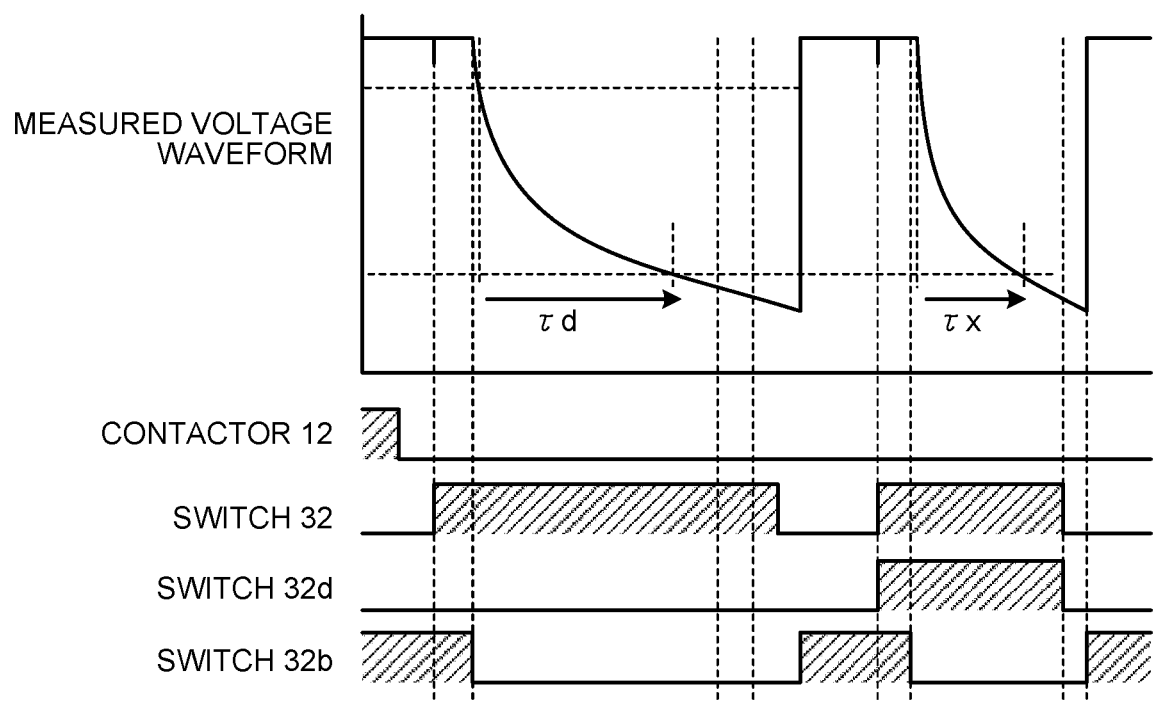
FIG. 28 is a diagram showing a specific sequence during measurement according to the twenty-third embodiment.

FIG. 27 is a diagram showing an example of the configuration of a twenty-third embodiment of an insulation detector and an electric apparatus equipped with the insulation detector according to the present invention. FIG. 28 is a diagram showing a sequence of switching in FIG. 27. Note that, in FIG. 27, one capacitor 31 is provided and parallel resistance is omitted. In the configuration shown in FIG. 27, insulation resistance $R_d$ is present between the P bus in the driving circuit portion of the electric apparatus 20 and the ground or the housing.

First, the contactor 12 is turned off and the switch 32 is closed to form a series circuit including insulation resistance. At this point, if the switch 32 is kept closed, an electric current flows to the insulation resistance $R_d$ of the driving circuit. In this state, the switch 32b is closed to start measurement. A resistance value calculated from a measured time constant td is resistance between the driving circuit and the housing, not including the insulation resistance of the load.

Subsequently, the switch 32b is once closed to discharge the voltage of the capacitor 31, the measured voltage is returned to $V_0$, and the switch 32 and the switch 32d are closed and the switch 32b is opened again to start measurement. Then, this time, an electric current flows to the switch 32d on a path passing through the insulation resistance $R_x$ of the load. However, because the insulation resistance $R_d$ is kept connected, accurately, parallel resistance of the insulation resistance $R_d$ and the insulation resistance $R_x$ is measured. Note that, in the other embodiments explained above, the insulation resistance $R_d$ is large and is not taken into account. Measured time constant τx represents parallel combined resistance of $R_x$ and $R_d$.

Because the insulation resistance $R_d$ is calculated by the first measurement, the insulation resistance $R_d$ and the insulation resistance $R_x$ can be separately measured by the second measurement. For simplification, only one kind of the capacitor 31 is described. However, actually, because it is necessary to correct the stray capacitance to perform accurate measurement, it is desirable to provide two or more capacitors 31 and perform the measurement four times in total, i.e., two times for each of the capacitors 31.

Twenty-Fourth Embodiment

Figure 29:
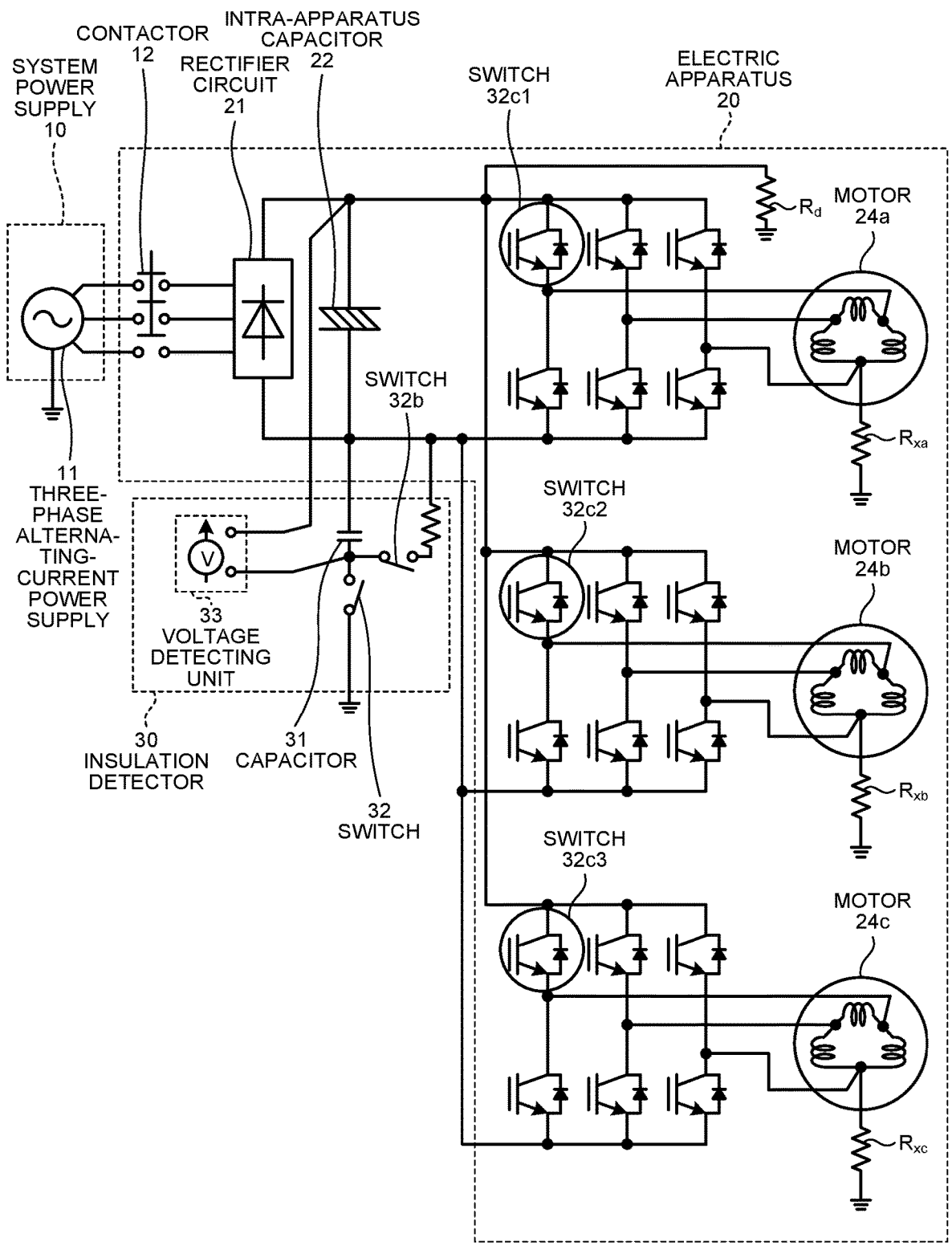
FIG. 29 is a diagram showing an example of the configuration of an insulation detector and an electric apparatus equipped with the insulation detector according to a twenty-fourth embodiment.

FIG. 29 shows a modification of FIG. 27. FIG. 29 shows an example in which a plurality of inverters are connected in parallel to a single power receiving circuit and a rectifier circuit portion configured by a power receiving circuit, a rectifier circuit, the intra-apparatus capacitor 22, and the like and each of the inverters drives corresponding one of separate motors, namely corresponding one of a plurality of motors 24a, 24b, and 24c. In this case, insulation resistances of the respective motors can be measured by a single insulation resistance detecting mechanism provided in the intra-apparatus capacitor 22.

Figure 30:
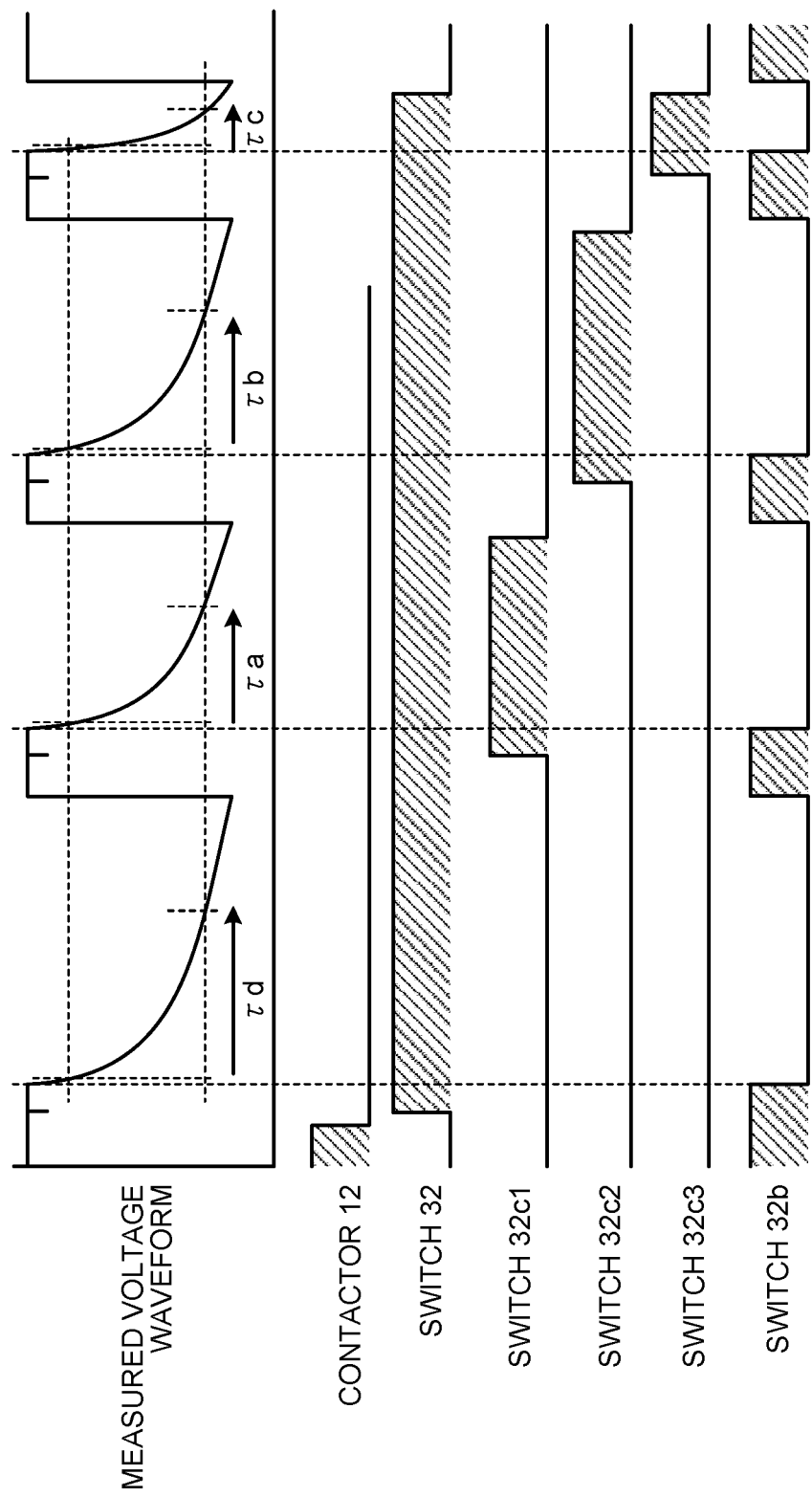
FIG. 30 is a diagram showing a specific sequence during measurement according to the twenty-fourth embodiment.

FIG. 30 is a diagram showing a sequence of switching in FIG. 29. Switches and a sequence of measurement are shown in FIG. 30. First, the contactor 12 is turned off and the switch 32 is closed. In FIG. 30, the insulation resistance $R_d$ of the driving circuit is measured first. Therefore, switches 32c1, 32c2, and 32c3 on an inverter side are not operated and kept opened. The switch 32 is opened to start the measurement. When the time constant τd can be measured by the measurement, the switch 32 is closed once to return the voltage to $V_0$. At this point, the switch 32 can be kept closed as shown in FIG. 30 or can be opened while the measurement is not performed as shown in FIG. 25.

Subsequently, insulation resistance $R_{xa}$ of the motor 24a is measured. The switch 32c1 is closed to form a current path of an electric current flowing to the motor. The switch 32 is then opened to start the measurement and measure the time constant τa. In this measurement, a value of parallel resistance of the insulation resistance $R_{xa}$ of the motor 24a and the insulation resistance $R_d$ of the circuit is obtained. In this way, it is possible to sequentially close the switches 32c2 and 32c3 to measure a time constant of a voltage change and measure the insulation resistances $R_{xb}$ and $R_{xc}$ of each of the motors.

Note that, although the insulation resistance $R_d$ of the circuit is measured, when it is evident that the insulation resistance $R_d$ is large compared with the resistances of the motors 24a, 24b, and 24c and the measurement of the insulation resistance $R_d$ is unnecessary, the measurement of the insulation resistance $R_d$ does not have to be performed.

Twenty-Fifth Embodiment

Figure 31:
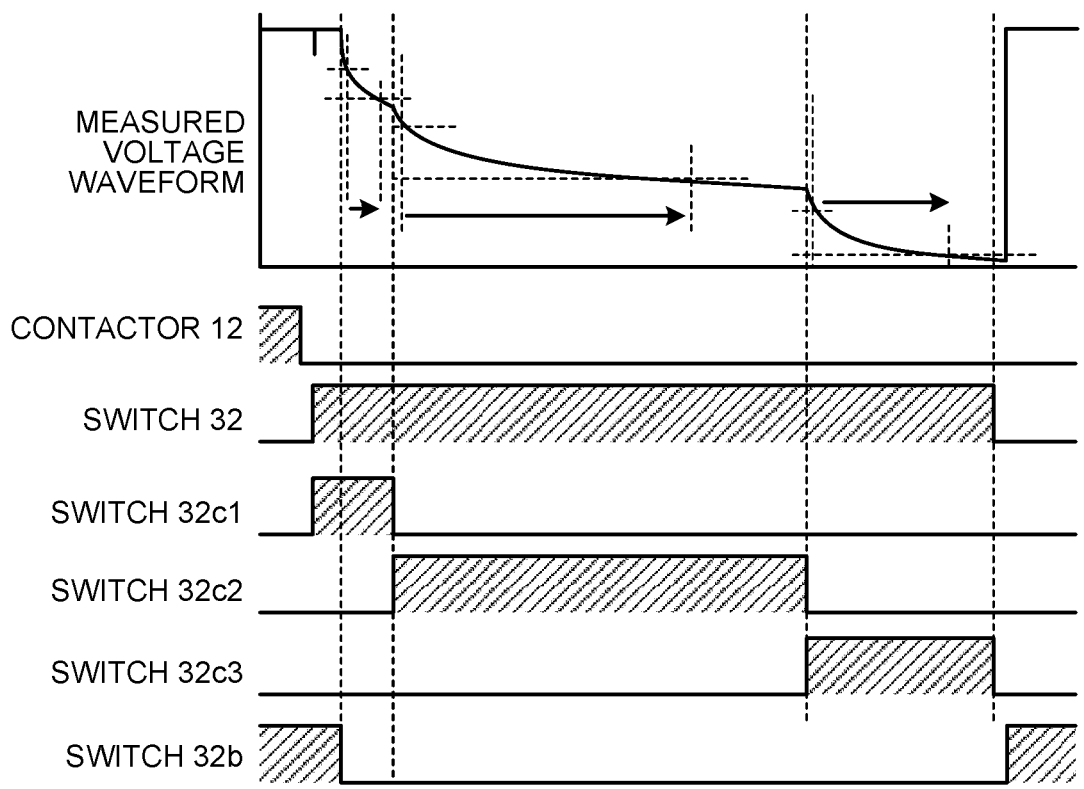
FIG. 31 is a diagram showing a specific sequence during measurement according to a twenty-fifth embodiment.

FIG. 31 is another example of the detection sequence in the electric apparatus 20 configured by the plurality of inverters and the motors as shown in FIG. 29. When the electric apparatus 20 is operated as shown in FIG. 30, a considerably long measurement time is necessary when a large number of motors are present. Therefore, it is possible to end a plurality of kinds of measurement at a time by switching a current path during a decrease in a voltage without discharging the capacitor 31 in every time of measurement. That is, first, the switch 32c1 is closed to perform measurement of the insulation resistance $R_{xa}$ and thereafter the switch 32c1 is opened and the switch 32c2 is closed to perform measurement of the insulation resistance $R_{xb}$. Because the measurement is performed with a narrow voltage change, it is likely that measurement accuracy is deteriorated. However, it is made possible to perform the measurement in a short time.

Twenty-Sixth Embodiment

Figure 32:
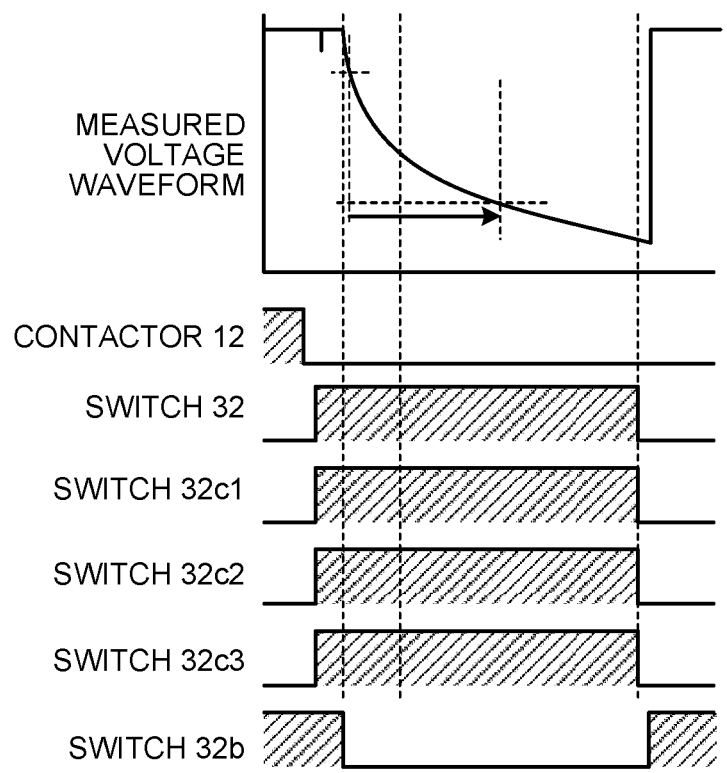
FIG. 32 is a diagram showing a specific sequence during measurement according to a twenty-sixth embodiment.

FIG. 32 shows still another measurement sequence of the configuration shown in FIG. 29. During the measurement, the three switches, i.e., the switches 32c1, 32c2, and 32c3 are simultaneously closed. By performing the measurement shown in FIG. 32, although the values of each of the insulation resistances $R_{xa}$, $R_{xb}$, and $R_{xc}$ cannot be measured, a value of parallel combined resistance of the insulation resistances, that is, the insulation resistance of the entire apparatus can be measured by a simple method in a short time.

The measurement shown in FIG. 32 is suitable for monitoring of the insulation resistance of the entire apparatus. For example, in normal periodical measurement of insulation resistance, the measurement shown in FIG. 32 is performed to check whether the entire apparatus has a problem. When it is found as a result of the measurement that a resistance value of the entire apparatus is small and there is a problem in insulation of some portion of the apparatus, for example, it is conceivable to perform operation for diagnosing each of the insulation resistances in the sequence shown in FIG. 30 to clarify a part where the problem occurs. That is, it is possible to accurately perform periodical monitoring of insulation resistance and an analysis of a problem part during the problem occurrence by concurrently using different sequences.

Twenty-Seventh Embodiment

Figure 33:
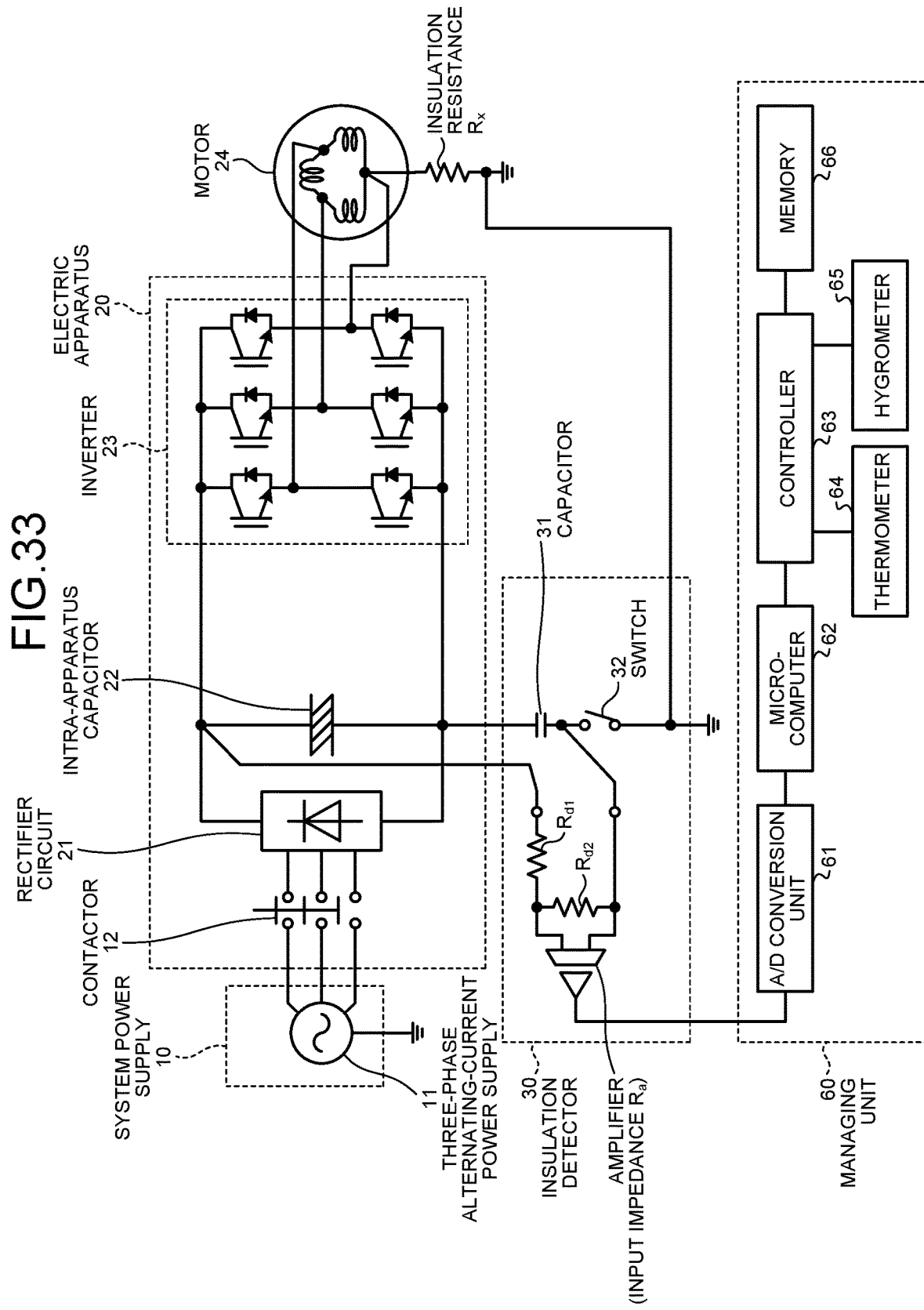
FIG. 33 is a diagram showing an example of the configuration of an insulation detector and an electric apparatus equipped with the insulation detector according to a twenty-seventh embodiment.

FIG. 33 is a diagram showing a configuration in which a managing unit 60 that records and manages a value of measured insulation resistance for a long time is added to FIG. 23. FIG. 33 is also considered to be a figure showing the detailed configuration of the control unit 34 and the output unit 35.

Insulation resistance varies because of an environment, for example, temperature and humidity. Aged deterioration worsens for an extremely long time. Therefore, it is possible to perform a more accurate diagnosis with fewer malfunctions by notifying every diagnosis result to an external controller (an NC (Numerical Control) controller, which is a numerical control controller, or a host controller) and monitoring a change for a long time.

After being converted into digital data by an A/D conversion unit 61, a measured value is input to a microcomputer 62. After an arithmetic operation, a measured value of insulation resistance is obtained. The measured value obtained in this way is displayed on a not-shown monitor. When the measured value is equal to or larger than a setting value, for example, this only has to be informed by displaying a warning message or emitting warning sound.

Further, as shown in FIG. 33, it is desirable to transmit the measured value of the insulation resistance to an NC controller, which is a numerical control controller, or a controller 63, which is a host controller of the NC controller, and accumulate the measured value in a memory 66.

The measured value of the insulation resistance is extremely high during a normal operation and can greatly fluctuate because of a measurement error. Therefore, by monitoring the fluctuation in a long time, it is possible to observe deterioration in a long time of insulation resistance of a load and perform determination with high reliability.

Further, as shown in FIG. 33, a thermometer 64 or a hygrometer 65 is provided and measurement data of the meter is simultaneously associated and recorded to make it possible to grasp a tendency. Then, it is made possible to perform a diagnosis with higher accuracy and higher reliability.

Twenty-Eighth Embodiment

Figure 34:
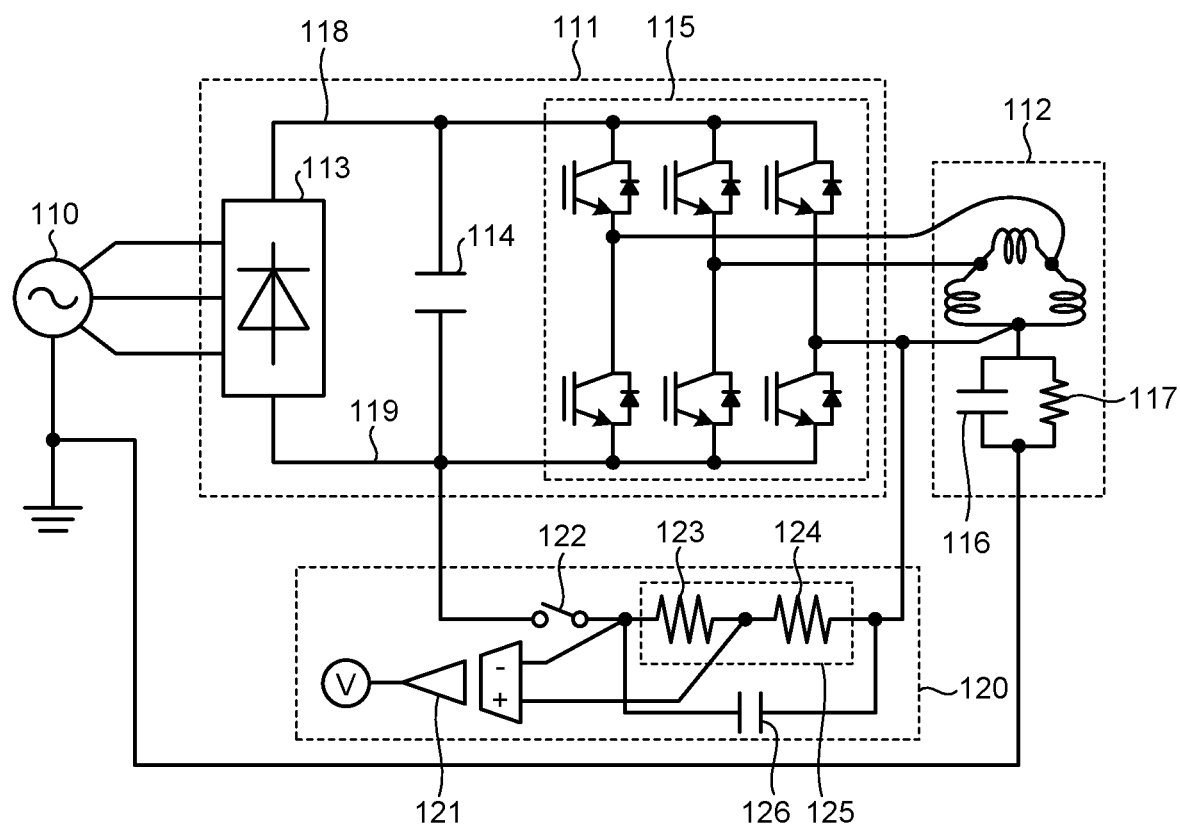
FIG. 34 is a diagram showing an example of the configuration of an insulation detector and the configuration of an electric apparatus to which the insulation detector is connected according to a twenty-eighth embodiment.

FIG. 34 is a diagram showing an example of the configuration of an insulation detector and the configuration of an electric apparatus equipped to which the insulation detector is connected according to a twenty-eighth embodiment of the present invention. An electric apparatus 111 shown in FIG. 34 includes a rectifier circuit 113 that is disposed between a three-phase alternating-current power supply 110 and a motor 112, which is a load, and converts an alternating-current voltage from the three-phase alternating-current power supply 110 into a direct-current voltage, an inverter 115 that is connected in a post stage of the rectifier circuit 113 and drives the motor 112, which is the load, and a smoothing capacitor 114 connected in parallel between the rectifier circuit 113 and the inverter 115. The motor 112 is driven by the electric apparatus 111 and includes a stray capacitor 116 and an insulation resistor 117 to the ground. Note that, in FIG. 34, the motor 112 is connected to the electric apparatus 111. However, the present invention is not limited to this. The motor 112 can be included in the electric apparatus 111.

The electric apparatus 111 shown in FIG. 34 converts a direct-current voltage, which is converted by the rectifier circuit 113 and the smoothing capacitor 114, into an alternating-current waveform with the inverter 115 to drive the motor 112. An insulation detector 120 includes a voltage dividing resistor 124 for dividing a voltage with insulation resistor 117 of the motor 112, which is the load, a detection resistor 123 that detects a voltage applied to the voltage dividing resistor 124, a voltage detector 121 that measures the voltage of the detection resistor 123, and a measurement capacitor 126 provided in parallel to the voltage dividing resistor 124 and the detection resistor 123. A measurement resistor 125 has a configuration in which the detection resistor 123 and the voltage dividing resistor 124 are connected in series. That is, the insulation detector 120 has a configuration in which the measurement resistor 125 and the measurement capacitor 126 are connected in parallel. The measurement resistor 125 has the configuration in which the detection resistor 123 and the voltage dividing resistor 124 are connected in series.

The detection resistor 123 is small compared with the voltage dividing resistor 124. The voltage dividing resistor 124 divides an applied voltage together with the insulation resistor 117, which is a measurement target. The detection resistor 123 converts a part of the divided voltage into, for example, a voltage suitable for an operational amplifier. One end of the insulation detector 120 is connected to an output line of the inverter 115, that is, a winding wire of the motor 112. The other end is connected to an N bus 119 of the inverter 115 via a switch 122.

Figure 35:
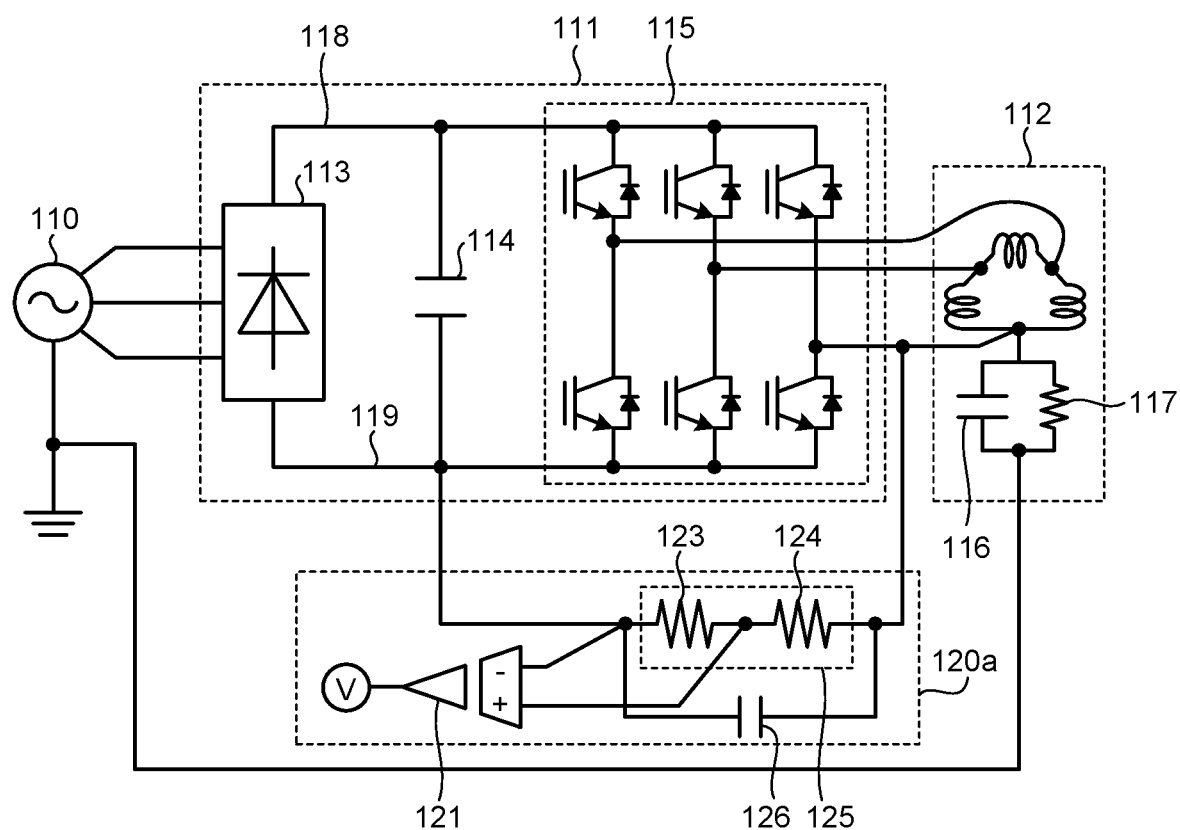
FIG. 35 is a diagram showing an example of the configuration of the insulation detector and the configuration of the electric apparatus to which the insulation detector is connected according to the twenty-eighth embodiment.

FIG. 35 shows a configuration in which the switch 122 for connecting the detection circuit 120 in FIG. 34 is not provided. In the configuration shown in FIG. 35, because a voltage is applied to the motor 112 during a motor operation, a feeble current always flows to a detection circuit 120a. To suppress this feeble current, the voltage dividing resistor 124 needs to have a sufficiently large resistance value. The measurement capacitor 126 connected in parallel needs to have relatively small capacitance. In the configuration shown in FIG. 35, when the motor stops and all elements of the inverter are turned off, a measuring operation is started. When the inverter is turned off, like a voltage shown in FIG. 41, the voltage gradually approaches an asymptotic voltage value $V_a$, which is a steady value. When the asymptotic voltage value $V_a$ is measured, the insulation resistance of the motor can be measured. In the configuration shown in FIG. 35, because an electric current continues to flow to the measurement capacitor 126 during the operation of the motor, the measurement capacitor 126 cannot be a capacitor having large capacitance, and a measurement range is limited. However, because it is unnecessary to provide a switch, the configuration can be simplified. Note that the configuration in which the switch is not provided is also possible in other insulation detectors or electric apparatus equipped with the insulation detectors explained below.

Figure 36:
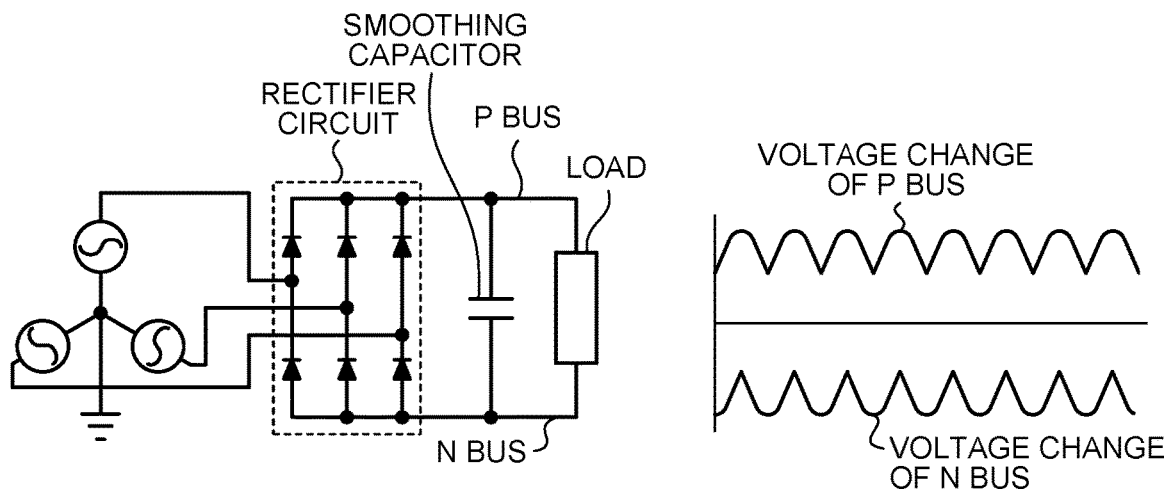
FIG. 36 is a diagram showing an example of a configuration in which an alternating-current power supply, a rectifier circuit, a smoothing capacitor, and a load are connected in the twenty-eighth embodiment.
Figure 37:
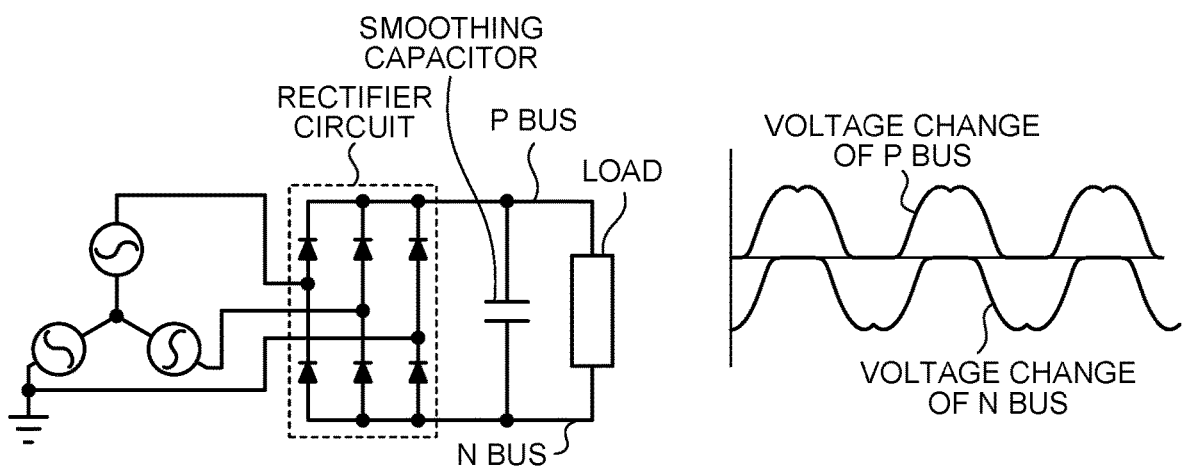
FIG. 37 is a diagram showing an example of the configuration in which the alternating-current power supply, the rectifier circuit, the smoothing capacitor, and the load are connected in the twenty-eighth embodiment.
Figure 38:
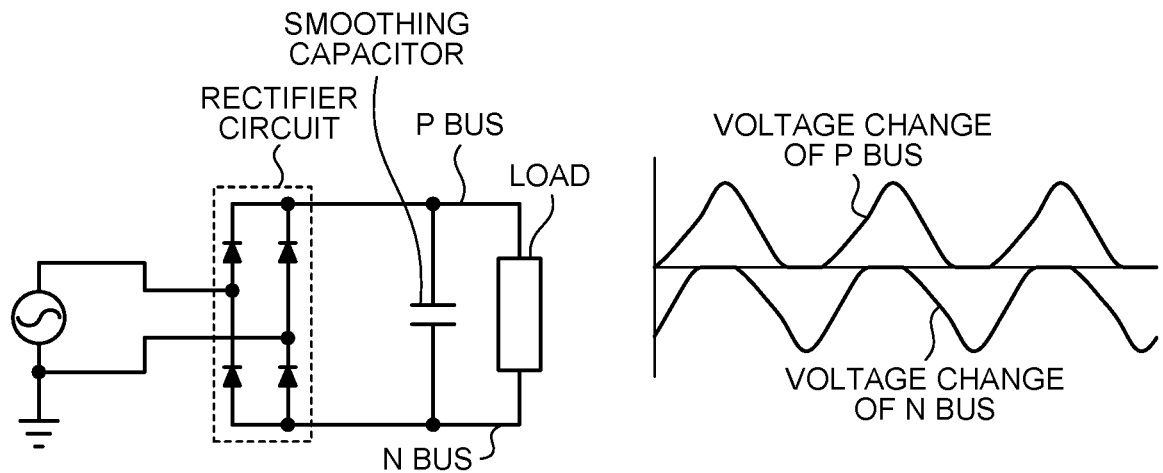
FIG. 38 is a diagram showing an example of the configuration in which the alternating-current power supply, the rectifier circuit, the smoothing capacitor, and the load are connected in the twenty-eighth embodiment.

FIGS. 36, 37, and 38 are diagrams showing an example of a configuration in which an alternating-current power supply, a rectifier circuit, a smoothing capacitor, and a load are connected and a voltage change across both ends of the smoothing capacitor, that is, to the ground of a P bus and an N bus. In the configuration shown in FIG. 36, a received three-phase alternating current is subjected to three-phase full-wave rectification by the rectifier circuit. A rectified output is smoothed by the smoothing capacitor and applied to the load. A three-phase alternating-current power supply shown in FIG. 36 is Y-connection, and a neutral point of the Y-connection is grounded. In FIG. 36, the voltages of the P bus and the N bus change at a triple frequency of the frequency of the alternating-current power supply. However, a positive voltage having a relatively narrow fluctuation width is maintained on the P side and a negative voltage is maintained on the N side.

A three-phase alternating-current power supply shown in FIG. 37 is V-connection. One phase of a three-phase alternating current is grounded. As shown in FIG. 37, in the case of the V-connection, the P bus has a positive voltage on average and the N bus has a negative voltage on average. However, there is a time at which the voltages become zero. That is, in the V-connection, both of voltage waveforms applied to the P bus and the N bus are pulse waveforms. In the configuration shown in FIG. 36, a frequency of a change in the voltage waveforms of the P bus and the N bus is a triple of an alternating-current frequency of power reception. However, in the configuration shown in FIG. 37, the frequency of a change in the voltage waveforms of the P bus and the N bus is equal to the alternating-current frequency of power reception.

An alternating-current power supply shown in FIG. 38 is a single phase. As shown in FIG. 38, in a single-phase alternating current, one phase is often grounded. However, in FIG. 38, as in the case of the V-connection, voltage waveforms of the P bus and the N bus are pulse waveforms having a time at which the voltage waveforms become zero. In the configuration shown in FIG. 38 as well, a frequency of a change in the voltage waveforms of the P bus and the N bus is equal to a power reception frequency.

When such pulse waveforms are applied, if the load is a simple resistance, the pulse waves are directly divided and measured. However, if the load is an apparatus, for example, if the load is a motor, the load often has a capacitance component to the ground. Then, a pulse repeats charging in and discharging from the capacitance component, and measurement of insulation resistance by a division of resistance voltage cannot be performed.

Therefore, in the configuration shown in FIG. 34, problems that occur in such a circuit configuration can be solved by the measurement capacitor 126.

Note that, in FIG. 34, the insulation detector 120 is externally connected to the electric apparatus 111. However, the present invention is not limited to this. The insulation detector 120 can be included in the electric apparatus 111.

The operation of the configuration shown in FIG. 34 is explained. The insulation detector 120 does not operate and the switch 122 is off during the operation of the motor 112. When insulation detection is performed, first, the operation of the inverter 115 is stopped to stop the motor 112 and turn on the switch 122. The three-phase alternating-current power supply 110 is in a connected state. Therefore, voltages having voltage waveforms shown in FIGS. 36, 37, and 38 are applied to the N bus 119. A negative voltage with respect to the ground on average can be considered to be applied to the N bus 119. Therefore, when the switch 122 is turned on, the measurement resistor 125 and the insulation resistor 117 are connected in series between the N bus 119 and the ground. The voltage of the N bus 119 is divided by the two resistances. When it is assumed that a constant direct-current voltage is applied to the N bus 119, the direct-current voltage is divided by these resistances, and the constant direct-current voltage appears in the detection resistor 123 as well. Therefore, when the voltage of the detection resistor 123 is detected and compared with the voltage of the N bus 119, the resistance value of the insulation resistor 117 can be learned.

Figure 39:
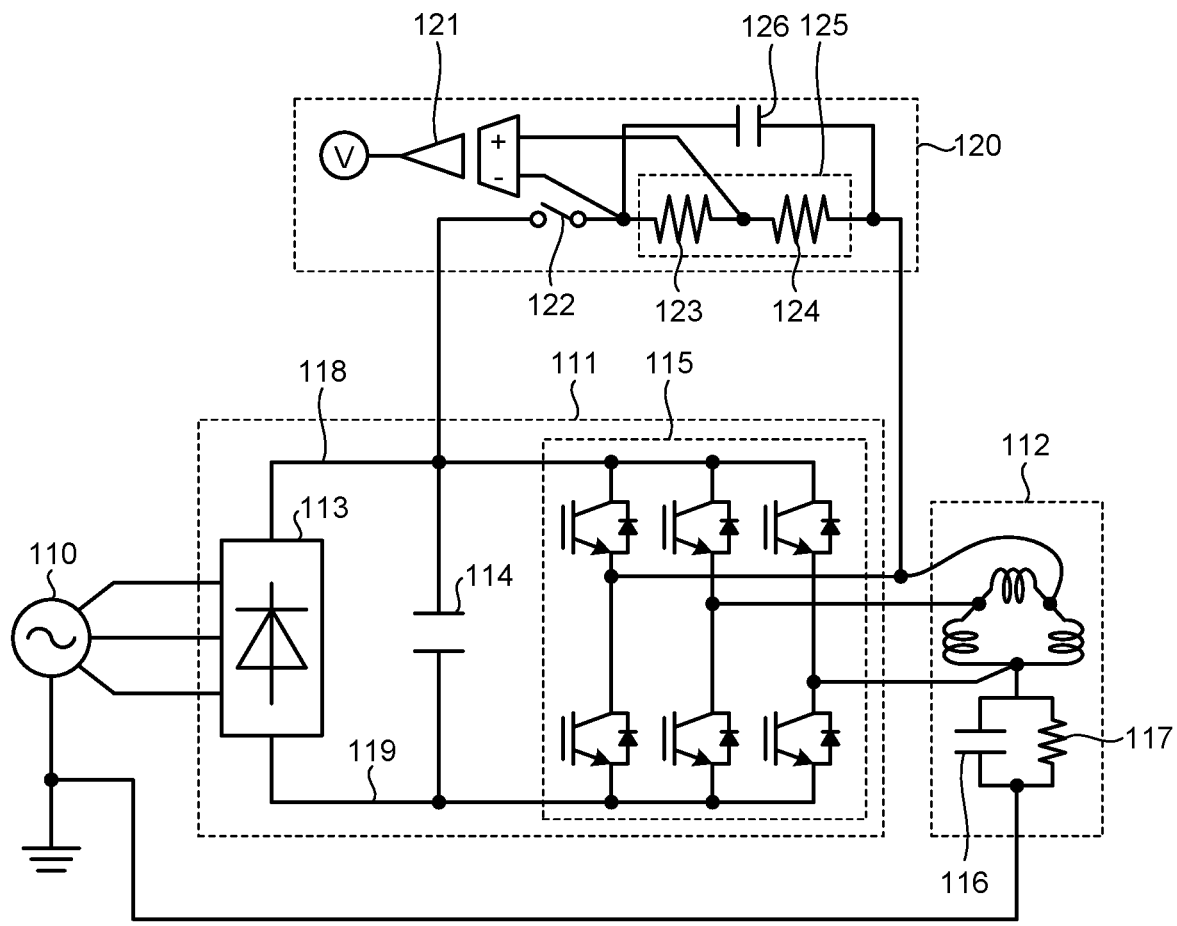
FIG. 39 is a diagram showing an example of the configuration of the insulation detector and the configuration of the electric apparatus to which the insulation detector is connected according to the twenty-eighth embodiment.

FIG. 39 is a diagram showing an example of the configuration of an insulation detector and the configuration of an electric apparatus equipped to which the insulation detector is connected according to the twenty-eighth embodiment of the present invention. The configuration shown in FIG. 39 is a modification of the configuration shown in FIG. 34. In FIG. 34, the insulation detector 120 is connected to the N bus 119 side. However, in FIG. 39, the insulation detector 120 is connected to the P bus 118 side.

In the configuration shown in FIG. 39, because the measurement capacitor 126 is provided, a change immediately after the switch 122 is turned on is different from the change in the configuration in which the measurement capacitor 126 is not provided. That is, at an instance when the switch 122 is turned on, no electric current flows to the measurement resistor 125 and the insulation resistor 117. First, a direct-current voltage is divided by the measurement capacitor 126 and the stray capacitor 116 and rises a little. Thereafter, the direct-current voltage gently approaches an asymptotic voltage value.

Figure 40:
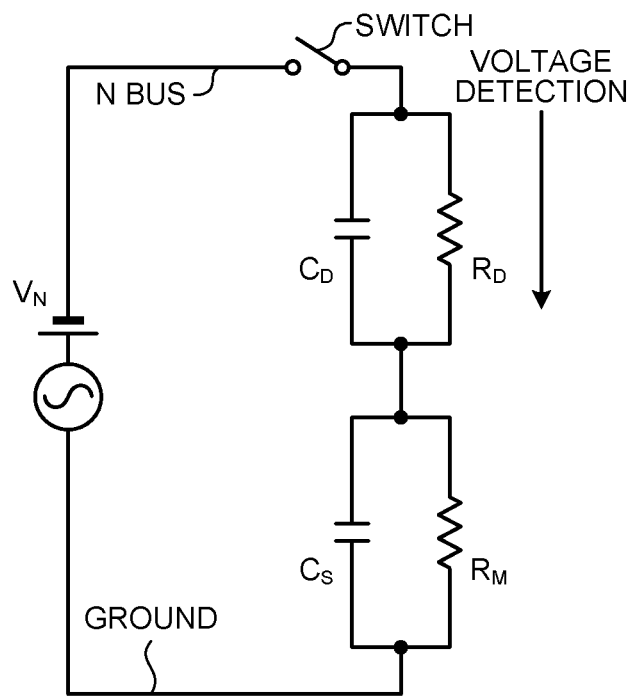
FIG. 40 is a diagram showing an equivalent circuit during insulation detection of a circuit configuration shown in FIG. 34 in the twenty-eighth embodiment.

FIG. 40 is a diagram showing an equivalent circuit during insulation detection of the circuit configuration shown in FIG. 34. A negative direct-current component $V_N$ based on the ground and an alternating-current fluctuation component are equivalently applied to the N bus. A value of the negative direct-current component $V_N$ is a half of a value of the direct-current voltage after rectification, that is, a voltage value $V_{01}$ applied to the smoothing capacitor 114 and is represented by the following Formula (21).

$$V_N = \frac{V_{01}}{2} \tag{21}$$

Insulation resistance $R_M$ and measurement resistance $R_D$ are connected in series between the N bus and the ground. The stray capacitance $C_s$ is present in parallel to the insulation resistance $R_M$. A measurement capacitor $C_D$ is provided in parallel to the measurement resistance $R_D$. Note that the insulation resistance $R_M$ shown in FIG. 40 is equivalent to the insulation resistor 117 shown in FIG. 34. The measurement resistance $R_D$ is equivalent to the measurement resistor 125 shown in FIG. 34. The stray capacitance $C_s$ is equivalent to the stray capacitor 116 shown in FIG. 34. The measurement capacitor $C_D$ is equivalent to the measurement capacitor 126. A switch is equivalent to the switch 122.

Figure 41:
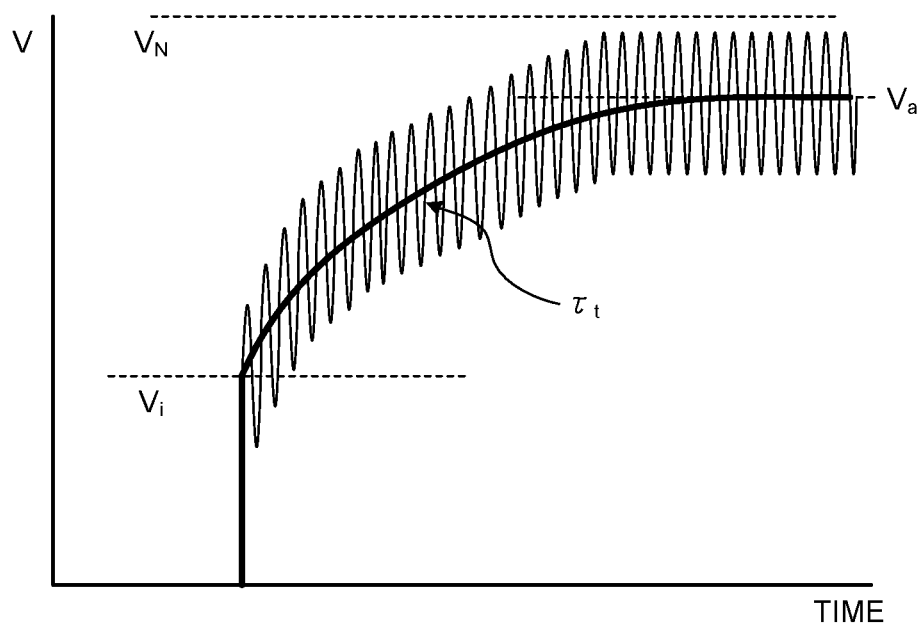
FIG. 41 is a diagram showing a temporal change of a voltage waveform across both ends of measurement resistance, which is an example of a typical measurement waveform in the equivalent circuit shown in FIG. 40 in the eighth embodiment.

FIG. 41 is a diagram showing a temporal change of a voltage waveform across both ends of the measurement resistance $R_D$, which is an example of a typical measurement waveform in the equivalent circuit shown in FIG. 40. A voltage V is a voltage across both ends of the measurement resistance $R_D=R_k+R_h$ represented using voltage dividing resistance $R_h$ from a voltage detected across both ends of detection resistance $R_k$. Note that the detection resistance $R_k$ is equivalent to the detection resistor 123 shown in FIG. 34. The voltage dividing resistance $R_h$ is equivalent to the voltage dividing resistor 124 shown in FIG. 34. Because a value of the voltage dividing resistance $R_h$ is known, when a value of the detection resistance $R_k$ is detected, a value across both the ends of measurement resistance $R_D$ can be measured.

First, before the switch is turned on, the measurement capacitor $C_D$ is discharged to reduce a voltage across both ends of the measurement capacitor $C_D$ to zero. When the switch is turned on, because resistance values of the insulation resistance $R_M$ and the measurement resistance $R_D$ are relatively large, at an instance when the switch is turned on, the voltage V is divided by the measurement capacitor $C_D$ and the stray capacitance $C_s$ and rises to a voltage value $V_i$. If initial voltages of the measurement capacitor $C_D$ and the stray capacitance $C_s$ are zero, the voltage value $V_i$ is represented by the following Formula (22).

$$V_i = \frac{C_S}{C_D + C_S} V_N \tag{22}$$

Subsequently, the voltage V gently changes at a certain time constant t according to a resistance component and a capacitance component of the circuit and approaches the asymptotic voltage value $V_a$ determined by a divided voltage of resistance. An applied voltage includes not only the negative direct-current component $V_N$ but also the alternating-current fluctuation component. Therefore, as shown in FIG. 41, an alternating-current fluctuation component indicated by a thin line and a component gently approaching the asymptotic voltage value $V_a$ indicated by a thick line are present in a voltage waveform. The alternating-current fluctuation component is removed and only a change in the thick line shown in FIG. 41 is focused on. The asymptotic voltage value $V_a$ is represented by the following Formula (23).

$$V_a = \frac{R_D}{R_D + R_M} V_N \tag{23}$$

The negative direct-current component $V_N$ and the measurement resistance $R_D$ are known values. Therefore, the insulation resistance $R_M$ is represented by the following Formula (24) using the asymptotic voltage value $V_a$.

$$R_M = \frac{V_N - V_a}{V_a} R_D \tag{24}$$

A function V(t) of the voltage V representing a curve of a change in the voltage V from the voltage value $V_i$ to the asymptotic voltage value $V_a$ shown in FIG. 41 is an exponential attenuation curve of a single time constant in the equivalent circuit shown in FIG. 40 and is represented by the following Formula (25).

$$V(t) = V_a - (V_a - V_i)\exp\left(-\frac{t}{\tau_t}\right) \tag{25}$$

The time constant $\tau_t$ is represented by the following Formula (26).

$$\tau_t = (C_D + C_S)\left(\frac{R_D R_M}{R_D + R_M}\right) \tag{26}$$

According to the above Formula (26), the curve is an ascending curve in the case of $V_a > V_i$ and is a descending curve in the case of $V_i > V_a$.

In the measurement, the alternating-current fluctuation component is removed and the asymptotic voltage value Va is calculated while only the thick line shown in FIG. 41 is detected. For that purpose, a filter circuit only has to be provided in the insulation detector 120 or an alternating-current waveform only has to be numerically averaged. For the filter circuit, a low-pass filter for removing a high-frequency component or a notch filter for removing only a power supply frequency can be raised.

A problem is explained in which the measurement cannot be performed because of the alternating-current fluctuation component. When the amplitude of an alternating-current component is large and a zero or negative voltage is instantaneously applied to the measurement resistance $R_D$, a reflux diode of a lower arm of the inverter 115 in the circuit shown in FIG. 34 is turned on. When an electric current flows through such a path, an asymptotic point of an average of voltage changes is not correctly represented by divided voltages of the insulation resistance $R_M$ and the measurement resistance $R_D$, and the insulation resistor 117 cannot be detected. That is, to enable the measurement, a voltage including the alternating-current fluctuation component needs to be zero or more. Therefore, in a circuit configuration in which the measurement capacitor 126 is not provided, the measurement cannot be performed when the potential of the N bus changes.

As explained above, a difference between the configuration shown in FIG. 34 and the configuration in which the measurement capacitor 126 is not provided is presence or absence of the measurement capacitor 126, and the amplitude of the alternating-current fluctuation component is changed by the measurement capacitor 126. For simplification, it is assumed that the impedances of the measurement capacitor $C_D$ and the stray capacitance $C_s$ at a frequency f of the alternating-current fluctuation component are smaller than the measurement resistance $R_D$ and the insulation resistance $R_M$ and the following Formula (27) holds.

$$\frac{1}{2\pi f C_D}, \frac{1}{2\pi f C_S} < R_D, R_M \tag{27}$$

Note that the frequency f of the alternating-current fluctuation component is a triple of a power receiving frequency in the configuration shown in FIG. 36 and is equal to the power receiving frequency in the configurations shown in FIGS. 37 and 38.

In the configuration in which the measurement capacitor 126 is not provided, the measurement capacitor $C_D$ is absent. Therefore, an alternating-current component of the N bus is divided by the stray capacitance $C_s$, which is small impedance, and the measurement resistance $R_D$, which is large impedance. Alternating-current fluctuation of amplitude same as the amplitude of the original fluctuation occurs across both the ends of the measurement resistance $R_D$. Therefore, it is difficult to measure the insulation resistor 117.

On the other hand, in the case of FIG. 34, the alternating-current fluctuation component of the N bus flows through only the two capacitors. Therefore, the alternating-current fluctuation component is divided at a capacitance ratio of these two capacitors. That is, if the measurement capacitor $C_D$ and the stray capacitance $C_s$ are set to values of the same degree, a half voltage of the alternating-current fluctuation component of the N bus is applied across both the ends of the measurement capacitor $C_D$. Therefore, the alternating-current fluctuation component appearing across both ends of the insulation detector 120 decreases, and it is made possible to perform the measurement of the insulation resistor 117.

Twenty-Ninth Embodiment

Figure 42:
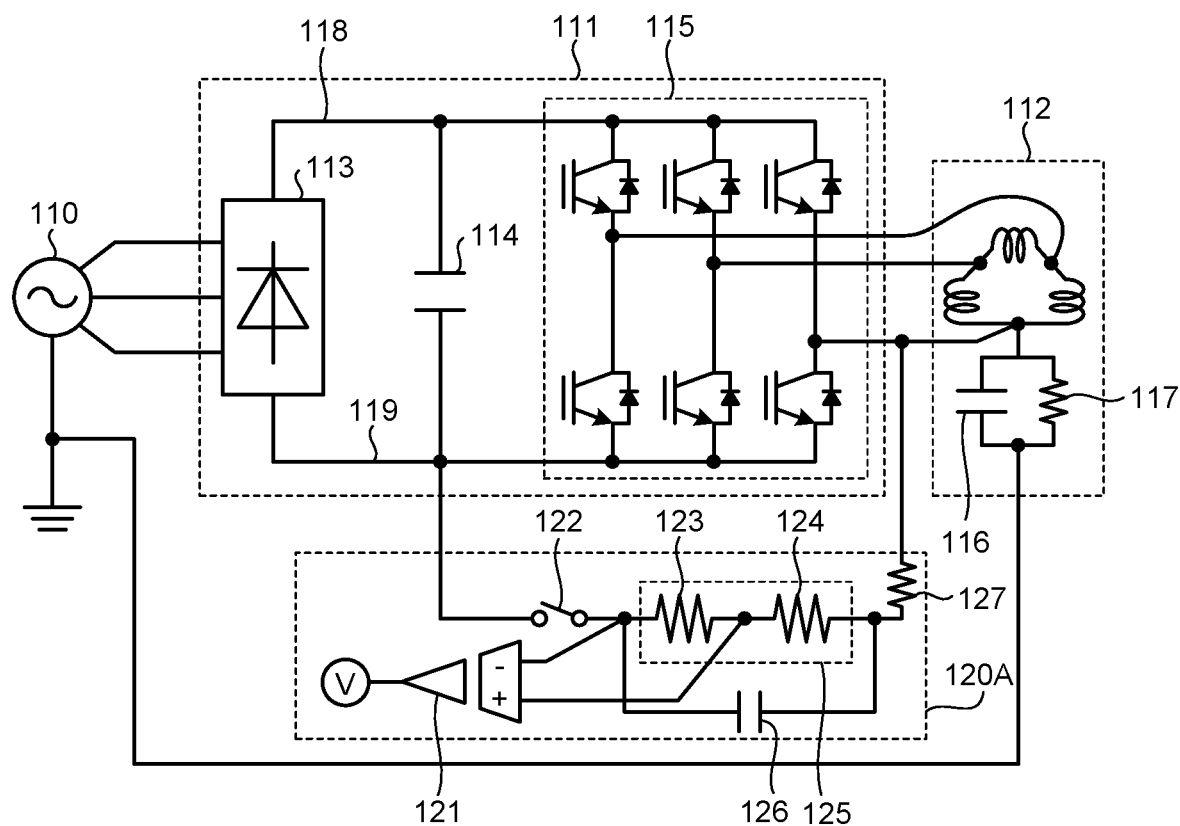
FIG. 42 is a diagram showing an example of the configuration of an insulation detector and the configuration of an electric apparatus to which the insulation detector is connected according to a twenty-ninth embodiment.

FIG. 42 is a diagram showing an example of the configuration of an insulation detector and the configuration of an electric apparatus to which the insulation detector is connected according to a twenty-ninth embodiment. The electric apparatus 111 shown in FIG. 42 is the same as the electric apparatus 111 shown in FIG. 34. An insulation detector 120A shown in FIG. 42 has a configuration in which a current limiting resistor 127 is added to the insulation detector 120 shown in FIG. 34. The other components are the same as the components of the insulation detector 120 shown in FIG. 34.

The current limiting resistor 127 is connected in series, between the measurement resistor 125 and the measurement capacitor 126 and one end connected to the output line of the inverter 115. When the switch 122 is turned on in starting insulation detection, as in FIG. 41 in the twenty-eighth embodiment, the voltage V rises up to the voltage value $V_i$. This is because a steep electric current flows into the measurement capacitor $C_D$ and the stray capacitance $C_s$ in the equivalent circuit shown in FIG. 40 in the twenty-eighth embodiment. However, it is likely that elements are damaged if an excessively steep electric current flows into the measurement capacitor $C_D$ and the stray capacitance $C_s$. Therefore, when the current limiting resistor 127 is provided as shown in FIG. 42, it is possible to suppress a peak value of an electric current flowing into the measurement capacitor $C_D$ and the stray capacitance $C_s$, protect the circuit, and suppress noise. The current limiting resistor 127 is desirably low resistance compared with the insulation resistor 117 and the voltage dividing resistor 124.

Thirtieth Embodiment

Figure 43:
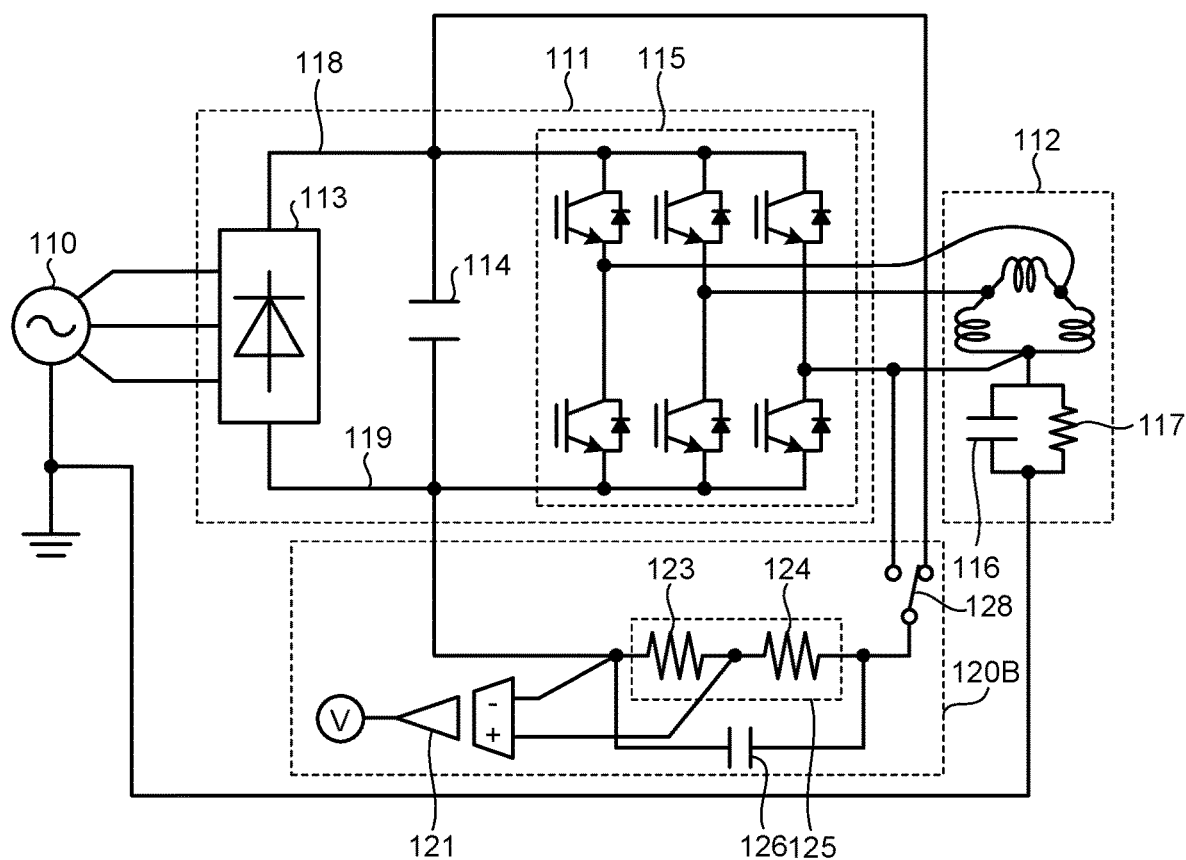
FIG. 43 is a diagram showing an example of the configuration of an insulation detector and the configuration of an electric apparatus to which the insulation detector is connected according to a thirtieth embodiment.

FIG. 43 is a diagram showing an example of the configuration of an insulation detector and the configuration of an electric apparatus to which the insulation detector is connected according to a thirtieth embodiment. The electric apparatus 111 shown in FIG. 43 is the same as the electric apparatus 111 shown in FIG. 34. An insulator detector 120B shown in FIG. 43 has a configuration in which the switch 122 is removed from the insulation detector 120 shown in FIG. 34 and a switch 128 is added. One end of the insulation detector 120 shown in FIG. 34 is connected to the output line of the inverter 115, that is, the winding wire of the motor 112. The other end is connected to the N bus 119 of the inverter 115 via the switch 122. The insulation detector 120 is disconnected from the electric apparatus 111 when the switch 122 is turned off. However, one end of the insulation detector 120B shown in FIG. 43 is connected to the output line of the inverter 115, that is, the winding wire of the motor 112 and the P bus 118 via the switch 128. The other end is connected to the N bus 119 of the inverter 115. When the switch 128 is switched, the insulation detector 120 shown in FIG. 43 can switch a connection destination of one end of the insulation detector 120B between the output line of the inverter 115 and the P bus 118.

First, in a state in which the inverter 115 operates and the motor 112 is moving, the switch 128 is connected to the P bus 118 side. In this state, the insulation detector 120B is connected between the P and N buses and can measure the voltage between the P and N buses. That is, during the operation of the inverter 115, that is, when the insulation detection is not performed, the insulation detector 128B shown in FIG. 43 can also be used as a detecting mechanism for the voltage between the P and N buses of the inverter 115. Therefore, the insulation detector 120B shown in FIG. 43 is useful, for example, when it is necessary to monitor the voltage between the P and N buses to control the inverter 115.

When the inverter 115 is stopped and the insulation detection is performed, the connection destination of the switch 128 only has to be switched from the P bus 118 to the output line of the inverter 115. When the connection destination of the switch 128 is switched to the output line of the inverter 115, although a measurement waveform is different, a circuit configuration is the same as when the switch 122 of the insulation detector 120 shown in FIG. 34 is turned on.

Figure 44:
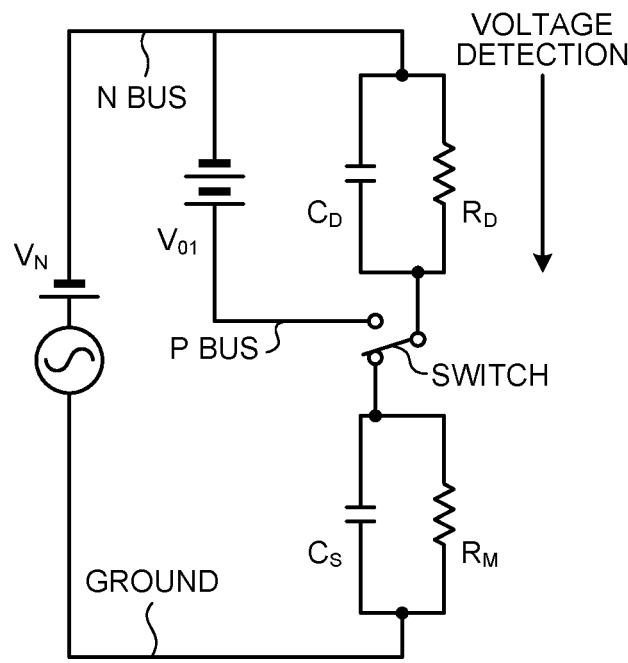
FIG. 44 is a diagram showing an equivalent circuit during insulation detection of a circuit configuration shown in FIG. 43 in the thirtieth embodiment.
Figure 45:
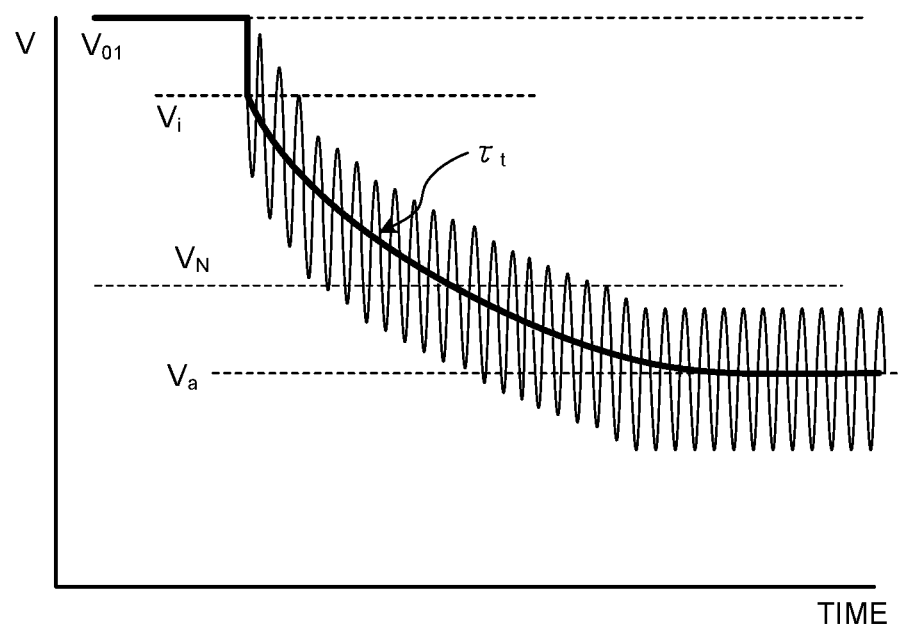
FIG. 45 is a diagram showing a temporal change of a voltage waveform across both ends of measurement resistance, which is an example of a typical measurement waveform in the equivalent circuit shown in FIG. 44 in the thirtieth embodiment.

FIG. 44 is a diagram showing an equivalent circuit during the insulation detection of the circuit configuration shown in FIG. 43. FIG. 45 is a diagram showing a temporal change of a voltage waveform across both the ends of the measurement resistance $R_D$, which is an example of a typical measurement waveform in the equivalent circuit shown in FIG. 44. As in FIG. 41, the ordinate of FIG. 45 is the voltage V across both the ends of the measurement resistance $R_D$ measured from the detected voltage of the detection resistance $R_k$.

First, before measurement, the switch is connected to the P bus 118 side, and the voltage value $V_{01}$ between the P and N buses is detected. When the switch is switched to the output line side of the inverter 115 and the insulation detection is started, first, the voltage V decreases to the voltage value $V_i$. This is because the negative direct-current component $V_N$ is divided by the measurement capacitor $C_D$ and the stray capacitance $C_s$ and a part of the voltage of the measurement capacitor $C_D$ charged to the voltage value $V_{011}$ is discharged. If the stray capacitance $C_s$ before the switching is zero, the voltage value $V_i$ is represented by the following Formula (28).

$$V_i = \frac{2C_D + C_S}{C_D + C_S} V_N = 1 + \frac{C_D}{C_D + C_S} V_N \qquad (28)$$

After decreasing to the voltage value $V_i$, the voltage V approaches the asymptotic voltage value $V_a$ while being exponentially attenuated. The asymptotic voltage value $V_a$ is represented by the following Formula (29).

$$V_a = \frac{R_D}{R_D + R_M} V_N \qquad (29)$$

An attenuation curve of a change in the voltage V from the voltage value $V_i$ to the asymptotic voltage value $V_a$ is represented by the following Formula (30).

$$V(t) = V_a + (V_i - V_a)\exp\left(-\frac{t}{\tau_t}\right) \qquad (30)$$

The above Formula (29) is the same as Formula (23) in the twenty-eighth embodiment. The attenuation curve represented by the above Formula (30) descends unlike the attenuation curve represented by Formula (25) in the twenty-eighth embodiment. This is because, since the voltage value $V_i$ at a start point is larger than $V_N = V_{01}/2$ and the asymptotic voltage value $V_a$ at a reaching point is smaller than the negative direct-current component $V_N$, $V_i$ is larger than $V_a$. The time constant $\tau_t$ of the attenuation is represented by the following Formula (31).

$$\tau_t = (C_D + C_S)\left(\frac{R_D R_M}{R_D + R_M}\right) \tag{31}$$

As explained above, during the operation of the inverter 115, that is, when the insulation detection is not performed, the insulation detector 120B shown in FIG. 43 can also be used as the detecting mechanism for the voltage between the P and N buses of the inverter 115. Therefore, it is made possible to simplify the circuit and reduce costs of the circuit. As explained above, in this system, because the following Formula (32) holds, the voltage V drops and reaches the asymptotic voltage value $V_a$.

$$V_{01} > V_i > V_N > V_a > 0 \tag{32}$$

Note that the voltage V is monotonously attenuated on average. However, because the applied voltage is a voltage obtained by adding up the negative direct-current component $V_N$ and the alternating-current component, as shown in FIG. 45, a waveform of the measurement voltage is only an add-up of the attenuated component and the alternating-current component. As explained in the twenty-eighth embodiment, to enable the measurement, the voltage including the alternating-current fluctuation component needs to be zero or more. Therefore, the measurement in a wider range is possible when the voltage V drops as shown in FIG. 45 than when the voltage V rises up as shown in FIG. 41.

Thirty-First Embodiment

Figure 46:
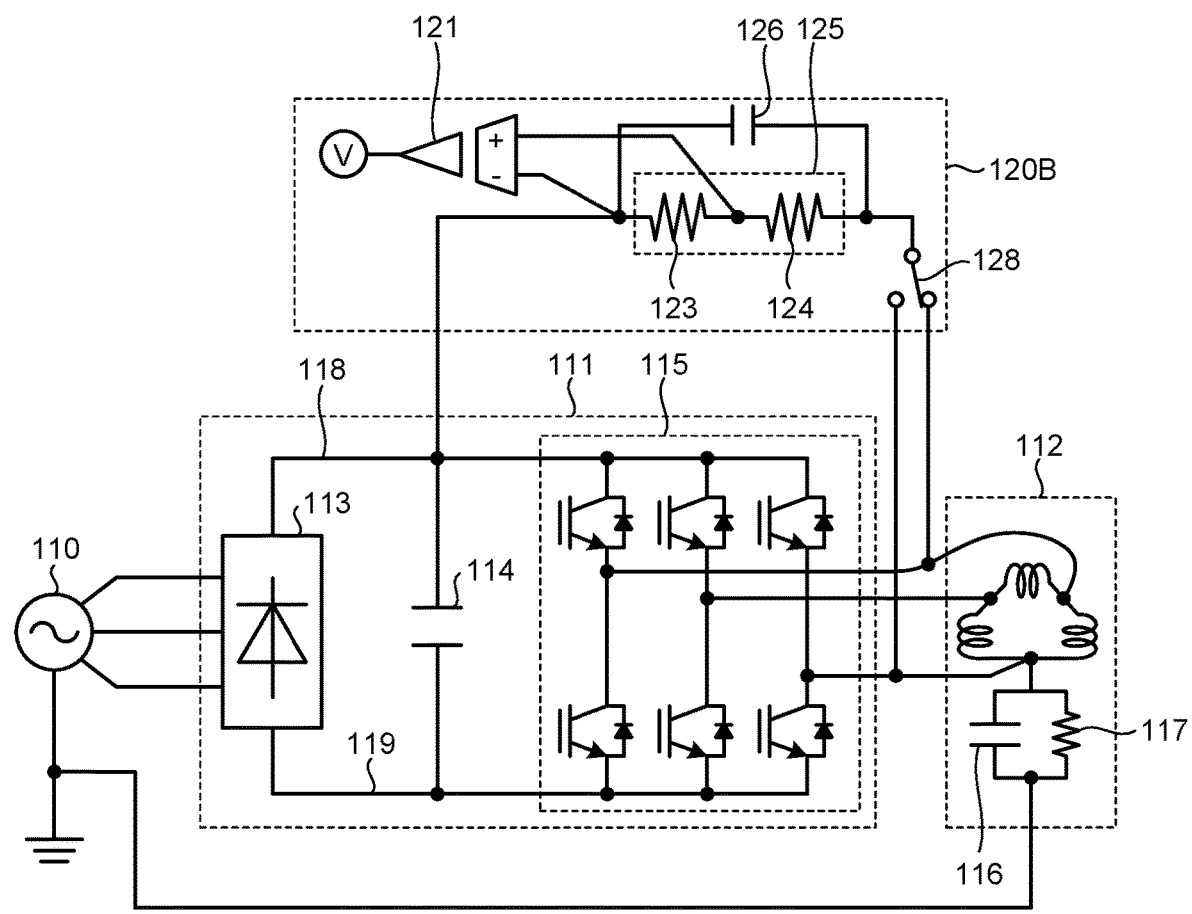
FIG. 46 is a diagram showing an example of the configuration of an insulation detector and the configuration of an electric apparatus to which the insulation detector is connected according to a thirty-first embodiment.

FIG. 46 is a diagram showing an example of the configuration of an insulation detector and the configuration of an electric apparatus to which the insulation detector is connected according to a thirty-first embodiment. The electric apparatus 111 shown in FIG. 46 is the same as the electric apparatus 111 shown in FIG. 34. The configuration shown in FIG. 46 is a modification of the configuration shown in FIG. 43. In FIG. 43, the insulation detector 120B is connected to the N bus 119 side. However, in FIG. 46, the insulation detector 120B is connected to the P bus 118 side. In the insulation detector 120B shown in FIG. 46, it is possible to perform measurement same as the measurement performed in the insulation detector 120B shown in FIG. 43.

Figure 47:
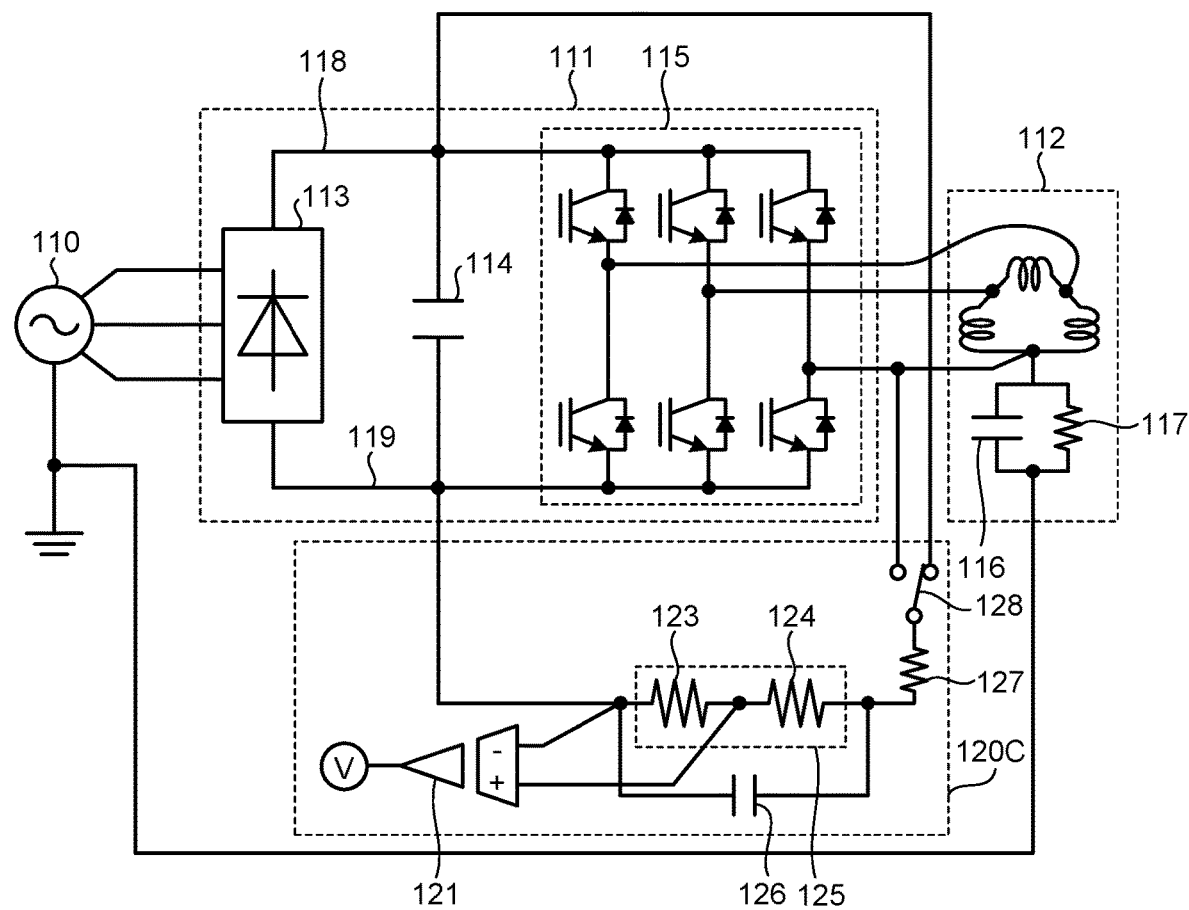
FIG. 47 is a diagram showing an example of the configuration of the insulation detector and the configuration of the electric apparatus to which the insulation detector is connected according to the thirty-first embodiment.

FIG. 47 is a diagram showing an example of the configuration of the insulation detector and the configuration of the electric apparatus to which the insulation detector is connected according to the thirty-first embodiment. The electric apparatus 111 shown in FIG. 47 is the same as the electric apparatus 111 shown in FIG. 34. An insulation detector 120C shown in FIG. 47 has a configuration in which the current limiting resistor 127 is added to the insulation detector 120B shown in FIG. 46. The other components are the same as the components of the insulation detector 120 shown in FIG. 34.

In the insulation detector 120C shown in FIG. 47, it is possible to perform measurement same as the measurement performed in the insulation detector 120B shown in FIG. 43. Further, with the current limiting resistor 127, it is possible to suppress a peak value of an electric current flowing into the measurement capacitor $C_D$ and the stray capacitance $C_s$, protect the circuit, and suppress noise.

The current limiting resistor 127 desirably has low resistance compared with the insulation resistor 117 and the voltage dividing resistor 124. In the insulation detector 120C shown in FIG. 47, as in the insulation detector 120A shown in FIG. 42, it is possible to suppress a rush current into the capacitor at the start of detection.

Thirty-Second Embodiment

In a thirty-second embodiment, a method of estimating a value of insulation resistance in a transient state of a voltage detected by the insulation detector in the twenty-eighth to thirty-first embodiments is explained.

For example, in the insulation detector 120 shown in FIG. 34, to increase a resistance value of the insulation resistor 117 to be measured, it is necessary to increase a resistance value of the measurement resistor 125 as well. To suppress the amplitude of alternating-current fluctuation, a capacitance value of the measurement capacitor $C_D$ has to be increased as well. As a result, it is likely that the changing time constant $\tau_t$ of the voltage V becomes extremely large. That is, in this detection system, because the resistance value of the insulation resistor 117 is calculated from the asymptotic voltage value $V_a$, the measurement is not completed until a low-frequency component of the voltage V is fixed. There is a problem in that a measurement time becomes extremely long.

Figure 48:
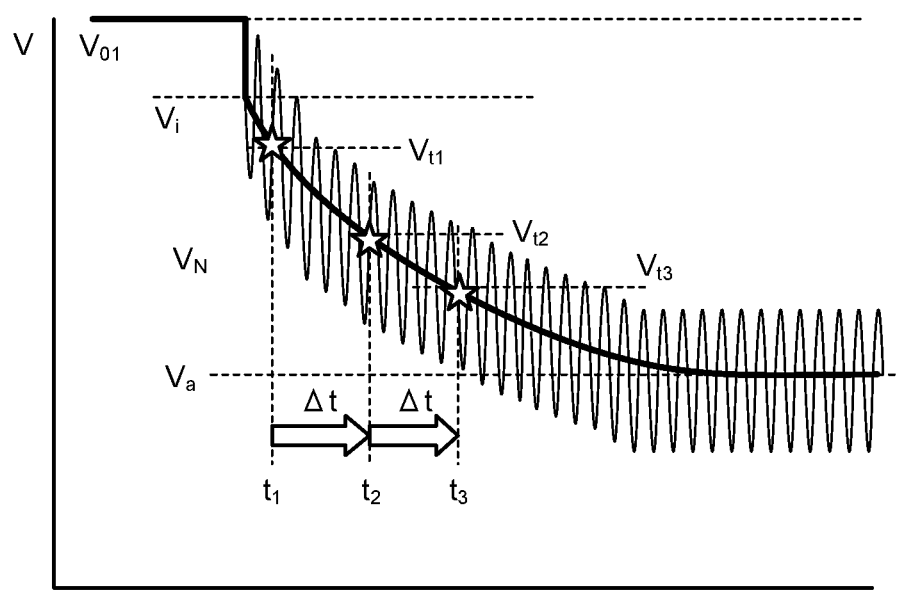
FIG. 48 is a diagram showing a method of reducing a measurement time in a thirty-second embodiment.

FIG. 48 is a diagram showing a method of reducing the measurement time. A low-frequency component of a voltage change excluding an alternating-current fluctuation component is represented by the above Formula (30). When voltage measurement is performed three times at the same time interval $\Delta t = t_3 - t_2$, $t_2 - t_1$ at times $t_1$, $t_2$, and $t_3$ of a curve represented by the above Formula (30) and voltage values $V_{t1}$, $V_{t2}$, and $V_{t3}$ at the respective times $t_1$, $t_2$, and $t_3$ are obtained, because the above Formula (30) is an exponential function, there is a relation of the following Formula (33) between the voltage values $V_{t1}$, $V_{t2}$, and $V_{t3}$ and the asymptotic voltage value $V_a$ of the exponential function.

$$\frac{V_{t3} - V_a}{V_{t2} - V_a} = \frac{V_{t2} - V_a}{V_{t1} - V_a} \tag{33}$$

When the above Formula (33) is solved, the asymptotic voltage value $V_a$ is represented by the following Formula (34).

$$V_a = \frac{V_{t1} V_{t3} - V_{t2}^2}{V_{t1} + V_{t3} - 2V_{t2}} \tag{34}$$

In this way, without waiting for the voltage V to gradually approach the asymptotic voltage value $V_a$, it is possible to calculate the asymptotic voltage value $V_a$ if the voltage V is measured at three points in a state in which the voltage V is transiently changing. Therefore, it is possible to reduce the measurement time.

Note that the measurement of the voltage V only has to be performed at three or more points. Although time intervals among the three points of the measurement are aligned in the above explanation, the time intervals for the measurement do not have to be aligned. However, if the time intervals for the measurement are set equal, it is possible to derive the asymptotic voltage value Va with a simple formula as indicated by the above Formula (34).

Because the alternating-current fluctuation component is included in the waveform of the voltage V, contrivance is necessary to measure a voltage at certain time. The frequency of the alternating-current fluctuation is considered to be 50 hertz or 60 hertz, which is the commercial power supply frequency, or, in the configuration shown in FIG. 36, 150 hertz or 180 hertz three times as high as the commercial power supply frequency. Therefore, at all the frequencies, it is easy to average voltage waveforms in a range of 0.1 second in which a waveform is included by an integral cycle. However, because fluctuation of the voltage V in 0.1 second is large, it is likely that accurate measurement cannot be performed. Therefore, it is desirable to measure the voltage V in a shorter time. For example, a method of separately measuring the frequency of the alternating-current fluctuation and averaging waveforms in a range of one cycle of the alternating-current fluctuation can be illustrated.

Thirty-Third Embodiment

In a thirty-third embodiment, a method of calculating a capacitance value of the stray capacitance $C_s$ is explained. In the equivalent circuit shown in FIG. 40 or FIG. 44, when circuit both ends alternately fluctuate, the capacitance value of the stray capacitance $C_s$ can be calculated from the amplitude of an alternating-current component of the voltage across both the ends of the measurement capacitor $C_D$. For simplification, it is assumed that the impedances of the measurement capacitor $C_D$ and the stray capacitance $C_s$ at the frequency f of the alternating-current fluctuation component is smaller than the measurement resistance $R_D$ and the insulation resistance $R_M$ and the above Formula (27) holds. In that case, the alternating-current fluctuation component is divided by only the stray capacitance $C_s$ and the measurement capacitor $C_D$. Therefore, the following Formula (35) holds between amplitude $V_{ac}$ of the alternating-current component of the N bus and amplitude $V_{dac}$ of the alternating-current component across both the ends of the measurement capacitor $C_D$.

$$V_{dac} = \frac{C_S}{C_D + C_S} V_{ac} \tag{35}$$

From this formula, when the amplitude $V_{ac}$ is set as known and the amplitude $V_{dac}$ is measured, the stray capacitance $C_s$ can be calculated. Therefore, it is necessary to set the amplitude $V_{ac}$ as known.

Figure 49:
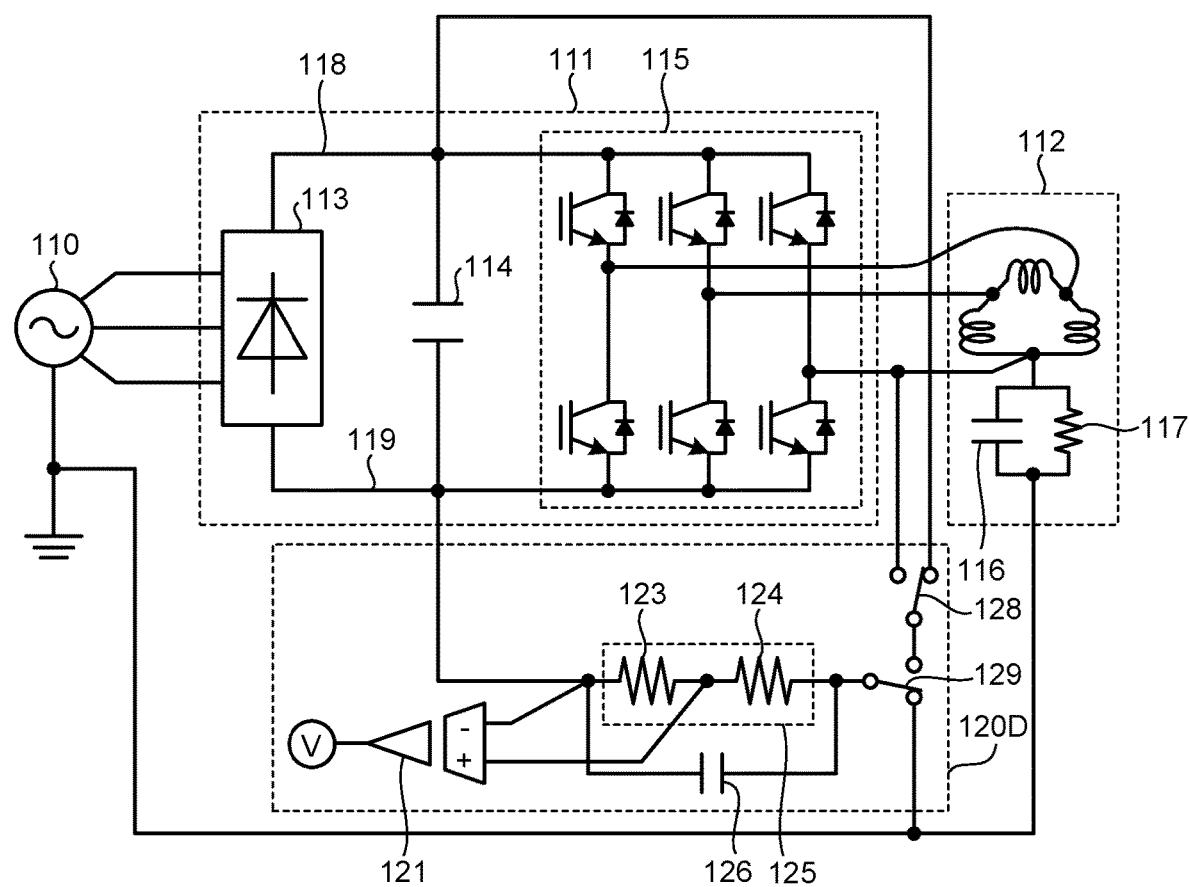
FIG. 49 is a diagram showing an example of the configuration of an insulation detector and the configuration of an electric apparatus to which the insulation detector is connected according to a thirty-third embodiment.

FIG. 49 is a diagram showing an example of the configuration of an insulation detector and the configuration of an electric apparatus to which the insulation detector is connected according to the thirty-third embodiment. The electric apparatus 111 shown in FIG. 49 is the same as the electric apparatus 111 shown in FIG. 34. An insulation detector 120D shown in FIG. 49 has a configuration in which a switch 129 is added to the insulation detector 120B shown in FIG. 43. The other components are the same as the components of the insulation detector 120B shown in FIG. 43.

One end of the insulation detector 120D shown in FIG. 49 is connected to the output line of the inverter 115, that is, the winding wire of the motor 112 and the P bus 118 via the switch 128 and the switch 129. The other end is connected to the N bus 119 of the inverter 115. When the switch 128 is switched, the insulation detector 120D shown in FIG. 49 can switch a connection destination of one end of the insulation detector 120D between the output line of the inverter 115 and the P bus 118. When the switch 129 is switched, the insulation detector 120D can switch a connection destination of the measurement resistor 125 between the switch 128 and the ground. When the switch 129 is connected to the ground, the voltage of the N bus 119 can be directly measured by the insulation detector 120D.

Incidentally, examples of a method realized without providing the switch 129, which is a special component, include a method of measuring the frequency of alternating-current fluctuation. The commercial power supply frequency is 50 hertz or 60 hertz. If it is assumed that a connection method on a primary side is any one of FIGS. 36, 37, and 38, when the frequency f of the alternating-current fluctuation is 50 hertz or 60 hertz, the connection method can be the Y-connection shown in FIG. 39. When the frequency f of the alternating-current fluctuation component is 150 hertz or 180 hertz, the connection method can be the V-connection shown in FIG. 40 or FIG. 41 or a single phase. Note that the Y-connection includes Δ-connection with a midpoint of a phase voltage thereof grounded. When the connection method is the V-connection or the single phase, an electric current does not flow to the load, and a voltage drop in the rectifier circuit is zero, voltage fluctuation of the N bus 119 or the P bus 118 is from 0 volt to $\sqrt{2} \times V_{rms}$ volt. Therefore, the amplitude $V_{ac}$ of the alternating-current fluctuation is represented by the following Formula (36).

$$V_{ac} = \sqrt{2} V_{rms} \cong 1.4 V_{rms} \tag{36}$$

In the formula, $V_{rms}$ is an effective value of a line voltage of an alternating-current power supply. On the other hand, voltage fluctuation of the N bus or the P bus in the case of the Y-connection of the neutral point grounding shown in FIG. 36 is examined. As in the case of the V-connection or the single phase, it is assumed that the load has high impedance, an electric current does not flow to the load, and a voltage drop in the rectifier circuit is zero. First, a maximum of the potential of the P bus 118 or a minimum of the potential of the N bus 119 is a maximum $V_p$ of a phase voltage of a power receiving voltage and is represented by the following Formula (37).

$$V_p = \sqrt{\frac{2}{3}} V_{rms} \tag{37}$$

On the other hand, because the load has high impedance, the voltage between the P and N buses is fixed to the constant voltage value $V_{01}$.

$$V_{01} = \sqrt{2} V_{rms} \tag{38}$$

Therefore, when the P bus 118 reaches the maximum $V_p$, the potential of the N bus 119 is $V_p - V_{01}$. When the N bus 119 has a minimum $-V_p$, the potential of the P bus 118 is $V_{01} - V_p$. Therefore, the amplitude $V_{ac}$ of the alternating-current fluctuation is represented by the following Formula (39).

$$V_{ac} = V_p - (V_{01} - V_p) = 2V_p - V_{01} = \left(2\sqrt{\frac{2}{3}} - \sqrt{2}\right) V_{rms} \cong 0.22 V_{rms} \tag{39}$$

That is, when the frequency of the alternating-current fluctuation is measured, the alternating-current fluctuation width of the N bus 119, that is, a value of the amplitude $V_{ac}$ can be predicted. The stray capacitance $C_s$ can be calculated from the above Formula (35) using the amplitude $V_{ac}$ and the amplitude $V_{dac}$ of the alternating-current fluctuation across both the ends of the measurement capacitor $C_D$.

Thirty-Fourth Embodiment

In a thirty-fourth embodiment, another method of calculating a capacitance value of the stray capacitance $C_s$ is explained. The voltage value $V_i$ shown in FIG. 41 in the configuration shown in FIG. 34 and the voltage value $V_i$ shown in FIG. 45 in the configuration shown in FIG. 43 respectively depend on the stray capacitance $C_s$ as indicated by the above Formulas (22) and (28). Because a capacitance value of the measurement capacitor $C_D$ and a value of the negative direct-current component $V_N$ are known, when a value of the voltage value $V_i$ is measured, a capacitance value of the stray capacitance $C_s$ can be learned.

It is assumed that initial charging amounts of the stray capacitance $C_s$ and the measurement capacitor $C_D$ shown in FIG. 34 and the stray capacitance $C_s$ in the configuration shown in FIG. 43 are zero. Note that, in the configuration shown in FIG. 43, an initial charging amount of the measurement capacitor $C_D$ is $V_{01}$. For example, to reduce the stray capacitance $C_s$ to zero, the stray capacitance $C_s$ is left untouched for time longer than $C_s \times R_M$ from the stop of the inverter 115 until the start of detection of the insulation resistor 117 such that charges of the stray capacitance $C_s$ are discharged. Concerning the measurement capacitor $C_D$, similarly, measurement only has to be started after the measurement capacitor $C_D$ is left untouched for the time longer than $C_D \times R_D$ such that charges of the stray capacitance $C_s$ are discharged.

Thirty-Fifth Embodiment

In a thirty-fifth embodiment, a method of using the measured stray capacitance $C_s$ for insulation detection is explained. As explained above, a change in the voltage V is represented by the curve shown in FIG. 41 or FIG. 45. The time constant $\tau_t$ of the change is represented by Formula (26) or Formula (31). Therefore, if the time constant $\tau_t$ is measured and the stray capacitance $C_s$ is known, it is possible to calculate the insulation resistance $R_M$. A limit of a resistance value of the insulation resistance $R_M$ that can be measured by this detection method strongly depends on the stray capacitance $C_s$.

Figure 50:
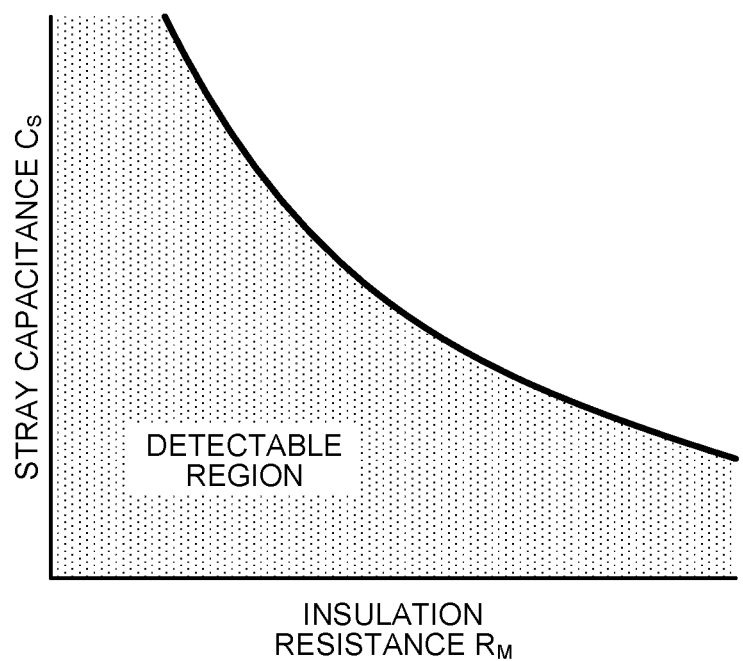
FIG. 50 is a diagram showing a relation between measurable insulation resistance and stray capacitance in a thirty-fifth embodiment.

FIG. 50 is a diagram showing a relation between the insulation resistance $R_M$ that can be measured by the detection method and the stray capacitance $C_s$. As shown in FIG. 50, when the stray capacitance $C_s$ increases, an upper limit of the measurable insulation resistance $R_M$ decreases. A limit value and measurement accuracy of the insulation resistance $R_M$ measurable at that point can be estimated from the stray capacitance $C_s$. That is, it is possible to determine reliability of a measured resistance value according to the stray capacitance $C_s$. The reliability of the measured resistance value can be a reference in determining how a detected value is treated.

Thirty-Sixth Embodiment

Figure 51:
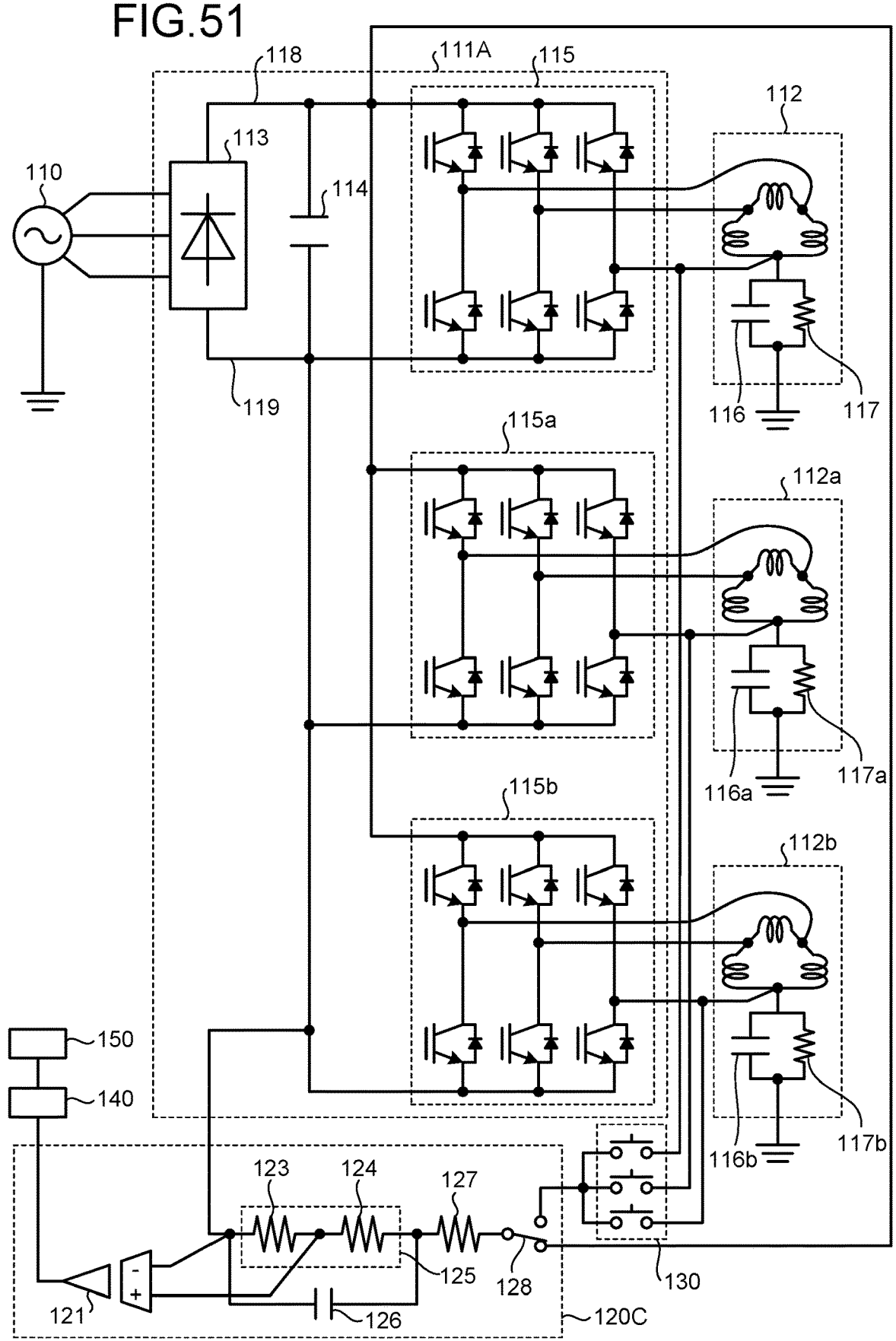
FIG. 51 is a diagram showing an example of the configuration of an insulation detector and the configuration of an electric apparatus to which the insulation detector is connected according to a thirty-sixth embodiment.

FIG. 51 is a diagram showing an example of the configuration of an insulation detector and the configuration of an electric apparatus to which the insulation detector is connected according to a thirty-sixth embodiment. An electric apparatus 111A shown in FIG. 51 includes the rectifier circuit 113, the soothing capacitor 114, and inverters 115, 115a, and 115b. The inverters 115, 115a, and 115b are the same as the inverter 115 shown in FIG. 34 and are connected in parallel to one another. The inverter 115 is connected to the motor 112 including the stray capacitor 116 and the insulation resistor 117. The inverter 115a is connected to a motor 112a including a stray capacitor 116a and an insulation resistor 117a. The inverter 115b is connected to a motor 112b including a stray capacitor 116b and an insulation resistor 117b. The motors 112, 112a, and 112b are the same as the motor 112 shown in FIG. 34.

The insulation detector 120C shown in FIG. 51 is the same as the insulation detector 120C shown in FIG. 47. The insulation detector 120C shown in FIG. 51 can perform detection of the inverters 115, 115a, and 115b and the motors 112, 112a, and 112b with one insulation detector. When the switch 128 is switched, the insulation detector 120C shown in FIG. 51 can switch a connection destination of one end of the insulation detector 120 between the output line of the inverter 115 and the P bus 118. Note that a switch 130 is disposed between one end of the insulation detector 120C and output lines of the inverters 115, 115a, and 115b. The switch 130 can switch whether one end of the insulation detector 120C and the respective output lines of the inverters 115, 115a, and 115b are connected. The voltage detector 121 included in the insulation detector 120C is connected to an A/D converter 140 and a microcomputer 150.

As in the configuration shown in FIG. 43 or the configuration shown in FIG. 47, basically, the measurement only has to be performed by repeating, by the number of inverters and motors, work for switching a state in which the insulation detector 120C is connected to the P bus 118 to a state in which the insulation detector 120C is connected to the respective output lines of the inverters 115, 115a, and 115b, detecting respective insulation resistances 117, 117a, and 117b of the motors 112, 112a, and 112b, once connecting the insulation detector 120C to the P bus 118 and accumulating the voltage between the P and N buses in the measurement capacitor 126 every time the measurement is finished for one motor, and switching the connection to the next motor and performing the detection.

However, it takes time to perform the detection separately of the three motors 112, 112a, and 112b one by one. Therefore, to reduce the measurement time, it is conceivable to connect all of the three motors 112, 112a, and 112b and simultaneously perform the detection. That is, after the insulation detector 120C is disconnected from the P bus 118, the switch 128 is connected to outputs of the three inverters 115, 115a, and 115b, all the switches 130 are turned on, and the detection is performed in a state in which the insulation resistances 117, 117a, and 117b of the three motors 112, 112a, and 112b are connected in parallel. A resistance value detected at this point is a resistance value of the parallel connection of the insulation resistances 117, 117a, and 117b of the three motors 112, 112a, and 112b.

Usually, if the insulation resistances 117, 117a, and 117b of the motors 112, 112a, and 112b are high, the resistance value of the parallel connection is also high, and it is made possible to confirm that the resistance value is normal. On the other hand, if a resistance value of any one of the insulation resistances 117, 117a, and 117b of the motors 112, 112a, and 112b is abnormally low, the resistance value of all the insulation resistances 117, 117a, and 117b is also detected low. Therefore, it is possible to discriminate that the resistance value of any one of the insulation resistances 117, 117a, and 117b is abnormally low. When an abnormal state is detected, by individually measuring the respective motors 112, 112a, and 112b, it is possible to determine the motors 112, 112a, and 112b having an abnormally low resistance value. With this method, when the resistance value is normal, the detection ends in a short time. When the resistance value is abnormal, by individually performing the detection, it is possible to discriminate the motor having an extremely low resistance value of the insulation resistance.

Thirty-Seventh Embodiment

Figure 52:
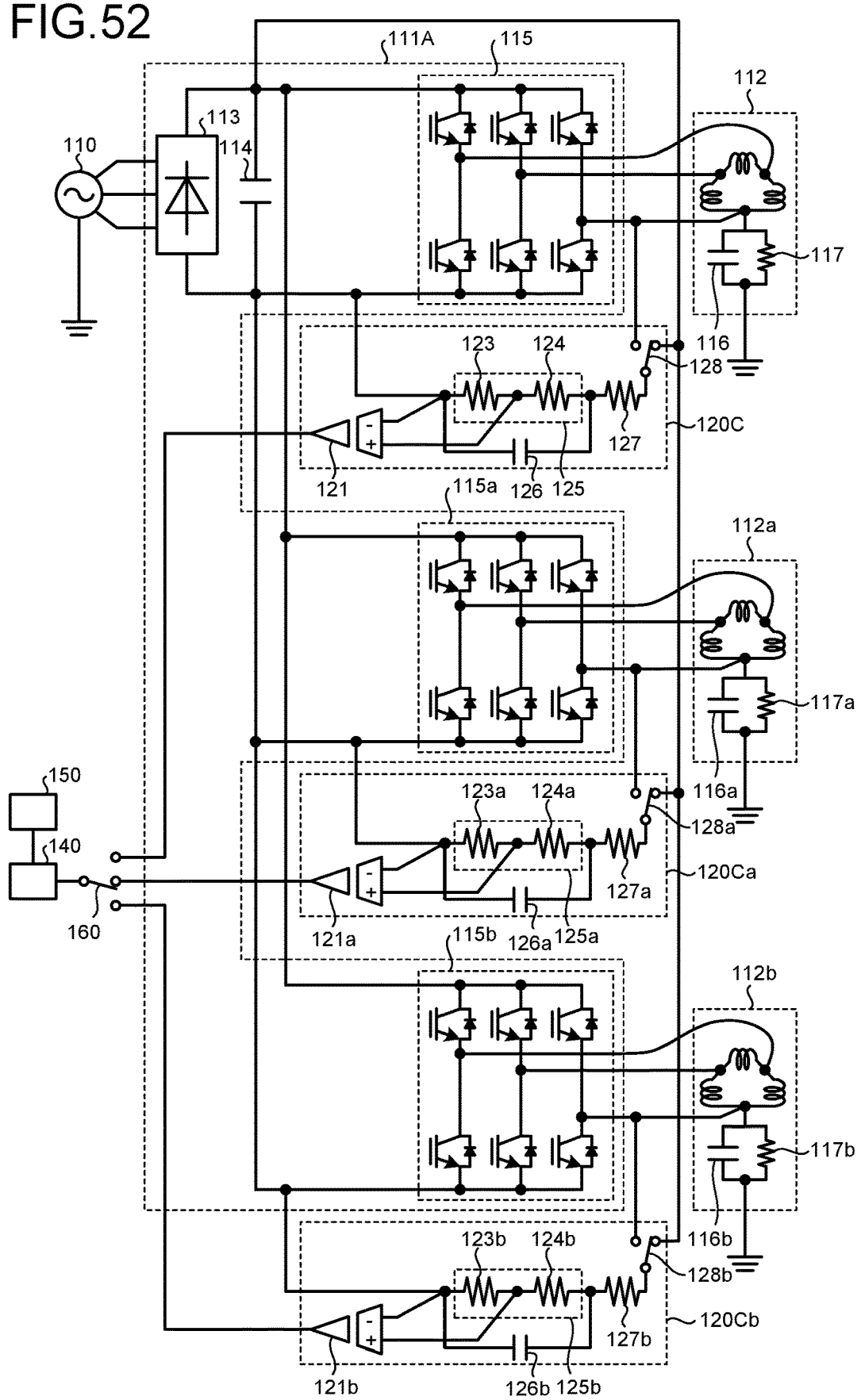
FIG. 52 is a diagram showing an example of the configuration of an insulation detector and the configuration of an electric apparatus to which the insulation detector is connected according to a thirty-seventh embodiment.

FIG. 52 is a diagram showing an example of the configuration of an insulation detector and the configuration of an electric apparatus to which the insulation detector is connected according to a thirty-seventh embodiment. The electric apparatus 111A shown in FIG. 52 is the same as the electric apparatus 111A shown in FIG. 51. Insulation detectors 120C, 120Ca, and 120Cb shown in FIG. 52 are the same as the insulation detector 120C shown in FIG. 51. That is, the insulation detector 120C includes the voltage dividing resistor 124 for dividing a voltage together with the insulation resistor 117 of the motor 112, the detection resistor 123 that detects a voltage applied to the voltage dividing resistor 124, the voltage detector 121 that measures the voltage of the detection resistor 123, the measurement capacitor 126 provided in parallel to the voltage dividing resistor 124 and the detection resistor 123, the current limiting resistor 127, and the switch 128. The measurement resistor 125 has the configuration in which the detection resistor 123 and the voltage dividing resistor 124 are connected in series. Similarly, the insulation detector 120Ca includes a voltage dividing resistor 124a, a detection resistor 123a, a voltage detector 121a, a measurement capacitor 126a, a current limiting resistor 127a, and a switch 128a. A measurement resistor 125a has a configuration in which the detection resistor 123a and the voltage dividing resistor 124a are connected in series. The insulation detector 120Cb includes a voltage dividing resistor 124b, a detection resistor 123b, a voltage detector 121b, a measurement capacitor 126b, a current limiting resistor 127b, and a switch 128b. A measurement resistor 125b has a configuration in which the detection resistor 123b and the voltage dividing resistor 124b are connected in series. The insulation detector 120C can perform detection of the inverter 115 and the motor 112. The insulation detector 120Ca can perform detection of the inverter 115a and the motor 112a. The insulation detector 120Cb can perform detection of the inverter 115b and the motor 112b.

The voltage detectors 121, 121a, and 121b of the respective insulation detectors 120C, 120Ca, and 120Cb are connected to the A/D converter 140 and the microcomputer 150 via the switch 160. By switching the switch 160, voltage detectors at connection destinations of the A/D converter 140 and the microcomputer 150 can be switched. In the configuration shown in FIG. 52, it is possible to perform measurement same as the measurement in the configuration shown in FIG. 51. However, it is also possible to simultaneously perform three kinds of measurement.

Figure 53:
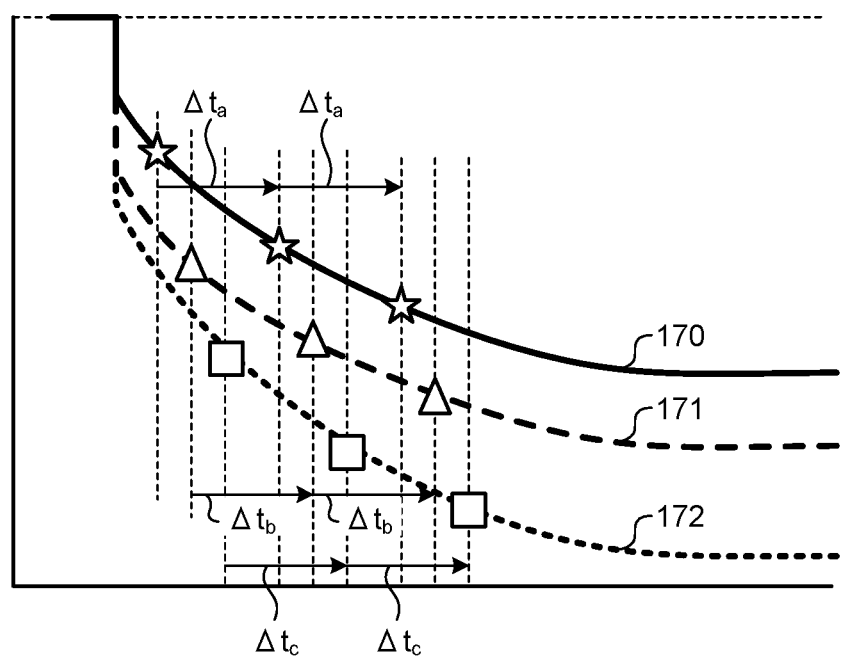
FIG. 53 is a diagram showing a temporal change of a voltage waveform across both ends of measurement resistance shown in FIG. 52 in the thirty-seventh embodiment.

FIG. 53 is a diagram showing the voltages V across both ends of the measurement resistances 125, 125a, and 125b in FIG. 52. For example, a curve 170 indicates the voltage V across both the ends of the measurement resistor 125. A curve 171 indicates the voltage V across both the ends of the measurement resistor 125a. A curve 172 indicates the voltage V across both the ends of the measurement resistor 125b. That is, as explained in the thirty-second embodiment, to calculate the asymptotic voltage value $V_a$, voltages at three points only have to be measured at the same time interval in a region where the voltages transiently change.

Therefore, the detections by the insulation detectors 120C, 120Ca, and 120Cb can be simultaneously performed. That is, as shown in FIG. 53, while detection of the voltage of the curve 170 is performed at a time interval $\Delta t_a$, the detection of the voltage of the curve 171 can be performed at a time interval $\Delta t_b$, and detection of the voltage of the curve 172 can be performed at a time interval $\Delta t_c$. As shown in this embodiment, in the configuration shown in FIG. 52, it is possible to reduce the measurement time.

Thirty-Eighth Embodiment

The resistance values of the insulation resistances explained in the twenty-eighth to thirty-seventh embodiments change because of various factors, for example, temperature or humidity as well. Deterioration in the insulation resistance is a phenomenon that worsens with a lapse of extremely long time. Therefore, for accurate determination of the deterioration in the insulation resistance, a measurement result of a resistance value at a certain instance should not be used. Rather, the deterioration in the insulation resistance should be determined by accumulating measured results for a long time and reading a tendency from the accumulated measurement results.

One kind of such a method of managing the accumulated measurement results is a method of notifying, for example, a controller on the outside of results of a plurality of times of diagnoses and monitoring a change in a long time. Note that, as the controller on the outside, an NC controller, which is a numerical control controller, and a host controller can be illustrated. By monitoring the change in a long time in this way, it is possible to perform a more accurate diagnosis with less erroneous determination. When a mechanism for measuring temperature or humidity is provided in the motor and data is processed in correlation with a detection value of the insulation resistance, it is made possible to more accurately read a tendency.

The configurations explained in the embodiments indicate examples of contents of the present invention. The configurations can be combined with other publicly-known technologies. A part of the configurations can be omitted and changed in a range not departing from the spirit of the present invention.

REFERENCE SIGNS LIST 10, 10a system power supply
11 three-phase alternating-current power supply
12 contactor
20, 20a, 20b, 20b1, 20c, 20d electric apparatus
21 rectifier circuit
22 intra-apparatus capacitor
23 inverter
24 motor
30 insulation detector
31, 31a, 31b capacitor
32, 32a, 32b, 32c, 32c1, 32c2, 32c3 switch
33 voltage detecting unit
34 control unit
35 output unit
41 battery
51 solar battery
52 boosting chopper circuit
60 managing unit
61 A/D conversion unit 62 microcomputer
63 controller
64 thermometer
65 hygrometer
66 memory
110 three-phase alternating-current power supply
111, 111A electric apparatus
112, 112a, 112b motor
113 rectifier circuit
114 smoothing capacitor
115, 115a, 115b inverter
116, 116a, 116b stray capacitor
117, 117a, 117b insulation resistor
118 P bus
119 N bus
120, 120a, 120A, 120B, 120C, 120Ca, 120Cb, 120D insulation detector
121, 121a, 121b voltage detector
122, 128, 128a, 128b, 129, 160 switch
123, 123a, 123b detection resistor
124, 124a, 124b voltage dividing resistor
125, 125a, 125b measurement resistor
126, 126a, 126b measurement capacitor
127, 127a, 127b current limiting resistor
130 contactor
140 A/D converter
150 microcomputer
170, 171, 172 curve

The invention claimed is:

1. An insulation detector connected between one of a P bus and an N bus of an electric apparatus and an output line, the electric apparatus including a rectifier circuit that is disposed between an alternating-current power supply and a load and converts an alternating-current voltage from the alternating-current power supply into a direct-current voltage and an inverter that is connected to a post stage of the rectifier circuit and drives the load, and the output line connecting the inverter and the load, wherein
the insulation detector comprises a series-connected measurement resistor and a voltage-dividing resistor, a capacitor connected in parallel to a circuit consisting of the series-connected measurement resistor and the voltage-dividing resistor, and a voltage detector configured to detect a plurality of voltage values across the measurement resistor, wherein the plurality of voltage values includes a first voltage value, a second voltage value and a third voltage value measured across the measurement resistor respectively at a first time, a second time and a third time,
the insulation detector is configured to detect an insulation resistance between the load and a ground or a housing based on the plurality of voltage values across the measurement resistor, and
the insulation detector is configured to estimate a value of the insulation resistance according to a relationship among the first voltage value, the second voltage value and the third voltage value measured across the measurement resistor respectively at the first time, the second time and the third time.

2. The insulation detector according to claim 1, wherein the insulation detector estimates stray capacitance of the load from amplitude of an alternating-current fluctuation component of a voltage across both the ends of the insulation detector.

3. An electric apparatus comprising the insulation detector according to claim 1.

4. The insulation detector of claim 1, wherein the first time, the second time and the third time occur in a limited time span during a transient voltage, wherein the limited time span is based on a time constant related to the capacitor connected in parallel to the circuit consisting of the series-connected measurement resistor and the voltage-dividing resistor.

5. The insulation detector of claim 1, wherein a time interval, DELTA, is the same difference between each of the first time and the second time, and the second time and the third time.

6. The insulation detector of claim 1, wherein a first time interval between the first time and the second time is not the same as a second time interval between the second time and the third time.

7. An insulation detector connected between one of a P bus and an N bus of an electric apparatus and an output line via a switch, the electric apparatus including a rectifier circuit that is disposed between an alternating-current power supply and a load and converts an alternating-current voltage from the alternating-current power supply into a direct-current voltage and an inverter that is connected to a post stage of the rectifier circuit and drives the load, and the output line connecting the inverter and the load, wherein
the insulation detector comprises a series-connected measurement resistor and a voltage-dividing resistor, a capacitor connected in parallel to a circuit consisting of the series-connected measurement resistor and the voltage-dividing resistor, and a voltage detector configured to detect a value of a voltage across the measurement resistor,
the insulation detector is configured to detect an insulation resistance between the load and a ground or a housing based on the voltage across the measurement resistor,
one end of the insulation detector is connected to one of the P bus and the N bus,
during operation of the inverter, the other end of the insulation detector is connected to the other of the P bus and the N bus via the switch, and
when stopping the inverter and performing detection of the insulation resistance, the insulation detector is configured to switch the switch and thereby switch the other end of the insulation detector to the output line of the inverter.

8. The insulation detector according to claim 7, wherein the insulation detector estimates a value of the insulation resistance according to voltage values across both ends of the insulation detector measured three or more times in a state in which a voltage across both the ends of the insulation detector transiently changes and a time interval between times when the voltage values across both the ends of the insulation detector are measured.

9. The insulation detector according to claim 7, wherein the insulation detector estimates stray capacitance of the load from amplitude of an alternating-current fluctuation component of a voltage across both the ends of the insulation detector.

10. An electric apparatus comprising the insulation detector according to claim 7.

* * * * *